US012685078B2

(12) United States Patent
Prasad et al.

(10) Patent No.: US 12,685,078 B2
(45) Date of Patent: Jul. 14, 2026

(54) SEMICONDUCTOR PROCESS EQUIPMENT

(71) Applicant: Applied Materials, Inc., Santa Clara, CA (US)

(72) Inventors: Bhaskar Prasad, Adityapur (IN); Thomas Brezoczky, Los Gatos, CA (US); Kirankumar Neelasandra Savandaiah, Bangalore (IN); Mayank Dwivedi, Bangalore (IN); Alexander Sendobry, Mühltal (DE)

(73) Assignee: Applied Materials, Inc., Santa Clara, CA (US)

( * ) Notice: Subject to any disclaimer, the term of this patent is extended or adjusted under 35 U.S.C. 154(b) by 104 days.

(21) Appl. No.: 18/651,243

(22) Filed: Apr. 30, 2024

(65) Prior Publication Data

US 2025/0336704 A1     Oct. 30, 2025

(51) Int. Cl.
| | |
|---|---|
| *H10P 72/30* | (2026.01) |
| *B65G 54/02* | (2006.01) |
| *H02K 41/03* | (2006.01) |
| *H02N 15/00* | (2006.01) |

(52) U.S. Cl.
CPC .......... *H10P 72/3204* (2026.01); *B65G 54/02* (2013.01); *H02K 41/031* (2013.01); *H02K 41/033* (2013.01); *H02N 15/00* (2013.01); *B65G 2203/0283* (2013.01); *B65G 2203/043* (2013.01)

(58) Field of Classification Search
CPC .............. B65G 54/02; B65G 2203/043; H02K 41/033; H02K 41/031; H01L 21/67709; H02N 15/00; H10P 72/3204
USPC ........................................................ 198/805
See application file for complete search history.

(56) References Cited

U.S. PATENT DOCUMENTS

| | | | | |
|---|---|---|---|---|
| 5,172,803 | A | * | 12/1992 | Lewin .................... B65G 23/23 198/840 |
| 5,180,048 | A | | 1/1993 | Kawada et al. |
| 5,569,350 | A | | 10/1996 | Osada et al. |
| 5,641,054 | A | | 6/1997 | Mori et al. |
| 6,157,106 | A | | 12/2000 | Tietz et al. |
| 6,206,176 | B1 | | 3/2001 | Blonigan et al. |
| 6,231,716 | B1 | | 5/2001 | White et al. |
| 7,293,950 | B2 | | 11/2007 | Bonora et al. |
| 7,438,175 | B2 | | 10/2008 | White et al. |
| 7,841,820 | B2 | | 11/2010 | Bonora et al. |
| 7,948,122 | B2 | | 5/2011 | Compter et al. |

(Continued)

FOREIGN PATENT DOCUMENTS

| | | |
|---|---|---|
| CN | 101158852 A | 4/2008 |
| CN | 113707585 A | 11/2021 |

(Continued)

OTHER PUBLICATIONS

U.S. Appl. No. 18/081,493, filed Dec. 14, 2022.

(Continued)

*Primary Examiner* — James R Bidwell

(74) *Attorney, Agent, or Firm* — Patterson + Sheridan, LLP

(57) ABSTRACT

A station for a substrate processing system that includes a magnetic levitation actuator assembly disposed in a first region of the station that is separated from a second region of the station by a membrane. The magnetic levitation actuator assembly is configured to contactlessly convey a carrier disposed in the second region to one or more positions within the second region.

21 Claims, 16 Drawing Sheets

(56) References Cited

U.S. PATENT DOCUMENTS

| | | | |
|---|---|---|---|
| 7,964,038 | B2 | 6/2011 | Patalay et al. |
| 7,994,486 | B2 | 8/2011 | Smick et al. |
| 8,104,951 | B2 | 1/2012 | Aderhold et al. |
| 8,851,817 | B2 | 10/2014 | Bonora et al. |
| 9,390,950 | B2 | 7/2016 | Sorabji et al. |
| 9,588,443 | B2 | 3/2017 | Shibazaki |
| 9,964,863 | B1 | 5/2018 | Babayan et al. |
| 10,204,810 | B2 | 2/2019 | Hoey et al. |
| 10,236,197 | B2 | 3/2019 | Janakiraman et al. |
| 10,256,124 | B2 | 4/2019 | Mooring |
| 10,262,887 | B2 | 4/2019 | Hao et al. |
| 10,283,397 | B2 | 5/2019 | Willwerth et al. |
| 10,460,977 | B2 | 10/2019 | Breninger et al. |
| 10,483,141 | B2 | 11/2019 | Janakiraman et al. |
| 10,490,436 | B2 | 11/2019 | Ghosh et al. |
| 10,734,265 | B2 | 8/2020 | Janakiraman et al. |
| 10,770,337 | B2 | 9/2020 | Lee et al. |
| 10,784,142 | B2 | 9/2020 | Marcelynas et al. |
| 10,851,453 | B2 | 12/2020 | Tsai et al. |
| 10,892,180 | B2 | 1/2021 | Chia et al. |
| 11,232,965 | B2 | 1/2022 | Newman et al. |
| 11,377,310 | B2 | 7/2022 | Aust et al. |
| 11,508,595 | B2 | 11/2022 | Aust et al. |
| 11,527,424 | B2 | 12/2022 | Berger et al. |
| 2002/0108842 | A1 | 8/2002 | Bonora et al. |
| 2003/0178145 | A1 | 9/2003 | Anderson et al. |
| 2003/0219977 | A1 | 11/2003 | Pomarede et al. |
| 2004/0023495 | A1 | 2/2004 | Butterfield et al. |
| 2004/0058293 | A1 | 3/2004 | Nguyen et al. |
| 2004/0255442 | A1 | 12/2004 | McDiarmid et al. |
| 2006/0102078 | A1 | 5/2006 | Fairbairn et al. |
| 2006/0156981 | A1 | 7/2006 | Fondurulia et al. |
| 2007/0160507 | A1 | 7/2007 | Satoh et al. |
| 2007/0269297 | A1 | 11/2007 | Meulen et al. |
| 2008/0175694 | A1 | 7/2008 | Park et al. |
| 2008/0232947 | A1 | 9/2008 | van der Meulen et al. |
| 2008/0266037 | A1 | 10/2008 | Williams |
| 2009/0314211 | A1 | 12/2009 | Du Bois et al. |
| 2010/0062592 | A1 | 3/2010 | Clark |
| 2010/0136773 | A1 | 6/2010 | Akae et al. |
| 2010/0226737 | A1 | 9/2010 | Sakaue et al. |
| 2011/0312189 | A1 | 12/2011 | Kim et al. |
| 2012/0109355 | A1 | 5/2012 | Baccini et al. |
| 2012/0213614 | A1 | 8/2012 | Bonora et al. |
| 2012/0249291 | A1 | 10/2012 | Holcomb et al. |
| 2013/0171757 | A1 | 7/2013 | Ponnekanti et al. |
| 2014/0020629 | A1 | 1/2014 | Tsai et al. |
| 2016/0218029 | A1* | 7/2016 | Janakiraman ..... H01L 21/67709 |
| 2017/0363608 | A1* | 12/2017 | Sinz ........................ G01N 35/04 |
| 2018/0339816 | A1 | 11/2018 | Oldendorf et al. |
| 2018/0374732 | A1 | 12/2018 | Klein et al. |
| 2019/0348264 | A1 | 11/2019 | Tsai et al. |
| 2020/0026060 | A1 | 1/2020 | Takato |
| 2020/0232088 | A1 | 7/2020 | White et al. |
| 2020/0262060 | A1 | 8/2020 | Hosek et al. |
| 2020/0381276 | A1 | 12/2020 | Yedla et al. |
| 2021/0024929 | A1 | 1/2021 | Yokota et al. |
| 2021/0249291 | A1 | 8/2021 | Raatz et al. |
| 2021/0265188 | A1 | 8/2021 | Moura et al. |
| 2021/0296150 | A1 | 9/2021 | Berger et al. |
| 2021/0328146 | A1 | 10/2021 | Heymanns et al. |
| 2021/0354934 | A1 | 11/2021 | Aust et al. |
| 2022/0003718 | A1 | 1/2022 | Watanabe |
| 2022/0013383 | A1 | 1/2022 | Savandaiah et al. |
| 2022/0037181 | A1 | 2/2022 | Hatano et al. |
| 2022/0130700 | A1 | 4/2022 | Newman et al. |
| 2022/0208426 | A1 | 6/2022 | Aust et al. |
| 2022/0293451 | A1 | 9/2022 | Sulyman et al. |
| 2022/0293452 | A1 | 9/2022 | Sulyman et al. |
| 2022/0336258 | A1 | 10/2022 | Srivastava et al. |
| 2022/0393618 | A1 | 12/2022 | Aust et al. |
| 2022/0415635 | A1 | 12/2022 | Yedla et al. |
| 2022/0415687 | A1 | 12/2022 | Hatano et al. |
| 2022/0415688 | A1 | 12/2022 | Hatano et al. |
| 2023/0132174 | A1 | 4/2023 | Thanu et al. |
| 2024/0071796 | A1 | 2/2024 | Berger et al. |
| 2024/0204697 | A1* | 6/2024 | Meiss ................... H02K 41/03 |

FOREIGN PATENT DOCUMENTS

| | | | | |
|---|---|---|---|---|
| CN | 115812023 | A * | 3/2023 | ............ B65G 47/24 |
| CN | 118419609 | A * | 8/2024 | ............ B65G 43/00 |
| DE | 102018006259 | A1 | 12/2019 | |
| EP | 1681261 | A1 | 7/2006 | |
| EP | 4222779 | A1 | 8/2023 | |
| JP | 62121134 | A | 6/1987 | |
| JP | H06324297 | A | 11/1994 | |
| KR | 20120088980 | A * | 8/2012 | ............ B65G 54/02 |
| KR | 10-20210081597 | A | 7/2021 | |
| KR | 20220099611 | A | 7/2022 | |
| TW | 202141675 | A | 11/2021 | |
| WO | 2008077048 | A2 | 6/2008 | |
| WO | 2011102410 | A1 | 8/2011 | |
| WO | 2015007385 | A1 | 1/2015 | |
| WO | 2015043712 | A1 | 4/2015 | |
| WO | 2015140155 | A1 | 9/2015 | |
| WO | 2015158725 | A1 | 10/2015 | |
| WO | 2015162177 | A1 | 10/2015 | |
| WO | 2015189263 | A1 | 12/2015 | |
| WO | 2016162288 | A1 | 10/2016 | |
| WO | 2019037858 | A1 | 2/2019 | |
| WO | 2019052657 | A1 | 3/2019 | |
| WO | 2019145035 | A1 | 8/2019 | |
| WO | 2019238416 | A1 | 12/2019 | |
| WO | 2020126040 | A1 | 6/2020 | |
| WO | 2020192911 | A1 | 10/2020 | |
| WO | 2021106796 | A1 | 6/2021 | |
| WO | 2021106799 | A1 | 6/2021 | |
| WO | 2021223843 | A1 | 11/2021 | |
| WO | 2022044834 | A1 | 3/2022 | |

OTHER PUBLICATIONS

U.S. Appl. No. 18/141,909, filed May 1, 2023.
U.S. Appl. No. 18/141,914, filed May 1, 2023.
U.S. Appl. No. 18/141,920, filed May 1, 2023.
U.S. Appl. No. 18/141,923, filed May 1, 2023.
U.S. Appl. No. 18/141,926, filed May 1, 2023.
U.S. Appl. No. 18/141,931, filed May 1, 2023.
International Search Report and Written Opinion in related application PCT/US2023/035709 dated Feb. 5, 2024.
International Search Report/ Written Opinion issued to PCT/US2023/079455 on Mar. 6, 2024.
Yu et al.; Controller design and implementation of six-degree-of-freedom magnetically levitated positioning system with high precision; Proc. IMechE vol. 222 Part I: J. Systems and Control Engineering; 12 pages.
Zhu et al; Design and Control of a Six Degrees-of-Freedom Magnetically Levitated Positioning System; IFAC PapersOnLine 49-21 (2016) pp. 127-132.
Temposonics; Sensor Selector Guide; Retrieved from the Internet at: <https://www.temposonics.com/docs/temposonicslibraries/literature/sensor_selector_guide_industrial_551814_en.pdf?sfvrsn=5fde8874_12>; 21 pages.
Linear Motion Tips; How do Magnettostrictive sensors work?; Retrieved from the Internet at: <https://www.linearmotiontips.com/how-do-magnetostrictive-sensors-work/> 9 Pages.
U.S. Appl. No. 18/607,043, filed Mar. 15, 2024.
U.S. Appl. No. 18/517,404, filed Nov. 22, 2023.
U.S. Appl. No. 18/377,572, filed Oct. 6, 2023.
U.S. Appl. No. 18/433,993, filed Feb. 6, 2024.
U.S. Appl. No. 18/081,493, filed Nov. 2, 2023.
U.S. Appl. No. 18/417,510, filed Jan. 19, 2024.
U.S. Appl. No. 18/417,510, filed Oct. 2, 2023.
U.S. Appl. No. 29/904,232, filed Oct. 24, 2023.
U.S. Appl. No. 18/241,840, filed Sep. 1, 2023.

(56)            References Cited

OTHER PUBLICATIONS

International Search Report dated Oct. 17, 2025 for Application No. PCT/US2025/026606.

* cited by examiner

SEMICONDUCTOR PROCESS EQUIPMENT

BACKGROUND

Field

Embodiments of the present disclosure generally relate to a semiconductor process equipment used to convey semiconductor substrates.

Description of the Related Art

Semiconductor devices are typically formed on semiconductor substrates using numerous process chambers, where each process chamber is used to complete one or more of the various steps (e.g., depositions) to form the semiconductor devices, such as a memory chip. Substrate transfer systems are typically used to move the substrates between each of the process chambers. The process chambers as well as the substrate transfer system can each be held at vacuum. Two common arrangements used for substrate transfer systems include a cluster arrangement and a linear arrangement.

A substrate transfer system using a cluster arrangement includes a central region surrounded by the different process chambers. The central region can be connected to a load lock chamber in order to maintain the vacuum environment within the substrate transfer system when the substrates are supplied and removed from the substrate transfer system. The central region, or transfer chamber, also typically includes a fixed robot that rotates about a central axis to move substrates to and from the load lock chamber as well as between the process chambers. These conventional robots are often limited to only transferring one or two substrates at a time and can cause the footprint of the central region to be large, due to the need for the robot to rotate and extend into the process chambers without the robot's arms interfering with the walls of the central region chamber in which the robot resides. These types of conventional robots can also be a source of particles, which is undesirable.

A substrate transfer system using a linear arrangement typically includes a conveyor having a rectangular top surface with process chambers on one side or opposing sides of the conveyor. The conveyor can be connected to a load lock chamber in order to maintain the vacuum environment within the substrate transfer system when the substrates are supplied and removed from the substrate transfer system. One or more robots that can be positioned near each of the process chambers to transfer the substrates between the conveyor and the process chambers. The conveyors used in these linear substrate transfer systems can be a source of particle generation, and require regular and involved maintenance activities to assure that the conveyor is performing correctly. Furthermore, the conveyor can only be moved in one direction at a time, which can limit the movement of the substrates on the conveyor reducing throughput.

Therefore, there is a need for improved substrate transfer systems that have reduced particle generation and footprint as well as have an increased throughput.

SUMMARY

In one embodiment, a magnetic levitation assembly for a processing station comprises a membrane, a plurality of stators, and a plurality of sensors. The membrane includes a body comprising a non-ferromagnetic material, wherein the body has a first surface and a second surface. The membrane further includes an array of first recesses formed in the first surface, each first recess comprises a pole portion. The membrane further includes an array of second recesses formed in the first surface, wherein the array of second recesses is positioned adjacent to the array of first recesses. The plurality of stators comprising one or more stator poles, wherein the one or more stator poles of each stator of the plurality of stators are disposed within a corresponding pole portion of the first recesses. The plurality of sensors are at least partially disposed in the second recesses.

In one embodiments, a magnetic levitation assembly for a processing station comprises a membrane, a frame member, a first top sensor, and a first stator. The membrane includes a body including a first surface and a second surface. The membrane further includes a first recess formed in the first surface, the first recess including a first top sensor portion and a first interface surface surrounding a first pole portion. The first top sensor being attached to the frame member, the first top sensor being disposed in the first top sensor portion. The first stator includes one or more first stator poles. The first stator being engaged with the first interface surface and the one or more first stator poles are disposed in the first pole portion. A clearance is present between a surface of the first pole portion and the one or more first stator poles.

In one embodiment, a magnetic levitation assembly comprises a member, a linear array of stators, a linear array of top sensors, and one or more printed circuit boards. The member includes a first side and a second side. The linear array of linear stators is coupled to the second side of the member. The linear array of top sensors is coupled to the first side of the member, wherein the top sensors comprises magnetic field detection sensors. At least one top sensor in the linear array of top sensors is disposed between adjacent linear stators in the linear array of linear stators. The one or more printed circuit boards are coupled to the second side of the member in communication with the linear stators and the top sensors.

In one embodiment, a magnetic levitation actuator assembly comprises a first linear stator and a side actuator. The first linear stator includes a plurality of first stator poles and a plurality of first wires, wherein each first wire is wrapped around one first stator pole of the plurality of first stator poles. Each first stator pole includes a first longitudinal axis. A current through each first wire generates a first magnetic field that extends in a first direction. The side actuator comprises a second stator pole, a second wire, and a first head. The second stator pole includes a first end and a second end, wherein the second stator pole includes a second longitudinal axis. The second wire is wound around the second stator pole. The first head is configured to direct a second magnetic field generated by a current through the second wire in a second direction. The first head is attached to the second end of the second stator pole, and wherein a third longitudinal axis of the first head is disposed at an angle relative to the second longitudinal axis.

In one embodiment, a magnetic levitation actuator assembly comprises a plurality of first linear stators and a side actuator. The plurality of first linear stators are configured to convey a carrier in a first direction. The side actuator is coupled to the plurality of first linear stators, the side actuator configured to convey the carrier in a second direction. The side actuator comprises a first stator pole including a first end portion, a second end portion, and a middle portion extending between the first end portion and the second end portion, the first end portion including a first head interface surface and the second end portion including a second head interface surface, wherein the first stator pole includes a longitudinal axis extending through the first end portion and the second end portion. The side actuator further comprises a wire wound around the middle portion, a first head attached to the first head interface surface, and a second head attached to the second head interface surface. A portion of the magnetic field generated by a current through the wire is directed in the second direction by the first head and the second head.

In one embodiment, a method of operating a process station comprises conveying a carrier in a transportation direction to a first position in a transport region of a process station using a plurality of linear stators separated from the transport region by a membrane. The method further comprises determining a location of a center of an object disposed on the carrier using one or more location center finder sensors. The method further comprises determining a lateral position of the carrier using one or more side position sensors. The method further comprises adjusting the lateral position of the carrier in the transport region to align the center of the object with a center of a substrate support of the process station using a side actuator of the process station.

In one embodiment, a process station comprises a housing, a first membrane, a first cavity, and a magnetic levitation actuator assembly. The housing comprises a first wall that comprises a first opening, wherein the first wall at least partially defines a transport region. The first membrane covers the first opening, wherein the membrane comprises a first surface and a second surface, wherein the second surface at least partially defines the transport region. The first cavity being formed in the housing and isolated from the transport region by the first membrane, wherein the first cavity is at least partially defined by a portion of the first wall and the first surface of the first membrane. The magnetic levitation actuator assembly is disposed in the first cavity and over the first surface of the first membrane, wherein the magnetic levitation actuator is configured to generate a first magnetic field that extends through the first membrane and within the transport region.

In one embodiment, a process station comprises a housing, a membrane, and a magnetic levitation actuator assembly. The housing comprising one or more walls that define a transport region. The membrane is attached to a wall of the one or more walls of the housing, the membrane including a first surface and a second surface, wherein the first surface of the membrane and a portion of the wall of the one or more walls of the housing define a cavity, and the second surface at least partially defines the transport region. The magnetic levitation actuator assembly disposed in the cavity and over the first surface of the membrane. The magnetic levitation actuator assembly comprises a plurality of stators and a plurality of sensors. Each stator of the plurality of stators is configured to generate a first magnetic field that extends through the membrane and into the transport region. Each sensor comprises a magnetic field detection sensor that is configured to detect a position of a magnetically permeable material disposed in the transport region relative to the sensor.

In one embodiment, a process station comprises a housing, a membrane, and a magnetic levitation actuation assembly. The housing includes a transport region, an opening, a first interface surface, and a second interface surface, wherein the opening is between the first interface surface and the second interface surface. The membrane covering the opening to enclose a cavity formed in the housing from the transport region, the membrane including a first surface and a second surface, the first surface partially defines the cavity and includes a first recess, and the transport region is partially defined by a second surface of the membrane. The magnetic levitation actuation assembly including a first linear stator and a first top sensor at least partially disposed in the first recess.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figures 1, 2A, 2B:
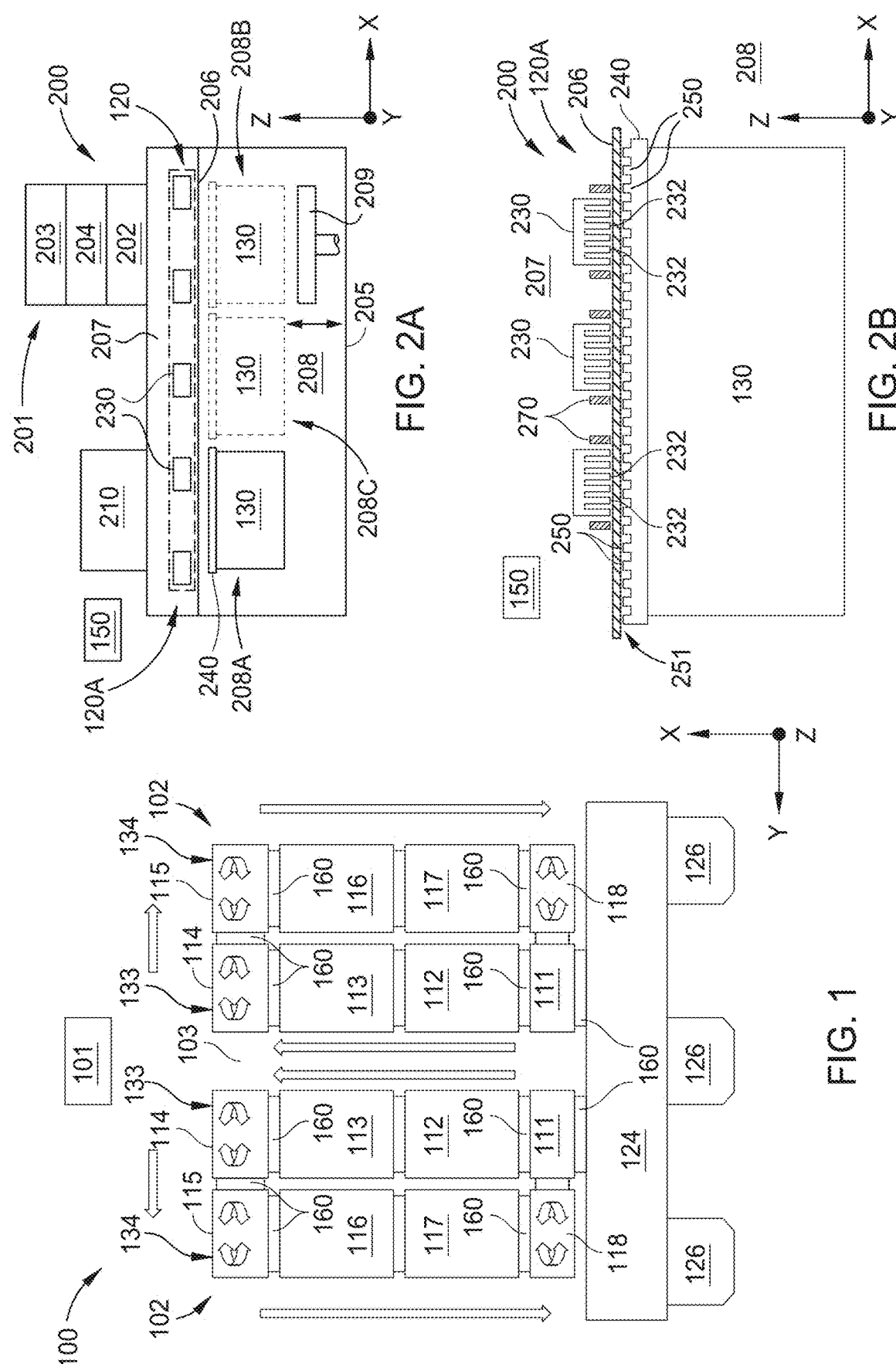
FIG. 1 illustrates a top schematic view of an example substrate processing system, in which embodiments of the present disclosure may be implemented.
FIG. 2A illustrates a side view of a portion of an example station of the substrate processing system of FIG. 1, in which embodiments of the present disclosure may be implemented.
FIG. 2B illustrates a side view of a portion of an example station of the substrate processing system of FIG. 1, in which embodiments of the present disclosure may be implemented.

The present disclosure relates generally to semiconductor process equipment used to transfer semiconductor substrates between process stations. More specifically, embodiments disclosed herein are related to systems used to transfer semiconductor substrates disposed on carriers between process stations using a transport device that employs one or more magnetic levitation actuator assemblies to move the carriers between the process stations. The magnetic levitation actuator assemblies are separated from the carrier by a magnetically permeable membrane.

Using magnetic levitation to transport substrates between process chambers offers a number of advantages. First, magnetic levitation enables designs to achieve a reduced footprint, because robots, which are typically used to transfer the substrates into and out of the process chambers, are not necessarily positioned within and thus can be removed from the vacuum or gas composition controlled substrate transfer environments. Reducing the footprint of a substrate processing system can reduce the capital costs of a substrate processing system, as well as the operating and maintenance costs of the system, and reduce the costs associated with the foot-print that the substrate processing system takes up in a semiconductor fab.

Using magnetic levitation to transport substrates generates fewer particles and less contamination as compared to mechanical systems that have moving parts, dynamic seals, and vacuum compatible greases, which can generate particles and outgas in a vacuum environment. For example, the movement of a central conveyor to transport substrates between process chambers can generate particles from the motion of the conveyor relative to its supporting components and from the contact between a substrate and the conveyor. The generated particles and contamination can negatively affect product quality and in some cases reduce production yield.

Using magnetic levitation to transport the substrate between stations increases the throughput of a substrate processing system. In conventional substrate processing systems, the substrate is transferred to and from process chambers by one or more robotic arms. For example, a substrate may be picked up by a first robotic arm from a load lock, transferred from the first robotic arm to a second robotic arm, and then placed in a chamber, such as a process chamber, by the second robotic arm. Each transfer of the substrate takes time that could be used to process the substrate. As a result, each transfer increases the amount of time necessary to process the substrate. Conveying the substrate between stations of a substrate processing system by magnetic levitation eliminates the need for multiple robotic arms. Additionally, the amount of time to convey the substrate between stations by magnetic levitation is significantly less than the amount of time to transfer the substrate by robotic arms. It is believed that magnetic levitation can be used to increase throughput of a substrate processing system by up to or more than 50%.

FIG. 1 illustrates a top schematic view of an example substrate processing system 100, in which embodiments of the present disclosure may be implemented. The substrate processing system 100 includes a controller 101 and one or more processing lines 102.

The one or more processing lines 102 each include a plurality of stations, as illustrated in FIG. 1. In one example, the processing line 102 illustrated on the right side of FIG. 1 includes at least four process stations 112, 113, 116, and 117, the processing line 102 illustrated on the left side of FIG. 1 includes at least four process stations 112, 113, 116, and 117. However, process stations 111, 114, and 115 may also be configured to perform one or more substrate processing processes. Each processing line 102 may include a magnetic transportation system (not shown) that include a plurality of individual magnetic levitation assemblies disposed within the stations 111-118 that are configured to convey an object 140 (FIG. 3) disposed on a carrier 130 (FIGS. 2A-2E and 3) through the processing line 102. Each processing line 102 may be independent of other processing lines 102. The processing lines 102 may be physically separated by one another by a gap 103. The gap 103 may be sized such that a technician may walk between each processing line 102 to service the one or more stations 111-118.

Each processing line 102 may include a plurality of slit valves 160 to selectively isolate each station 111-118. The slit valves 160 may be selectively opened and closed to allow a clear path for the travel of the carrier 130, to selectively isolate the stations 111-118 from one another, and to facilitate the separate control of the processing environment within each of the stations 111-118. As illustrated in FIG. 1, a slit valve 160 is positioned at each substrate transfer port formed in a wall of each of the stations 111-118. Typically, each of the stations 111-118 will include two slit valves 160 (i.e., inlet and outlet substrate transfer ports), but in some case three or more slit valves may be used (i.e., station 111).

The substrate processing system 100 may be used to process multiple substrates in each processing line 102 to produce a desired fabricated substrate. In some cases, the substrate processing system 100 may include a plurality of physical vapor deposition (PVD) process chambers. For example, the first station 111 may be a first load lock station, the second station 112 may be a degas station, the third station 113 may be a pre-clean station, the fourth station 114 may be a routing station, the fifth station 115 may be a routing station, the sixth station 116 may be a PVD tantalum nitride deposition station, the seventh station 117 may be a PVD copper deposition station, and the eighth station 118 may be a routing station that also serves as a buffer station. An object 140 (e.g., substrate) may be transferred and processed within each process station 112-113 and 116-117. The pressure within each station 111-118 may decrease from station to station. For example, the pressure within the seventh station 117 (e.g., $10^{-6}$-$10^{-7}$ Torr) may be lower than the pressure in the other stations (e.g., $10^{-3}$-$10^{-6}$ Torr in stations 111-116 and 118).

The first station 111 (e.g., load lock station) may have a magnetic levitation assembly 120 (shown in FIG. 2A), which includes one or more magnetic levitation actuator assemblies 120A that include a plurality of linear stators 230 (FIG. 2B) and a plurality of top sensors 270. As will be discussed further below, the stations 111-118 will each typically include a magnetic levitation assembly 120 that includes two or more magnetic levitation actuator assemblies 120A that are spaced apart within each of the stations 111-118 to support the carrier 130 as the carrier 130 is transferred through the station. The stations 112-113 and 116-117 (e.g., process stations) may each have a magnetic levitation assembly 120 (not shown). The fourth station 114, fifth station 115, and eighth station 118 (e.g., routing stations) may each have a magnetic levitation assembly 120.

The magnetic levitation assembly 120 of the first station 111 and the magnetic levitation assembly 120 of the eighth station 118 may cooperate to change the transfer direction (e.g., X-direction to Y-direction) of the carrier 130 within the substrate processing system 100. Additionally, the magnetic levitation assembly 120 of the fourth station 114 and the magnetic levitation assembly 120 of the fifth station 115 may cooperate to change the transfer direction of travel of the carrier 130.

The fifth station 115 may also include a plurality of shutter disks to be placed on a carrier 130 without the object 140. The shutter disks are used to receive deposition material when needed in the place of the object 140 to clean processing equipment, such as cleaning buildup found on a PVD target disposed within the PVD deposition process stations (e.g., stations 116-117).

FIGS. 1, 2A-2E, 3, 5A, 5A, 5C-5E, 6A, 7A, and 14A include an X-Y-Z coordinate system to illustrate the transfer directions of the carrier 130 and object 140 (e.g., semiconductor substrate) through the substrate processing system 100, as well as the orientation of the carrier (e.g., carrier 130, 300). The arrows illustrate the direction that one or more carriers 130 circulate within the processing line 102. During an example processing operation, the carrier 130 receives an object 140 (see FIG. 3) entering the first station 111 in the X-direction from one or more front opening unified pods (FOUPS) 126 of a factory interface 124. The carrier 130 is then conveyed to the second station 112 in the X-direction. The first station 111 also receives the carrier 130 from the eighth station 118 in the Y-direction. After the carrier 130 is conveyed into the second station 112, the carrier 130 is conveyed to the fourth station 114 through the third station 113 in the X-direction. The carrier 130 is then conveyed from the fourth station 114 to the fifth station 115 in the Y-direction. The carrier 130 is then conveyed from the fifth station 115 to the eighth station 118 in the negative X-direction through the stations 116-117. The carrier 130 is then conveyed in the Y-direction back into the first station 111. The now fabricated object 140 is transferred back to the FOUP 126. Another object 140 may then be placed onto the carrier 130 in the first station 111 for another processing operation. A shutter disk may be conveyed on a carrier 130 from the fifth station 115 to the first station 111 in a similar manner as the object 140.

In some embodiments of the substrate processing system 100, the processing line 102 has a non-deposition portion 133 and a deposition portion 134. The non-deposition portion 133 may include a linear arrangement of stations, such as the first station 111, the second station 112, the third station 113, and the fourth station 114, that do not subject the object 140 to a process that deposits a layer on the object 140. After the object 140 passes through the non-deposition portion 133, the object 140 is conveyed into the deposition portion 134 that may be a linear arrangement of stations, such as the fifth station 115, the sixth station 116, the seventh station 117, and the eight station 118, that includes at least one station that deposits at least one layer on the object 140. For example, the non-deposition portion 133 includes the first station 111 that is a first load lock, the second station 112 that is a degas station, the third station 113 that is a pre-clean station, and the fourth station 114 that is a routing station. The deposition portion 134 includes the fifth station 115 that is a routing station, the sixth station 116 that is a tantalum nitride deposition station, the seventh station 117 that is a copper deposition station, and the eighth station 118 that is a routing station that also serves as a buffer station.

FIGS. 2A and 2B illustrate schematic side views of a portion 200 of an example process station (e.g., stations 112-113 and 116-117) of the substrate processing system 100 of FIG. 1, in which embodiments of the present disclosure may be implemented. The example process station, which may be the process station 112-113, 116-117 described above, may be referred to herein as simply the process station 205 for clarity. The process station 205 may be configured for contactless transportation of the carrier 130. The process station 205 may include a process chamber 201 that is maintained at a vacuum pressure, such that a processing region 204 of the process chamber 201 is at a pressure that is less than 760 Torr, or even at a pressure between $1\times10^{-7}$ and 760 Torr, such as between 1 milliTorr (mTorr) and 500 Torr. The process station 205 may be configured for contactless transportation of the carrier 130 in a vacuum chamber (see second region 208) disposed below the processing chamber.

The process station 205 includes a magnetically permeable membrane 206 disposed between the carrier 130 and the magnetic levitation assembly 120. The pressure may be different on opposing sides of the membrane 206. For example, the membrane 206 may be a barrier that isolates a first region 207 (e.g., cavity) of the process station 205 that includes the magnetic levitation assembly 120 from a second region 208 (e.g., vacuum chamber) where the carrier 130 is located. The first region 207 may be at atmospheric pressure while the second region 208 may be at a vacuum pressure.

The membrane 206 is attached to one or more walls of a housing of the process station 205. The one or more walls of the housing are structural elements that are configured to support the various components of the process station 205 and at least partially define the first region 207 and the second region 208. In some embodiments, the membrane 206 is attached to one or more walls of the housing of the process station positioned over (e.g., spanning, covering) an opening formed in the housing to isolate the opening from the second region 208. In some embodiments, the membrane 206 may be a plate, such as a machined plate, a machined block, or a piece of material that is attachable to a wall of the housing. In some embodiments, a membrane 206 is fastened to a wall of the housing by one or more fasteners, such as by one or more bolts. One or more sealing elements, such as one sealing element disposed about the periphery of the membrane 206, may be disposed between the interface of the membrane 206 and the wall of the housing to isolate the first region 207 from the second region 208. In some embodiments, the membrane 206 is an integral part of and/or is formed in the wall of the housing which eliminates the need for a seal since there is no interface between a separate membrane 206 and housing.

In some embodiments, the membrane 206 may be laser welded, explosion welded, diffusion bonded, or brazed to the wall of the housing, which provides a hermetic seal which eliminates the need for a sealing element between the interface of the membrane 206 and the wall of the housing. As will be discussed further below, the membrane 206 is configured to have a low magnetically permeability to allow the magnetic fields generated by the linear stators 230 positioned on one side of the membrane 206 to magnetically communicate with the magnetic levitation element 240 of the carrier 130 positioned on the other side of the membrane 206 to enable the magnetic levitation transport of the carriers 130 within the stations.

In some embodiments, the membrane 206 of the process station 205 may be formed from a non-ferromagnetic material, such as found in some metallic and ceramic materials. For example, the membrane 206 may be formed from non-ferritic stainless steel, such as stainless steel T304, 304, 316, or a titanium alloy. In another example, the membrane 206 may be formed from aluminum or an aluminum alloy. However, aluminum has been found to have an increased amount of eddy current losses versus other materials, thus other metallic alloys are typically preferred over aluminum. In another example, the membrane is formed from a ceramic material, such e.g., alumina, quartz, zirconia, etc. For example, the membrane 206 may be ceramic formed by sintering and subsequent machining. Thus, the membrane 206 may be made of a non-transparent material in some embodiments that blocks the line of sight between the top sensor 270 and the carrier 130.

In some embodiments, the membrane 206 may be made from a material selected from a group comprising transition metals (e.g., iron, nickel, cobalt) and their alloys, and alloys of rare-earth metals.

The carrier 130 may be configured to transport one or more objects 140 due to the interaction of the magnetic fields generated by the linear stators 230 of the magnetic levitation assembly 120 and commands sent by a controller 150 of the substrate processing system 100. For example, the object 140 may be a substrate, a shutter disk, a replacement or consumable part, such as a mask or a cover ring that can be transported through the stations 111-118 by use of the components with the magnetic levitation assembly 120. The carrier 130 may also be configured to transport process kit component replacement parts. The carrier 130 may be transported in the X-direction or negative X-direction, as illustrated in FIG. 2A. The carrier 130 may also be transported in the Y-direction or negative Y-direction, as described above.

The carrier 130 includes one or more a magnetic levitation elements 240 that allow the carrier 130 to be levitated and transported through the process station 205. Each magnetic levitation element 240 may be a track that is aligned in the X-direction or the Y-direction. The magnetic levitation element 240 may be a substantially straight magnetic levitation element 240, or may at least include one or more straight portions that allow the carrier 130 to be contactlessly transported through the substrate processing system 100 by use of the components within the magnetic levitation assembly 120. The magnetic levitation element 240 may define a transportation direction (or transport direction), along which the carrier 130 is contactlessly transported. In one example, as illustrated in FIG. 2A, the carrier 130, which includes one or more magnetic levitation elements 240, is transferred through the process station 205, and to and from other adjacent process stations 205 (not shown), by magnetic levitation, without the carrier 130 contacting the walls or components within the process station 205.

As illustrated in FIG. 2A, the process station 205 includes a magnetic levitation assembly 120 that includes a plurality of magnetic levitation actuator assemblies 120A. In some embodiments, the magnetic levitation actuator assembly 120 includes the membrane 206 or a plurality of membranes 206. FIG. 2A shows the magnetic levitation actuator assemblies 120A is positioned over the membrane 206 within the first region 207. The magnetic levitation actuator assemblies 120A interact with a corresponding magnetic levitation element 240 through the membrane 206. The magnetic levitation actuator assemblies 120A each include a plurality of linear stators 230 configured to levitate and convey the carrier 130 by the generation of a magnetic field that extends through the membrane 206 to interact with the carrier 130 and the time varying control of the generated magnetic field. In some embodiments, a magnetic levitation actuator assembly 120A may include two or more, three or more, five or more, or ten or more linear stators 230, depending on the desired length of the magnetic levitation elements 240, which is often referred to herein as a magnetic levitation element 240. Alternatively, the magnetic levitation actuator assemblies 120A may include one elongated linear stator 230 extending along the entire length of a magnetic levitation element 240. The number of linear stators 230 shown in FIGS. 2A and 2B are examples, and a greater or lesser number of linear stators 230 may be used.

Figures 2C, 2D, 2E:
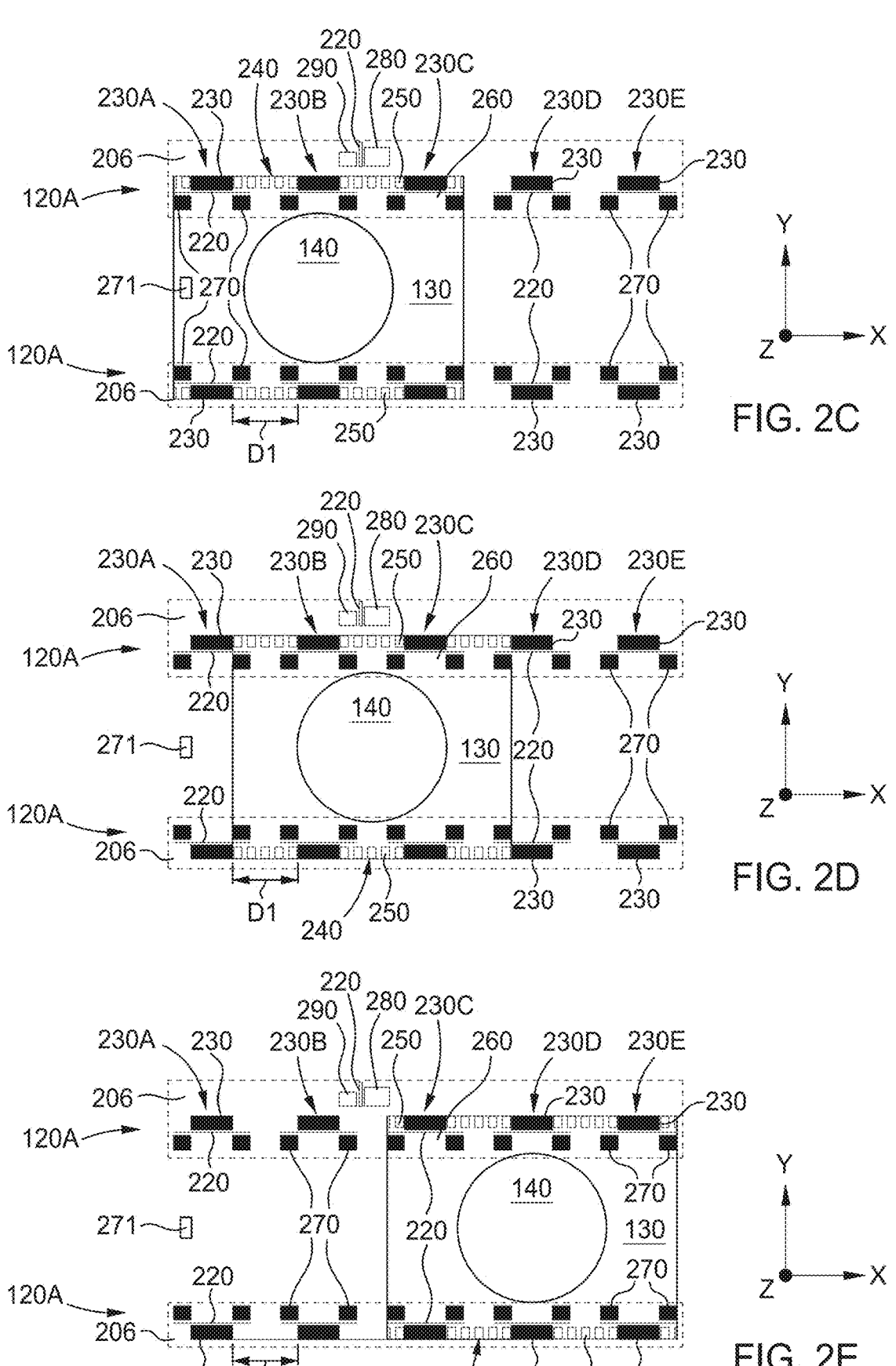
FIG. 2C illustrates a schematic top view of the example station shown in FIG. 2A showing the carrier in a first position, in which embodiments of the present disclosure may be implemented.
FIG. 2D illustrates a schematic top view of the example station shown in FIG. 2A showing the carrier in a second position, in which embodiments of the present disclosure may be implemented.
FIG. 2E illustrates a schematic top view of the example station shown in FIG. 2A showing the carrier in a third position, in which embodiments of the present disclosure may be implemented.

In some embodiments, the process station 205 includes a plurality of membranes 206. In some embodiments, the process station 205 may have multiple first regions 207 (e.g., cavity) each first region 207 separated from the second region 208 (e.g., transport region) by the respective membrane 206. Each first region 207 may be partially defined by one or more walls of the housing. One or more separate magnetic levitation actuator assembly 120a may be disposed in each first region 207. In some embodiments, the process station 205 includes two first regions 207 on opposite sides of the process station 205 that are parallel to one another, such as the cavities 514 shown in FIG. 5A. As another example, and as shown in FIGS. 2C-2E, the station 205 may include a first membrane 206 underneath a first magnetic levitation actuator assembly 120A that is parallel to a second membrane 206 underneath a second magnetic levitation actuator assembly 120A. Each of magnetic levitation actuator assembly 120A shown in FIGS. 2C-2E are disposed in separate first regions 207 that are isolated from each other and from the second region 208. In some embodiments, multiple magnetic levitation actuator assemblies 120A are disposed in each first region 207. For example, a first plurality of magnetic levitation actuator assemblies 120A may be disposed in one first region 207 of the process station 205 that is parallel to a second plurality of magnetic levitation actuator assemblies 120A disposed in a different first cavity 207 of the process station 205.

In some embodiments, the process station 205 includes a membrane 206 for each magnetic levitation actuator assembly 120A. For example, the process station 205 may have a first plurality of first regions 207 arranged in a linear array that is parallel to a second plurality of first regions 207 arranged in a linear array on the opposite side of the process station 205. A separate magnetic levitation actuator assembly 120A may be disposed in each first region 207.

Figures 12, 13:
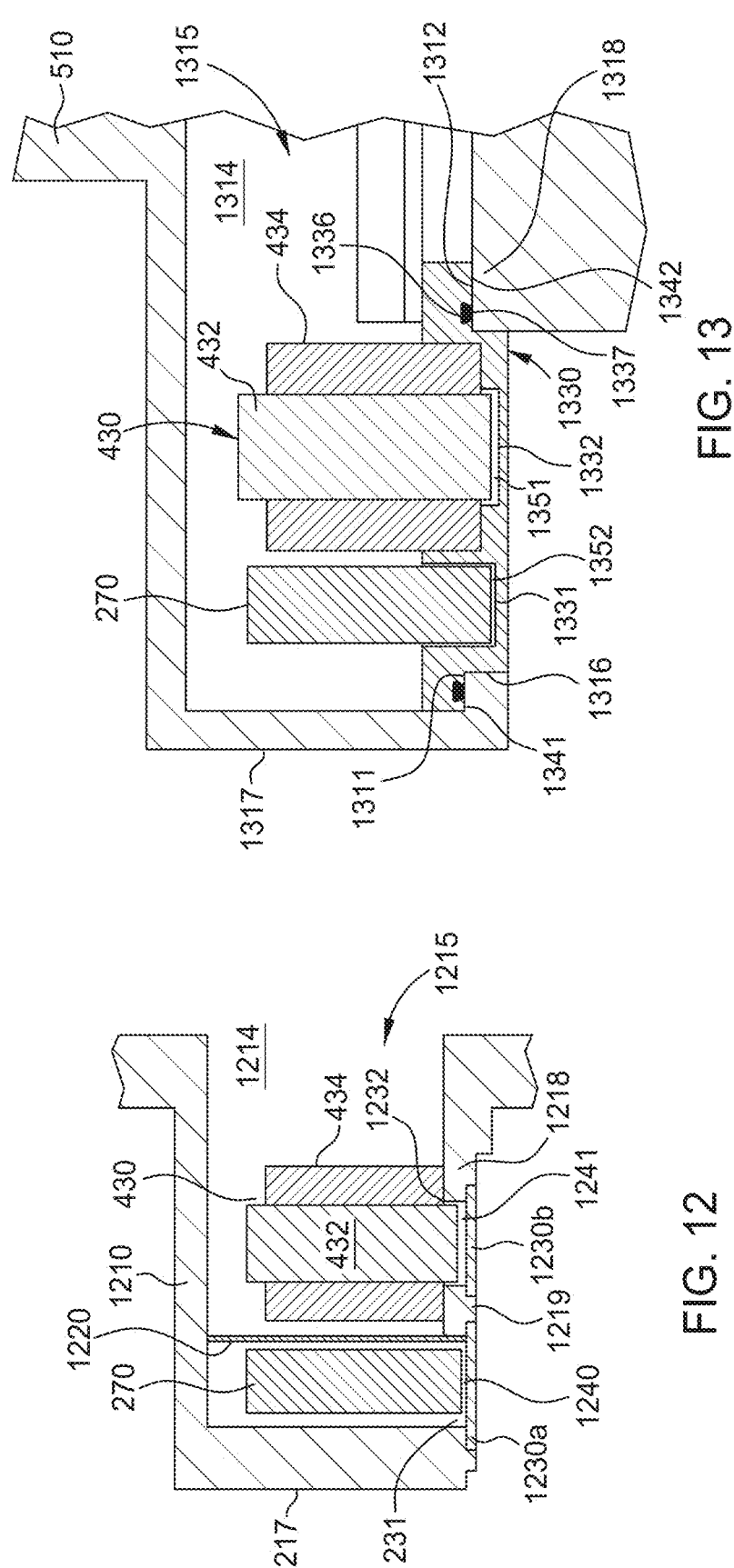
FIG. 12 illustrates a partial cross-sectional view of an exemplary process station, in accordance with embodiments of the present disclosure.
FIG. 13 illustrates a partial cross-sectional view of an exemplary process station, in accordance with embodiments of the present disclosure.

In some embodiments, each first region 207 may be partially defined by at least two membranes 206. For example, the process station 205 may include a first membrane 206 attached to the wall of the housing underneath an array of stators 230 of a first magnetic levitation actuator assembly 120A while a second membrane 206 may be attached to the wall of the housing parallel to the first membrane 206 underneath an array of top sensors 270 of the first magnetic actuator assembly 120A. FIG. 12 shows an exemplary embodiment of a first region partially defined by parallel membranes.

Each magnetic levitation actuator assembly 120A may be installed and removed from the first region 207 formed in the housing of the station 205, such as when the magnetic levitation actuator assembly 120A needs to be serviced or replaced. The magnetic levitation actuator assembly 120A may be serviced or replaced without exposing the second region 208 (e.g., process region of the station) to atmosphere because the membrane 206 isolates the first region 207 in which the magnetic levitation actuator assembly 120A is positioned from the second region 208.

The linear stator(s) 230 may be arranged in a magnetic levitation linear array to guide a corresponding magnetic levitation element 240 of the carrier 130 underneath. For example, a plurality of linear stators 230 may be disposed one after the other in a linear array (e.g., row) extending in the X and/or Y-direction, such as the linear stators 230 shown in FIG. 2A and FIG. 2C. In some embodiments, the one or more linear stators 230 may be configured to remain stationary during contactless transportation of the carrier 130 along the magnetic levitation element 240 since the one or more linear stators 230 are coupled to a wall (e.g., top wall or side wall) of the housing of the process station 205 or at least partially supported by contact with the membrane 206.

The one or more linear stators 230 including the electromagnets may, together with the magnetic levitation element 240, form a linear reluctance motor for providing both a contactless levitation and a contactless drive of the carrier 130. A linear reluctance motor is configured for providing a linear motion, or translational motion, of the carrier 130. A linear motor is distinguished from a rotary motor, which provides a rotational motion. The linear reluctance motor of the apparatus according to embodiments described herein provides a linear motion of the carrier 130 along the magnetic levitation assembly 120.

The one or more linear stators 230 may include a plurality of stator poles 232, such as 2, 4, 6, 8 or more stator poles 232, as illustrated in FIG. 2B. The number of stator poles 232 shown in FIGS. 2A and 2B are examples, and a greater or lesser number of stator poles 232 may be used. The stator poles 232 may be protrusions, or teeth, that may project towards the carrier 130 and/or towards a magnetic levitation element 240 attached to the carrier 130. The plurality of stator poles 232 may define at least one comb structure. In some embodiments, a linear stator 230 may include two comb structures, each having a plurality of stator poles 232.

The magnetic levitation assembly 120, which includes the one or more linear stators 230, and the stator poles 232, may include, or be made of, a magnetic material, such as a ferromagnetic material. The magnetic material may be a non-permanent, or soft, magnetic material. The magnetic material may be a metal, such as electrical steel, silicon steel, ferritic steel, martensitic steel, or any other soft magnetic material.

The magnetic levitation element(s) 240 of the carrier 130 may include, or be made of, a magnetic material, such as a ferromagnetic material. The magnetic material may be a non-permanent, or soft, magnetic material. The magnetic material may be a metal, such as electrical steel, silicon steel, ferritic steel, martensitic steel, or any other soft magnetic material.

Figure 3:
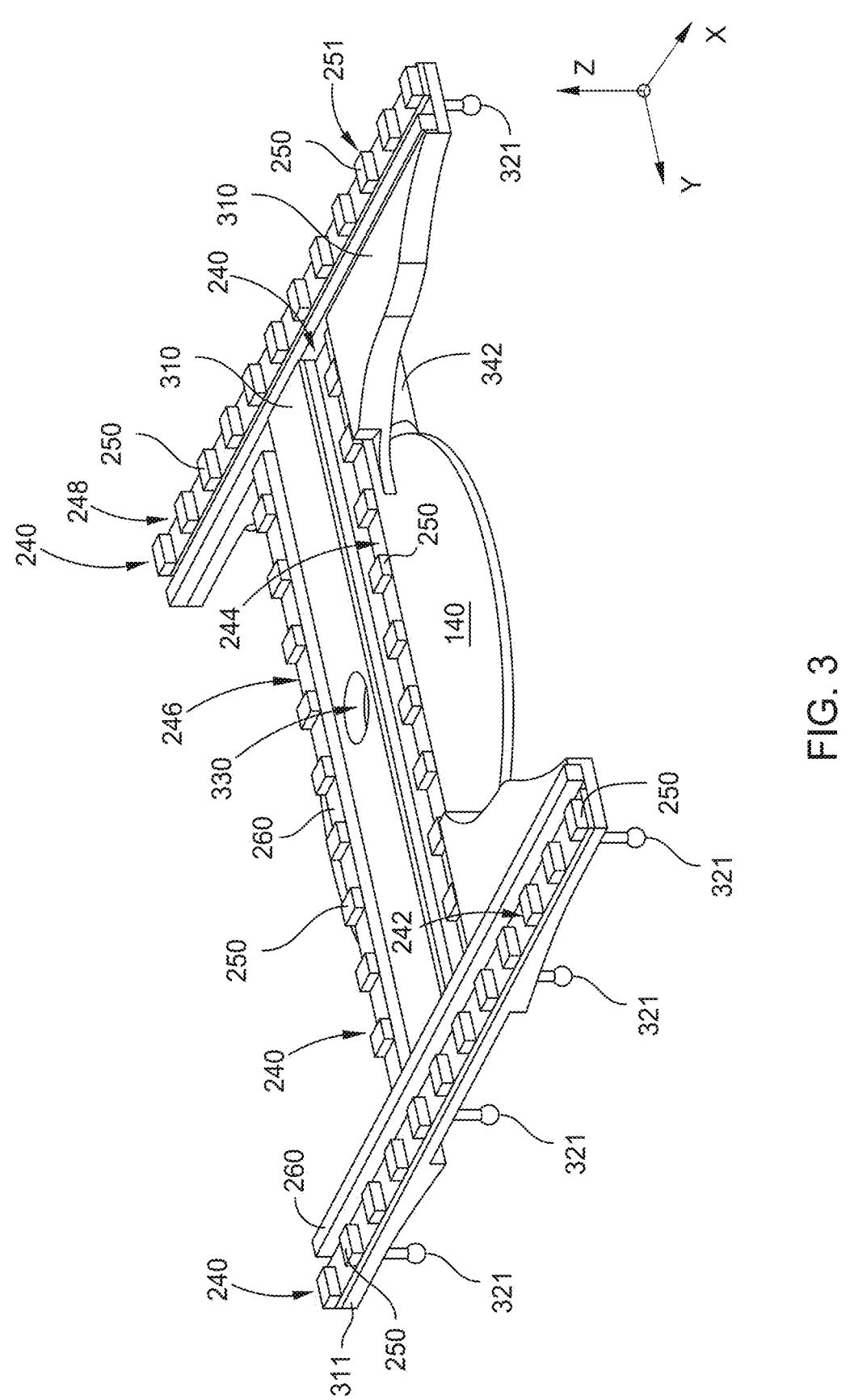
FIG. 3 is a top front isometric view of an example carrier that includes a base and a magnetic levitation element, in accordance with embodiments of the present disclosure.

In some embodiments, as shown in FIG. 2A, the carrier 130 may be levitated and contactlessly transported in the X or Y-direction through the substrate processing system 100, for example when the carrier 130 is a substrate carrier for a large area substrate or a mask carrier carrying a mask for a large area substrate. The magnetic levitation element 240 is coupled to a portion of the top of the carrier 130, as illustrated in FIGS. 2B and 3. The magnetic levitation assembly 120, or at least a portion thereof, may be disposed above the carrier 130.

As noted above, the carrier 130 is configured to be levitated and transported along the length of the magnetic levitation assembly 120 by use of the one or more linear stators 230 of the magnetic levitation assembly 120 that remain stationary within the process station 205. During contactless levitation and/or transportation of the carrier 130, the magnetic levitation element 240 faces and is positioned adjacent to at least one linear stator 230. The magnetic levitation element 240 may respectively face and be positioned adjacent to different linear stators 230 at different times as the carrier 130 is transported along the magnetic levitation element 240.

As shown in FIG. 2B and FIG. 3, the magnetic levitation element 240 may include an array of features 250 on a top side of the carrier 130. Any number of features 250 may be formed within an array of features 251. The features 250 may be protrusions, or teeth, that may project towards at least one linear stator 230 of the opposing magnetic levitation actuator assembly 120A. The raised segments of features 250, which include a magnetic material, may define a comb-like structure as illustrated in FIGS. 2B and 3. Each magnetic levitation element 240 may also include a featureless element 260 on the top side of the carrier 130 adjacent to each array of features 250. The featureless element 260 may span the same or part of the length of the array of features 251. The featureless element 260 may be planar (e.g., a flat surface) or have a non-planar surface that the top sensors 270 uses to measure and/or or detect a position of the carrier 130 during contactless levitation and/or transportation. In some embodiments, the featureless element 260 is formed from a magnetically permeable material. In some embodiments, the featureless element 260 is formed from a ferromagnetic material, such as being a strip of metal embedded in or attached to the carrier 130. For example, the featureless element 260 may be formed from a magnetic stainless steel.

A pitch, or spacing, may be provided between adjacent stator poles 232 of a linear stator 230. The term "adjacent stator poles" (and likewise "adjacent features 250") refers to poles of a same linear stator 230 that are adjacent to each other with respect to the direction defined by the magnetic levitation element 240, such as the transportation direction (e.g., X-direction in FIG. 2A). The pitch may be a distance, e.g. a horizontal distance, extending along the magnetic levitation element 240. Likewise, a pitch or spacing may be provided between adjacent features 250 of the magnetic levitation element 240. According to some embodiments, a first pitch formed between adjacent stator poles 232 of a linear stator 230 may be different from a second pitch formed between adjacent features 250 of the magnetic levitation element 240. Particularly, a ratio of the first pitch and the second pitch may be a non-integer value (e.g., the first pitch is not an integer multiple of the second pitch and the second pitch is not an integer multiple of the first pitch). The stator poles 232 of the linear stator 230 and the features 250 of the magnetic levitation element 240 may be provided according to a p/q configuration. A p/q configuration is the distance (in the transportation direction) spanned by p consecutive adjacent stator poles 232 of the linear stator 230 includes a total of q features 250 of the magnetic levitation element 240. In some embodiments, q may be equal to p+1 or to p−1. For example, it may be the case that p=3 and q=2; or p=3 and q=4. In further examples, it may be the case that p=4 and q=3. In some embodiments, q is be greater than p to facilitate levitation of the carrier 130. Additionally, an overlap between of at least 50% between the stator pole 232 and feature 250 is preferable to facilitate a stable levitation of the carrier 130.

According to some embodiments, the one or more linear stators 230 of the magnetic levitation assembly 120 include a set of electromagnets. In light thereof, the one or more linear stators 230 are active magnetic systems that can provide an adjustable, controllable magnetic field. For example, each stator pole 232 of the linear stator 230 may include an electromagnet. The electromagnet may include a respective coil wound around each stator pole 232. Different winding schemes for winding the coils around each stator pole 232 may be provided. For example, the coils may be wound vertically, in that the coils are wound from top to bottom (clockwise) or from bottom to top (counter-clockwise). In other words, the coil may be vertically wrapped around the stator pole 232 perpendicular to the end of the stator pole 232. In some embodiments, the magnetic levitation element 240 may not include an electromagnet. The magnetic levitation element 240 may be a magnetically passive system, wherein the magnetic levitation element 240 is formed from a ferromagnetic material (e.g., permanent magnet, soft ferromagnetic iron), without any electromagnets mounted thereon. In some embodiments, the magnetic levitation element 240, or at least the features 250 formed thereon, include a ferromagnetic material such as a material selected from a group comprising transition metals (e.g., iron, nickel, cobalt) and their alloys, and alloys of rare-earth metals. In one example, the magnetic levitation element 240 includes a ferritic stainless steel, such as a 409, 430 and 439 stainless steel. The magnetic levitation element 240 may also include an electrical steel, silicon steel, martensitic steel, or any other soft magnetic material.

In some embodiments, the magnetic levitation assembly 120 includes two parallel magnetic levitation actuator assemblies 120A running in the X-direction, and spaced apart in the Y-direction, that are configured to levitate carrier 130 and convey the carrier 130 in either the positive or negative X-direction. The carrier 130 similarly includes two parallel magnetic levitation elements 240 running in the X-direction and spaced apart in the Y-direction. Each magnetic levitation element 240 (FIG. 3) is positioned on the carrier 130 to be underneath the one or more linear stators 230 of a respective magnetic levitation actuator assembly 120A running in the X-direction when the carrier is being conveyed in the X-direction. Additionally, the magnetic levitation assembly 120 may also include two parallel magnetic levitation actuator assemblies 120A running in the Y-direction configured to levitate the carrier 130 and convey the carrier 130 in either the positive or negative Y-direction. In this configuration, the carrier 130 similarly includes two parallel magnetic levitation elements 240 running in the Y-direction (FIG. 3). Each magnetic levitation element 240 is positioned on the carrier 130 to be underneath the one or more linear stators 230 of a respective magnetic levitation actuator assembly 120A running in the Y-direction when the carrier 130 is being conveyed in the Y-direction. As the carrier 130 moves in the Y-direction, the magnetic levitation elements 240 running in X-direction move out of alignment with the corresponding magnetic levitation actuator assemblies 120A running in the X-direction. The magnetic levitation actuator assemblies 120A running in the Y-direction are able to maintain levitation as the carrier 130 is moved in the Y-direction. The carrier 130 may be conveyed in the Y-direction to another station (e.g., from the fourth station 114 to the fifth station 115) until the magnetic levitation elements 240 running in the X-direction become aligned with corresponding magnetic levitation actuator assemblies 120A running in the X-direction where the carrier 130 may then be conveyed again in the X-direction.

The process station 205 may include a controller 150. The controller 150 may be connected to the set of electromagnets of the linear stators 230 for controlling a current that is delivered to the coils provided in the electromagnets. The current can be increased to increase the attraction force of the set of electromagnets to raise the carrier 130 and decrease the gap between the carrier 130 and the linear stators 230, or decreased to lessen the attraction force of the set of the electromagnets to lower the carrier 130 and increase the gap between the carrier 130 and the linear stators 230.

The controller 150 as described herein may be a single centralized controller or may be a distributed controller including a plurality of individual control units. The controller 150 may include a central processing unit (CPU), a memory and, for example, support circuits. To facilitate control of the carrier 130, the CPU may be one of any form of general-purpose computer processor that can be used in an industrial setting for controlling various components and sub-processors. The memory may be coupled to the CPU. The memory, or a computer readable medium, may be one or more readily available memory devices such as random-access memory, read only memory, a floppy disk, a hard disk, or any other form of digital storage either local or remote. The support circuits may be coupled to the CPU for supporting the processor in a conventional manner. The circuits in question include cache, power supplies, clock circuits, input/output circuitry and related subsystems, and the like. Software instructions and data can be coded and stored within the memory (e.g., non-transitory computer readable medium) for instructing the CPU. A program (or computer instructions) readable by the processing unit within the system controller determines which tasks are performable in the processing system. For example, the non-transitory computer readable medium includes a program which when executed by the processing unit are configured to perform one or more of the methods described herein. Preferably, the program includes code to perform tasks relating to monitoring, execution and control of the movement, support, and/or positioning of a substrate along with the various process recipe tasks and various processing module process recipe steps being performed within the system.

The process station 205 may include one or more top sensors 270 (e.g., vertical position sensor) for measuring or detecting a vertical position of the carrier 130 in the Z-direction during contactless levitation and/or transportation. In some embodiments, a plurality of top sensors 270 are arranged in an array, such as being arranged in a linear array (e.g., row) adjacent to the linear array of linear stators 230, such as shown in FIGS. 2B-2E. For example, top sensors 270 may be provided on opposite ends of each linear stator 230. The top sensors 270 are a magnetic field detection sensors configured to detect the position of the carrier 130 through the membrane 206, such as measuring the distance of a gap between the featureless element 260 of the carrier 130 and the bottom surface of the membrane 206 underneath the top sensor 270, such as the gap G1 shown in FIG. 5C. Each top sensor 270 may be in communication with the controller 150. The top sensors 270 may be high-precision position sensors that are able to detect a change in the gap between the featureless element 260 of the carrier 130 with a resolution of 100 μm or less, particularly 10 μm or less. Accordingly, the carrier 130 may be positioned vertically and/or horizontally in a desired target position relative to magnetic levitation assembly 120 and membrane 206 with high precision. In some embodiments, the top sensors 270 are included in the magnetic levitation actuator assemblies 120A.

The top sensor 270 is able to detect changes in the size of the gap (e.g., distance between the membrane 206 and the featureless element 260) through the membrane 206 such that the controller 150 is able to determine the position of the carrier 130 underneath the top sensor 270 in the Z-direction. In some embodiments, the top sensor 270 are magnetic field detection sensors that include one or more magnets to generate a magnetic field that extends through the membrane 206 to interact with the featureless element 260. The magnetic field detection sensors further include one or more magnetic field sensor elements that are able to detect changes in magnetic flux density of a magnetic field generated by the one or more magnets as the size of the gap changes. The magnetic flux density detected by the magnetic field sensor element varies based on the size of the gap. The detected magnetic flux density may be correlated with a dimension of the gap. The magnetic field sensor element may be a Hall Effect sensor, a giant magnetoresistance (GMR) sensor, a tunnel magnetoresistance (TMR) sensor, or other suitable magnetic field sensor element. The top sensor 270 may convert changes in the magnetic flux density detected by the sensor elements into a voltage signal that can be used by the controller 150 to determine the size of the gap, and thus the vertical position of the carrier 130.

In some embodiments, the top sensor 270 is positioned over a portion of the carrier 130 that has features, such as being positioned over the array of features 250. The controller 150 is configured to account for the differential heights of the features 250.

The controller 150 may control the position of the carrier 130 in the Z-direction based on the size of the gap detected by the top sensors 270. In some embodiments, the controller 150 may adjust the current provided to the electromagnets in the linear stators to maintain the size of the gap. For example, the gap, such as the gap G1 shown in FIG. 5C, may be maintained at a distance less than 10 mm, such as 9 mm, such as 8 mm, such as 7 mm, such as 6 mm, such as 5 mm, such as 4 mm, such as 3 mm, such as 2 mm, such as 1 mm.

The controller 150 may cause the magnetic levitation assembly 120 to adjust the roll, pitch, and/or yaw of the carrier 130 if the one or more top sensors 270 detect that the carrier 130 has an unacceptable roll, pitch, and/or yaw angle. For example, three or more top sensors 270 located above different portions of the carrier 130 may be used to detect orientation of the carrier 130, such as the roll, pitch, and/or yaw of the carrier 130. The controller 150 may instruct the magnetic levitation assembly 120 to change the position of the carrier in the Z-direction, such as raising and lowering to carrier 130 relative to the membrane 206 in response to a measurement obtained from the top sensor 270. For example, the controller may reduce the electrical current provided to the set of electromagnets of the linear stators 230 to lower the carrier 130 in the Z-direction and may increase the current to the set of electromagnets of the linear stators 230 to raise the carrier 130 in the Z-direction. In some embodiments, the carrier 130 is maintained at a desired position in the Z-direction by adjusting the current to the linear stators 230 in responses to changes in position of the carrier 130 detected by the top sensors 270. In some embodiments, the linear stators 230 individually controlled to change the pitch and/or roll of the carrier 130 to return or maintain the carrier in a level orientation. For example, a carrier 130 that is tilted (e.g., not level) may result in the object 140 shifting in the carrier 130 which result in the magnetic levitation assembly 120 losing control of the carrier 130. Thus, the controller 150 causes the linear stators 230 to maintain the carrier 130 in a level orientation in the second region 208 to avoid a shift in the location of the object 140 in relation to the carrier 130.

The process station 205 includes a substrate support 209 disposed below the processing chamber 201. The processing chamber 201 includes a process kit assembly 202, and a source assembly 203. As shown, the substrate support 209 is disposed below the process kit assembly 202 and source assembly 203. The carrier 130 is shown in a park position, as indicated by the reference sign 208A, within the second region 208. The carrier 130 is moveable to a transfer position 208B (shown in dashed lines and indicated by reference sign 208B) above the substrate support 209.

The substrate support 209 is moveable in the Z-direction within the second region 208 to one or more positions. While the carrier is moving within the process station 205, the substrate support 209 may be positioned in a lower position to allow the carrier 130 to move to through and/or to one or more positions within the second region 208 without contacting the substrate support 209.

The carrier 130 is moved to the transfer position 208B above the substrate support 209 to facilitate the transfer of the object 140 on the carrier 130 to lift pins of the substrate support 209. The carrier 130 is then moved to the park position 208A (e.g., position opposite to the transfer position) after the object 140 is transferred to the lift pins. The carrier 130 is clear from the substrate support 209 when in the park position 208A to allow the substrate support to move vertically from the lower position to a process position with the transferred object 140 disposed thereon.

The substrate support 209 is engaged with the process kit assembly 202 when in the process position. In some embodiments, the process kit assembly 202 includes one or more components to seal against the substrate support 209 when the substrate support 209 is in the process position. For example, the substrate support 209 and process kit assembly 202 may at least partially defined the process region 204 within the process station 205 where the substrate 140 is subjected to a process performed by the source assembly 203. The process region 204, which is defined by surfaces of the substrate 140, the substrate support 209, the process kit assembly 202 and the source assembly 203, is isolated from the second region 208 when the substrate support 209 is in the process position. For example, the source assembly 203 may be configured to deposit a layer via a physical vapor deposition (PVD) process onto the substrate 140. Once the process performed by the source assembly 203 is complete, the substrate support 209 is lowered from the process position to a lower position to allow the carrier 130 to return to the transfer position 208B where the substrate 140 is transferred from the lift pins back onto the carrier 130.

Figure 5A:
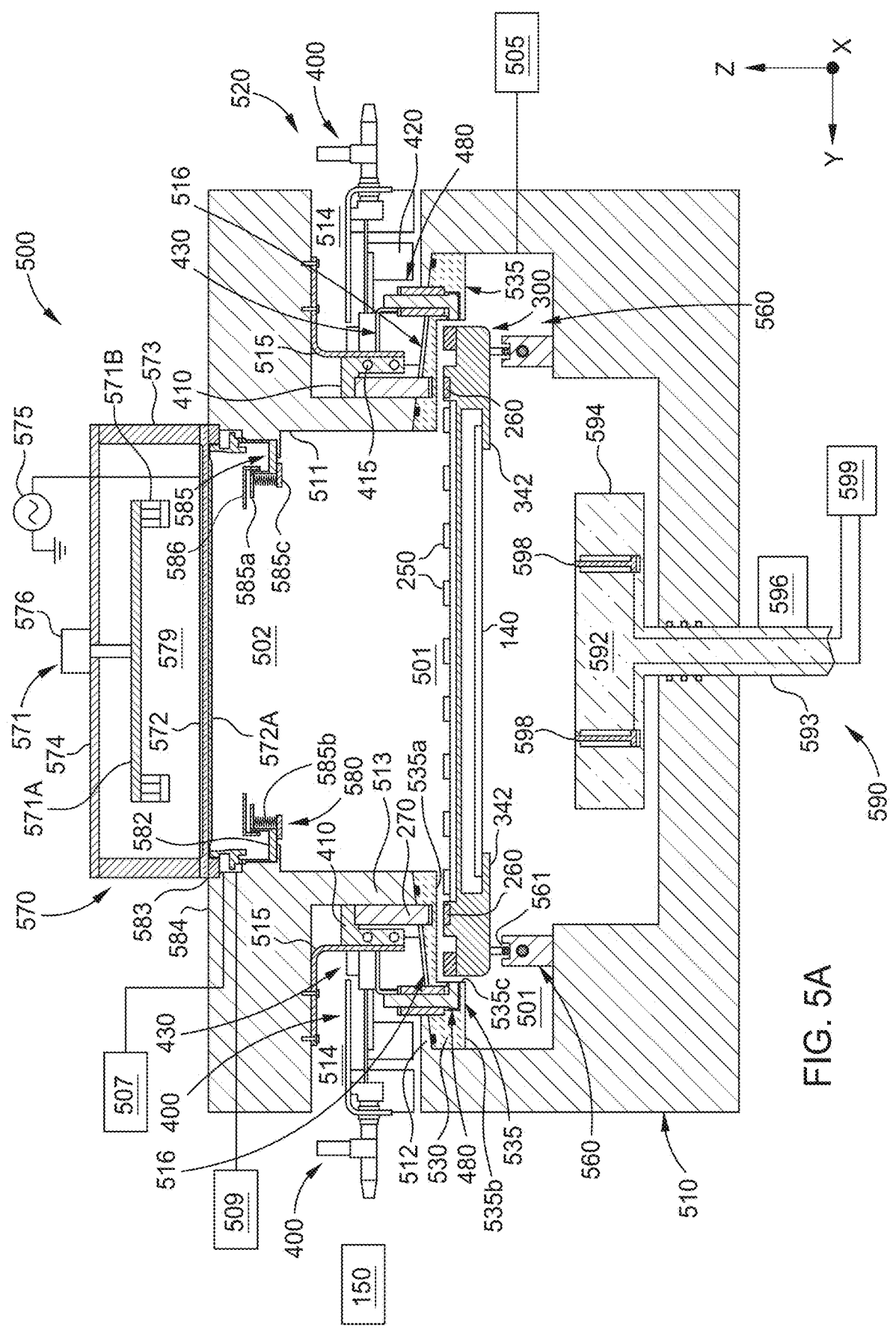
FIG. 5A illustrates a side cross-sectional view of an exemplary process station of the substrate processing system illustrated in FIG. 1, in accordance with embodiments of the present disclosure.

The process kit assembly 202 may be similar to the process kit assembly 580 shown in FIG. 5A and described herein. The source assembly 203 may be adapted to perform a physical vapor deposition ("PVD"), chemical vapor deposition ("CVD"), plasma enhanced chemical vapor deposition ("PECVD"), atomic layer deposition ("ALD"), plasma enhanced atomic layer deposition ("PEALD"), etch, lithography, ion implantation, ashing, cleaning, thermal process (e.g., rapid thermal processing, anneal, cool down, thermal management control) degas, and/or other useful substrate processes. The source assembly 203 may be the source assembly 570 shown in FIG. 5A and described herein.

In some embodiments, the process station 205 may include an equipment assembly 210. In some embodiments, the carrier 130 is positioned beneath the equipment assembly 210 when in the park position 208A. In some embodiments, the carrier 130 is positioned above the equipment assembly 210 when in the park position 208A. In some embodiments, a first portion of the equipment assembly 210 may be below the carrier 130 while a second portion of the equipment assembly 210 is above the carrier 130 when the carrier 130 is in the park position 208A. In some embodiments, the equipment assembly 210 may be at least partially disposed in and/or over the second region 208. In other words, the equipment assembly 210 may not be positioned behind the membrane 206.

The equipment assembly 210 may include one or more components to perform a process on the object 140 while the carrier 130 is in the park position 208A. In some embodiments, the equipment assembly 210 may include one or more heating sources, such as LED heat sources, to adjust the temperature of the substrate 140 prior to or after processing in the process region 204 by the source assembly 203. The one or more heat sources may be disposed below the parked carrier 130. For example, the one or more heating sources may be used to perform a degas operation. In some embodiments, the equipment assembly 210 may also be configured to cool the substrate 140 and the carrier 130, such as including one or more shower heads or nozzles to direct a cooling gas towards one or more portion of the substrate. In some embodiments, the equipment assembly 210 may be configured to treat the substrate 140 with a precursor for a process that will subsequently occur within the process chamber 201. For example, the equipment assembly 210 may include one or more shower heads to direct a precursor, such as a gas, towards one or more portions of the substrate 140. In some embodiments, the equipment assembly 210 may be configured to perform a carrier cleaning operation on the parked carrier 130, such as directing a cleaning gas (e.g., ozone) at the carrier 130 using one or more shower heads or nozzles. The carrier 130 may be cleaned while the substrate 140 is processed within the process chamber 201. In some embodiments, the substrate support 209 may be raised into engagement with the process kit assembly 202 to isolate the processing region 204 from the remainder of the second region 208 while a process is completed with the equipment assembly 210.

In some embodiments, the equipment assembly 210 may include one or more sensors, such as an array of different sensors. For example, the equipment assembly 210 may include a temperature sensor, a film composition sensor (e.g., FTIR assembly), a particle detection assembly, a location center finder ("LCF") sensor, a residual gas analyzer (RGA), a camera, a substrate curvature sensor to measure bowing of the substrate 140 (e.g., a LayTech sensor), a position sensor, or any other suitable sensor. In some embodiments, the equipment assembly 210 is a metrology unit.

Once the carrier 130 is in the park position 208A, the controller 150 may cause the stators 230 to land the carrier 130 on the bottom of the processing chamber 205 or on a landing rail assembly disposed in the second region 208. In some embodiments, the carrier 130 may be landed while a process is performed in the processing region 204. In some embodiments, the carrier 130 is levitated while in the park position 208A while a process is performed in the processing region 204. In some embodiments, the carrier 130 may be landed in the park position 208A to facilitate using the equipment assembly 210. In some embodiments, the equipment assembly 210 may perform a process while the carrier 130 is levitated underneath the equipment assembly 210 in the park position 208A.

In some embodiments, the membrane 206 may have an opening allowing the substrate support 209 to be raised upward toward the process chamber 201 into engagement with the processing kit assembly 202. In some embodiments, the process station 205 includes one or more separate membranes 206 for each magnetic levitation actuator assembly 120A. The process chamber 201 and equipment assembly 210 may disposed between separate membranes 206.

The process station 205 according to embodiments described herein may include one or more position sensors for detecting a position of the carrier 130 with respect to a transportation direction of the carrier 130. The controller 150 may be configured to control the reluctance-based drive force in response to a signal provided by one or more sensors to position the carrier 130 in a target position with respect to the transportation direction (e.g., X-direction or Y-direction). The reluctance-based drive force may be configured to align the carrier 130 along the magnetic levitation element 240 or transport direction. By controlling amplitude and phase angle of an AC signal provided to the coils coupled to the stator poles 232, the dynamic motion characteristics of the magnetic levitation elements 240 and thus the carrier 130, such as the amount of jerk, acceleration, velocity, and finally horizontal position can be adjusted and achieved. For example, the position sensors may be used to determine when the carrier 130 reaches the park position 208A or the transfer position 208B within the process station 205.

In some embodiments, the process station 205 is sized such that two carriers 130 may be parked in separate parking positions within the second region 208 while a substrate 140 is processed within the processing chamber 201. In other words, the process station 205 may have three discrete carrier positions, such as a first park position 208A, a second park position 208C, and a transfer position 208B. For example, a first carrier 130 be parked in a second park position (shown in dashed lines and indicated by reference sign 208C) after a first substrate 140 disposed thereon was transferred to the substrate support 209. The first substrate 140 is then processed within the process chamber 201. A second carrier 130 with a second substrate 140 disposed thereon may be in the park position 208A (e.g., in a second park position) underneath the equipment assembly 210. The equipment assembly 210 may perform a process on the second substrate 140 while the first substrate 140 is processed within the process chamber 201. The first substrate 140 is transferred back onto the first carrier 130 after the process within the process chamber 201 is complete. The first carrier 130 then exits the process station 205. The second carrier 130 then moves toward the transfer position 208B to facilitate the transfer of the second substrate 140 within the process chamber 201. The second carrier 130 is moved to the second park position 208C after the second substrate 140 is transferred to the substrate support 209. A third carrier 130 with a third substrate 140 disposed thereon may enter the chamber, such as entering after the second carrier 130 leaves the park position 208A, and be placed in the park position 208A. The third substrate 140 on the third carrier 130 may be processed by the equipment assembly 210 while the second substrate 140 is processed within the processing chamber 201.

In some embodiments, one or more process stations 205 in a processing line 102 may have multiple process chambers 201 and substrate support 209 for each process chamber 201. For example, the process station 205 may have two process stations 201 and two substrate supports 209. A first carrier 130 and second carrier 130 are conveyed into the process station 205. The first carrier 130 is conveyed past the second substrate support to a first transfer position above the first substrate support 209 to facilitate the transfer of the object 140 disposed thereon onto the first substrate support 209. The first carrier 130 is then moveable to a first park position while the first object 140 is placed in the processing chamber 201, such as when performing a process on a substrate 140. The first carrier 130 returns to the first transfer position to receive the first object 140 from the first substrate support 209. The second carrier 130 with a second object 140 disposed thereon is also conveyed to a second transfer position over the second substrate support 209. The second carrier 130 is conveyed to a second park position after the second object 140 is transferred to the second substrate support 209. The second carrier 130 returns to the second transfer position to receive the first object 140 from the first substrate support 209. The slit valves may be opened to allow the first and second carriers 130 to exit the process station 205 once the respective object 140 is transferred back onto each carrier 130. In some embodiments, the first and second carriers may be moved synchronously within the process station 205. In some embodiments, the first and second carriers are moved asynchronously. Thus, the process station 205 may have four discrete carrier positions (e.g., a first park position, a second park position, a first transfer position, and a second transfer position). Additionally, the process station 205 may include an equipment assembly 210 for each process chamber 201. In other words, the first carrier 130 may be parked in the first park position underneath a first equipment assembly 210 prior to moving to the first transfer position and the second carrier 130 may be parked in the second park position underneath a second equipment assembly 210 prior to the second transfer assembly.

FIGS. 2C, 2D, and 2E illustrate a schematic top view of the process station 205 to show an exemplary arrangement of the magnetic levitation actuator assemblies 120A. FIG. 2C shows the carrier 130 in a first position, such as the park position, beneath two magnetic levitation actuator assemblies 120A. Each magnetic levitation actuator assembly 120A is shown including a linear array of stators 230 and an adjacent linear array of top sensors 270 that are aligned in the X-direction. Separate membranes 206 are shown in dashed lines, which are positioned between the carrier 130 and a corresponding magnetic levitation actuator assembly 120A in the Z-direction. The stators 230 are disposed above features 250 formed on opposing sides of the upper surface of the carrier 130. The top sensors 270 are shown disposed above a portion of the carrier 130, such as the featureless element 260. In some embodiments, each stator 230 in one magnetic levitation actuator assembly 120A is paired with and positioned across from a corresponding stator 230 in the other magnetic levitation actuator assembly 120A. In other words, each stator 230 of a pair of stators 230 is positioned above opposite sides of the carrier 130, which are spaced apart in the Y-direction.

Figure 5B:
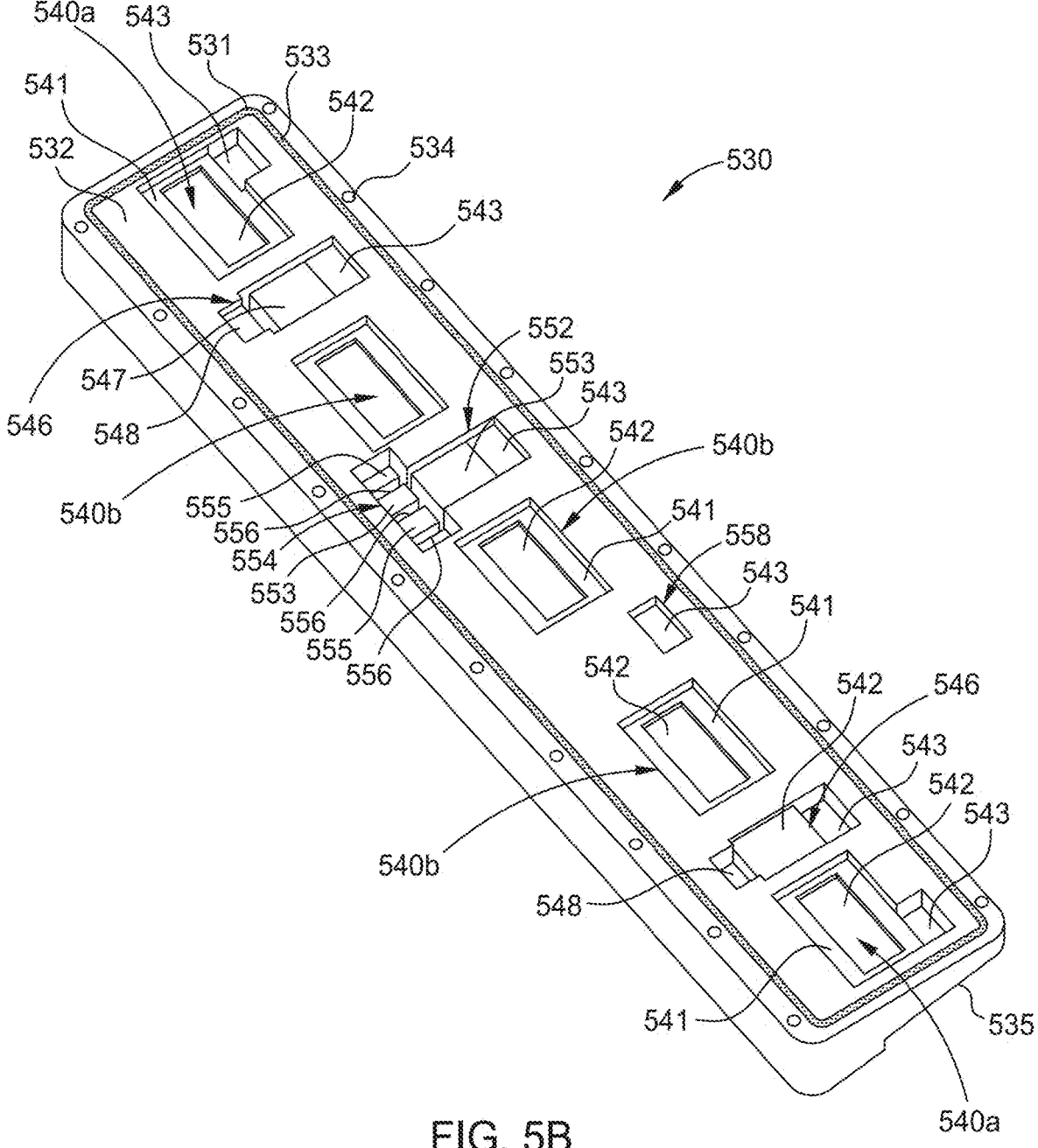
FIG. 5B is a top perspective view of a membrane of the exemplary process station shown in FIG. 5A, in accordance with embodiments of the present disclosure.

In some embodiments, each membrane 206 has a linear array of first recesses, wherein each stator 230 in the linear array of stators 230 is at least partially disposed in a first recess. For example, FIG. 5B illustrates a linear array of five stator pole portions 542 surrounded by an interface surface 541 formed in a membrane 530 to receive a corresponding linear stator 430. Each membrane 206 may also have linear array of second recesses, wherein each top sensor 270 in the linear array of top sensors 270 is at least partially disposed in a second recess. For example FIG. 5B illustrates a linear array of five top sensor portions 543 formed in the membrane 530 to receive a corresponding top sensor 270. In some embodiments, a first recess and corresponding second recess may be part of the same recess, such as the first recess and second recess being different portions of the same recess. For example, FIG. 5B illustrates first recess 540a that includes both a stator pole portions 542 surrounded by an interface surface 541 and a top sensor portion 543.

In some embodiments, the stators 230 are arranged in an array that is not linear, such as being arranged in a staggered array. The membrane 206 similar includes a matching array of recesses to receive a corresponding stator of the array of stators. The top sensors 270 may similarly be arranged in an array that is not linear, each top sensor 270 being each received in a corresponding array of recesses formed in the membrane 206. In some embodiments, a recess can include a demarcated region of the of the membrane 206 over which a stator 230 is positioned so that a magnetic field generated by the stator 230 can more easily or preferentially pass from one side of the membrane 206 to the other side of the membrane 206. In some embodiments, a recess can include a demarcated region of the of the membrane 206 over which a top sensor 270 is positioned so that a magnetic field, which is generated by a stator 230, can be more easily detected. In some embodiments, a recess will include a region of the membrane 206 that has a wall thickness that is thinner than regions positioned adjacent to the recess, such as a pocket or depression formed in a first side (e.g., atmospheric side) of the membrane 206 that is opposed to a second side (e.g., vacuum side) of the membrane 206.

In some embodiments, the membrane 206 does not include one or more recesses. Rather, the stators 230 and top sensors 270 are positioned above a surface of the membrane 206, such as a planar portion of the membrane 206, with a clearance therebetween. For example, the membrane 206 may be a flat (e.g., planar) plate. In some embodiments, the membrane 206 may have a uniform thickness, such as being a flat plate with a uniform thickness.

In some embodiments, at least four stators 230 are needed to maintain the levitation of the carrier 130. For example, the center of gravity (COG) of the carrier 130 may be maintained between two stators 230 in each adjacent magnetic levitation actuator assemblies 120A are used to keep the carrier 130 levitated and level. In some embodiments, at least six stators 230 are needed to move the carrier 130 in the transportation direction. For example, at least three stators 230 in the adjacent magnetic levitation actuator assemblies 120A may be needed to move the carrier 130 to one or more positions in the transportation direction (e.g., positive X-direction).

The stators 230 of each magnetic levitation actuator assembly 120A are spaced apart from each other by a distance D1. The carrier 130, such as the magnetic levitation elements 240, is sized such that the carrier 130 can be conveyed in the transportation direction to the next stator 230 in the linear array of stators 230. In some embodiments, the carrier 130 is sized such that the carrier 130 is always interacting with the attraction force generated by three stators 230 in each adjacent magnetic levitation actuator assemblies 120A.

FIG. 2C shows the carrier 130 in a first position with an object 140 (e.g., substrate) disposed thereon. The carrier 130 is shown levitated under three pairs of stators 230 that are spaced apart in the Y-direction, the first stator pair being marked pair 230A, the second stator pair being marked 230B, and the third stator pair being marked 230C. The three pair of stators 230A-C are activated by the controller 150 to levitate the carrier 130 and to move the carrier 130 in the transportation direction (X-direction) to the next pair of stators 230, which is shown as fourth stator pair 230D.

The carrier 130 moves in the transportation direction and crosses the space between the third stator pair 230C and fourth stator pair 230D to the second position shown in FIG. 2D. The second position is an intermediate position where the carrier 130 is being handed off to the next stator pair of the magnetic levitation actuator assemblies 120A. Each magnetic levitation element 240 may be sized to facilitate the hand-off between stator pairs. For example, and as shown in FIGS. 2C and 2D, the magnetic levitation elements 240 have a length in the transportation direction such that the at least one stator pole 232 of each stator 230 in the first stator pair 240A is above at least one feature 250 while at least one pole 232 of each stator 230 in the fourth stator pair 230D is also above at least one least feature 250 in the second position.

Once the carrier 130 is in the second position, the fourth stator pair 230D can act upon the features 250 of the carrier 130. The carrier 130 is then conveyed from the second position shown in FIG. 2D to a third position shown in FIG. 2E, where an end of the carrier 130 is disposed in the space between the stators 230 in the adjacent first stator pair 230A and second stator pair 230B and no longer disposed underneath the first stator pair 230A. As shown, the carrier 130 is underneath and acted upon by three stator pairs (230B, 230C, 230D) in the third position, and the three stator pairs can continue to convey the carrier 130 in the transportation direction.

The carrier 130 may be conveyed in the transportation direction to hand-off the carrier 130 to the fifth stator pair 230E. Additional, the carrier 130 may be conveyed in the transportation direction to a different process station 205, such as being conveyed from the second process station 112 to the third process station 113 through an open slit valve 160. For example, the carrier 130 may be conveyed to an intermediate position between the second process station 112 and third process station 113 such that the carrier 130 is at least partially underneath a first stator pair in the third process station 113 while being disposed underneath at least two stator pairs in the second station 112. The first stator pair in the third process station 113 along with two stator pairs in the second process station can then convey the carrier 130 in the transportation direction to hand-off the carrier 130 to the next stator pair in the third station 113. This process repeats until the carrier 130 is fully transferred from the second station 112 to the third station 113.

In some embodiments, the distance D1 between the stators 230 in each magnetic levitation actuator assembly 120A may be the same. In some embodiments, the distance D1 may be different between the stators 230. For example, the distance D1 may vary between different process stations, such as the magnetic levitation actuator assemblies in the third station 113 having a distance D1 that is less than the distance D1 of the magnetic levitation actuator assemblies 120A in the second station 112.

In some embodiments, the distance D1 may be less than or equal to 100 mm, such as less than 98 mm, such as less than 96 mm, such as less than 94 mm, such as less than 92 mm, such as less than 90 mm. In some embodiments, the distance D1 is between 80 mm and 90 mm. The carrier 130 may have a length that is equal to the sum of the length of three stators 230 in one linear array plus the sum of two distances D1. For example, the carrier may have a length that is between 400 and 500 mm, such as between 420 mm and 460 mm.

In some embodiments, the process station 205 includes at least one side actuator 280 and at least one side sensor 290 as shown in FIGS. 2C-2E. The at least one side actuator 280 is a magnetic field generating stator configured to move or adjust the position of the carrier 130 in a transverse direction (Y-direction) that is perpendicular to the transportation direction (X-direction). The side actuator 280 may be used to adjust the position of the carrier 130 relative to the magnetic levitation actuator assemblies 120A. In some embodiments, the side actuator 280 may be used to adjust the position of the carrier 130 to center the object 140 above a substrate support, such as a pedestal. The side actuator 280 may interact with the side of the features 250 as well as ferromagnetic material positioned on the side of the carrier 130 to adjust the transverse position of the carrier 130, such as pulling the carrier 130 toward or pushing the carrier 130 away from the side actuator 280.

The at least one side actuator 280 and at least one side sensor 290 may be on the same side of the membrane 206 (e.g., within the first region 207) as the magnetic levitation actuator assembly 120A as shown in FIG. 2C. In some embodiments, the side actuator 280 and side sensor 290 may be integrated with one of the magnetic levitation actuator assemblies 120A. In some embodiments, the side actuator 280 and side sensor 290 may be instead be located on the other side of the membrane 206 from the magnetic levitation actuator assembly 120A.

The side sensor 290 is positioned and configured to sense a transverse position of the carrier 130. For example, the side sensor 290 may sense featureless (e.g., flat) side of the carrier 130 to determine the distance between carrier 130 and the side sensor 290, such as the distance in the Y-direction as when in FIG. 2C. The controller 150 uses the sensed distance to determine the lateral position of the carrier 130, which is the position along the Y-axis in FIG. 2C, relative to the magnetic levitation actuator assemblies 120A. In some embodiments, the side sensor 290 and side actuator 280 may be disposed in the same recess (FIG. 5C) or different recess formed in the membrane 206 to position the side sensor 290 and side actuator 280 laterally across from the side of the carrier 130. The side sensor 290 are a magnetic field detection sensor configured to detect the side of the carrier 130 through the membrane 206 to determine the size of a gap between the membrane 206 and a side of the carrier 130, such as the gap G2 shown in FIG. 5E. For example, the side sensor 290 shown in FIG. 2C is positioned to detect the size of the gap between the side of the carrier 130 and a side of the membrane 206 in the Y-direction. The side sensor 290 may have one or more magnets to generate a magnetic field that extends through the membrane 206 to interact with the side of the carrier 130. The side sensor 290 also has one or more magnetic field sensor elements that are able to detect changes in magnetic flux density of the magnetic field generated by the one or more magnets as the size of the gap changes. The detected magnetic flux density is correlated with the size of the gap between the side of the carrier 130 and the membrane 206. The side sensor 290 may use the same sensing principles as the top sensor 270. In some embodiments, the magnetic field sensor element of the side sensor 290 may be a Hall Effect element, a GMR element, or a TMR element.

In some embodiments, the controller 150 uses one or more location center finder ("LCF") sensors 271 within the station 205 and one or more sensors 270, 290 to determine the center of the object 140 relative to the carrier 130. The LCF sensor 271 may be part of the equipment assembly 210 which is not shown. In some embodiments, the equipment assembly 210 may be the LCF sensor 271. The LCF sensors 271 may be laser sensors. The center location of the object 140 relative to the carrier 130 may change each time the object 140 is transferred to and from the carrier 130 within the substrate processing system 100. The controller 150 uses the lateral position of the carrier 130 based on the measurements of the side sensor 290 to determine the displacement of the center of the object 140 from the center of the substrate support 209 along an axial direction, such as along the Y-direction. The controller 150 then activates the side actuator 280 to adjust position of the carrier 130 along the Y-direction to center the object 140 along the Y-direction. In some embodiments, the controller 150 may then convey the carrier in the X-direction to align the center of the object 140 along the X-direction before or after the controller 150 uses the side actuator 280 to center the carrier 130 along the Y-direction. In some embodiments, the controller 150 may actuate the stators 230 and the side actuator 280 simultaneously to center the object 140 above a substrate support.

In some embodiments, the side actuator 280 is positioned directly across from a center of the substrate support 209 to adjust the position of the carrier 130 to align the center of the object with the center of the substrate support. In some embodiments, the side actuator 280 is not positioned directly across from the center of the substrate support. The side actuator 280 may be used to adjust the lateral position of the carrier 130 such that the center of the object 140 will be aligned with the center of the substrate support 209 when the carrier 130 is moved above the substrate support.

Stray fields generated by a linear stator 230 and the side actuator 280 may interact with a top sensor 270 and/or the side sensor 290. These stray fields may interfere with the operation of the sensors 270, 290. In some embodiments, the magnetic levitation actuator assembly 120A may include one or more shield elements 220 (FIGS. 2C-2E, 9 and 12) to reduce or eliminate the interaction of the stray fields with the top sensor 270 and/or side sensor 290. In some embodiments, the shield element 220 may be made of a ferromagnetic material. The shield element 220 may be a plate or other feature that can be disposed between a sensor and magnetic field generating component. The shield element 220 blocks the stray field to reduce the amount of the stray field that is able to interact with a sensor, such as top sensor 270.

FIGS. 2C-2E illustrate a shield element 220 disposed between each linear stator 230 and the two adjacent top sensors 270 to shield the top sensors 270 from the stray fields of the linear stator 230. Additionally, a shield element 220 is disposed between the side actuator 280 and the side sensor 290 to shield the side sensor 290 from the stray fields generated by the side actuator 280. In some embodiments, a shield element 220 may be used to shield the side sensor 290 from the stray fields of the side actuator 280 and an adjacent linear stators 230. The shield elements 220 may be shaped to separate one or more sides of the top sensor and/or side sensor 290 from the magnetic field generating component. In some embodiments, the shield element 220 may have a thickness of less than 5 mm, such as less than 4 mm, such less than 3 mm, such as less than 2 mm, such as less than 1 mm. For example, the shield element may have a thickness between 2 mm and 0.1 mm, such as being about 1 mm thick.

The membrane 206 and associated magnetic levitation actuator assemblies 120A may be part of a magnetic levitation kit assembly that can be installed within the housing of the process station, such as process station 205. In other words, the magnetic levitation kit assembly may include the membrane 206, stators 230, top sensors 270, side actuator 280, and side sensor 290. The magnetic levitation kit assembly may also include the shield elements 220.

In some embodiments, the sensor 270 may be disposed in the second region 208 instead of being disposed in the first region 207, such as being disposed on the side of the membrane 206 facing the second region 208 or being otherwise positioned in the second region to sense the carrier 130. The sensor 270 may be fully or partially coated with a vacuum compatible coating.

FIG. 3 illustrates an example carrier 300 that includes a base 310 and the magnetic levitation elements 240 of FIGS. 2A-2E, in accordance with embodiments of the present disclosure. In some embodiments, the carrier 130 described above may be implemented as the carrier 300. The carrier 300 of FIG. 3 may be similar to the carrier 130 of FIGS. 2A-2E, and everything discussed herein with respect to the carrier 130 may also apply to the carrier 300.

In some embodiments, the magnetic levitation element 240 of the carrier 300 may be coupled to the base 310. The carrier 300 may also include an opening 330 in the base 310. The carrier 300 may further include one or more substrate support members 342 coupled to the base 310 to support the object 140. Although the object 140 is illustrated in FIG. 3 as a substrate, the carrier 300 may also be configured to carry other objects. For example, the carrier may be configured to carry a mask, shutter, process kits parts, or other objects used in semiconductor processing, as described above. The carrier 300 may also be configured to transport shutter or process kits parts.

In some embodiments, the magnetic levitation element 240 may include or be implemented as one or more rails (e.g., rails 242, 244, 246, 248). The rails 242, 244, 246, 248 may each be aligned in a certain direction relative to the base 310. In some cases, the magnetic levitation element 240 of the carrier 300 may include a first rail 242 aligned in a first direction (e.g., the X-direction). The magnetic levitation element 240 may also include a second rail 244 aligned in a second direction (e.g., the Y-direction). The magnetic levitation element 240 may also include a third rail 246 aligned in the Y-direction and is aligned parallel to the second rail 244. The magnetic levitation element 240 may also include a fourth rail 248 aligned in the X-direction, and is aligned parallel to the first rail 242. Although the carrier 300 in FIG. 3 is illustrated as having four rails 242, 244, 246, 248, however, any number of rails may be used in the carrier 300.

The dimensions of the carrier 300 (including the base 310 and the rails 242, 244, 246, 248) may be based on at least one of the size of the stations 111-118, the location of the top sensors 270 in the stations 111-118, or the size of the objects (e.g., the object 140) being transported by the carrier 300. The dimensions of the carrier 300 may also be selected to facilitate the stability of the carrier 300 during transportation of the object(s) 140, as well as ensure the stability of the carrier 300 when nothing is transported. The carrier 300 may be also be configured to be large enough to support the object 140 (or multiple objects 140, as described below) and small enough to pass into, through, and out of stations (e.g., stations 111-118) of a substrate processing system (e.g., substrate processing system 100), as described above.

The features 250 may be arranged on the rails 242, 244, 246, 248. In some embodiments, a pitch and/or spacing may be provided between adjacent features 250, as described above. The features 250 may also be arrange side by side. As illustrated in FIG. 3, the array of features 250 of the first rail 242 may be aligned in the X-direction along a surface of the first rail 242, the array of features 250 of the second rail 244 may be aligned in the Y-direction along a surface of the second rail 244, the array of features 250 of the third rail 246 may be aligned in the Y-direction along a surface of the third rail 246, and the array of features 250 of the fourth rail 248 may be aligned in the X-direction along a surface of the fourth rail 248. In some embodiments, the features 250 may be arranged linearly. A space between each feature may vary between features 250, or may be the same along the rails 242, 244, 246, 248.

In some embodiments, the features 250 of the rails 242, 244, 246, 248 may cover a portion of the top of the carrier 130. The featureless element 260 of the magnetic levitation elements 240 is shown adjacent to the features 250 of each rail 242, 244, 246, 248. The featureless element 260 may be included on the top of one or more of the rails 242, 244, 246, 248 of the carrier 300, and may be implemented as a featureless track that is aligned with the array of features 250. In some embodiments, the magnetic levitation elements 240 may each include an outer portion and an inner portion. In these embodiments, the features 250 may be located on one or more outer portions of the magnetic levitation elements 240 and the featureless element 260 may be located on one or more inner portions of the magnetic levitation elements 240, as illustrated in FIG. 3. In some embodiments, at least a portion of the base 310 may be featureless and may be substantially flat and configured to enable the top sensors

270 to measure and/or or detect a position of the carrier 300 during contactless levitation and/or transportation. That is, at least a portion of the base 310 may function as the featureless element 260.

The base 310 of the carrier 300 may be formed from a non-magnetic material and vacuum compatible material, such as metal (e.g., aluminum (Al), non-magnetic stainless steel (e.g., 316 SST) or titanium (Ti)). In some embodiments, it is beneficial to select the material from which the carrier 300 is made to include a material that can also withstand high processing temperatures. In one example, the substrate carrier 300 is made from a ceramic material (e.g., alumina, quartz, zirconia, etc.). In some cases, the substrate carrier 300 may be coated with an electrically conductive coating to resolve any charge build-up issues in the substrate carrier 300 during processing within the process station 205. In some embodiments, the rails 242, 244, 246, 248 may include a magnetic material, and the base 310 may not include a magnetic material. By using a different material in the base 310 than the rails 242, 244, 246, 248, the carrier 300 may be configured to be lighter, and/or may be cheaper to manufacture.

The carrier may include an array of legs 320 disposed underneath the base 310. Each leg 320 has a foot 321 engageable with a landing rail (see landing rail 560 in FIG. 5A) disposed in the process station 205 underneath the magnetic levitation actuator assemblies 120A and membrane 206. The carrier 300 is conveyed between the membrane 206 and the landing rails. The carrier 300 may be landed on the landing rails. For example, when levitation of the carrier 300 fails (e.g., power is lost), the carrier 300 may fall, and the feet 321 of the carrier 300 engage the landing rails to maintain the carrier 300 in the upright position. The legs 320 may be electrically coupled to one or more rails 242, 244, 246, 248 and may be configured to electrically ground the carrier 300 when the feet 321 of the carrier 300 are engaged with the landing rails.

The carrier 300 may have a first pair of an arrays of legs 320 running in the X-direction and a second pair of an array of legs 320 running in the Y-direction. The first pair of arrays of legs 320 are engageable with a corresponding landing rail of a first pair of landing rails that run in the X-direction. Each array of legs 320 in the first pair of arrays of legs 320 may be disposed underneath a magnetic levitation element 240 running in the X-direction. Each landing rail of the first pair of landing rails is disposed under a different magnetic levitation actuator assembly 120A. The second pair of arrays of legs 320 are engageable with a corresponding landing rail of a second pair of landing rails that run in the Y-direction. Each array of legs 320 in the second pair of arrays of legs 320 may be disposed underneath a magnetic levitation element 240 running in the Y-direction.

Figures 4A, 4B, 4C:
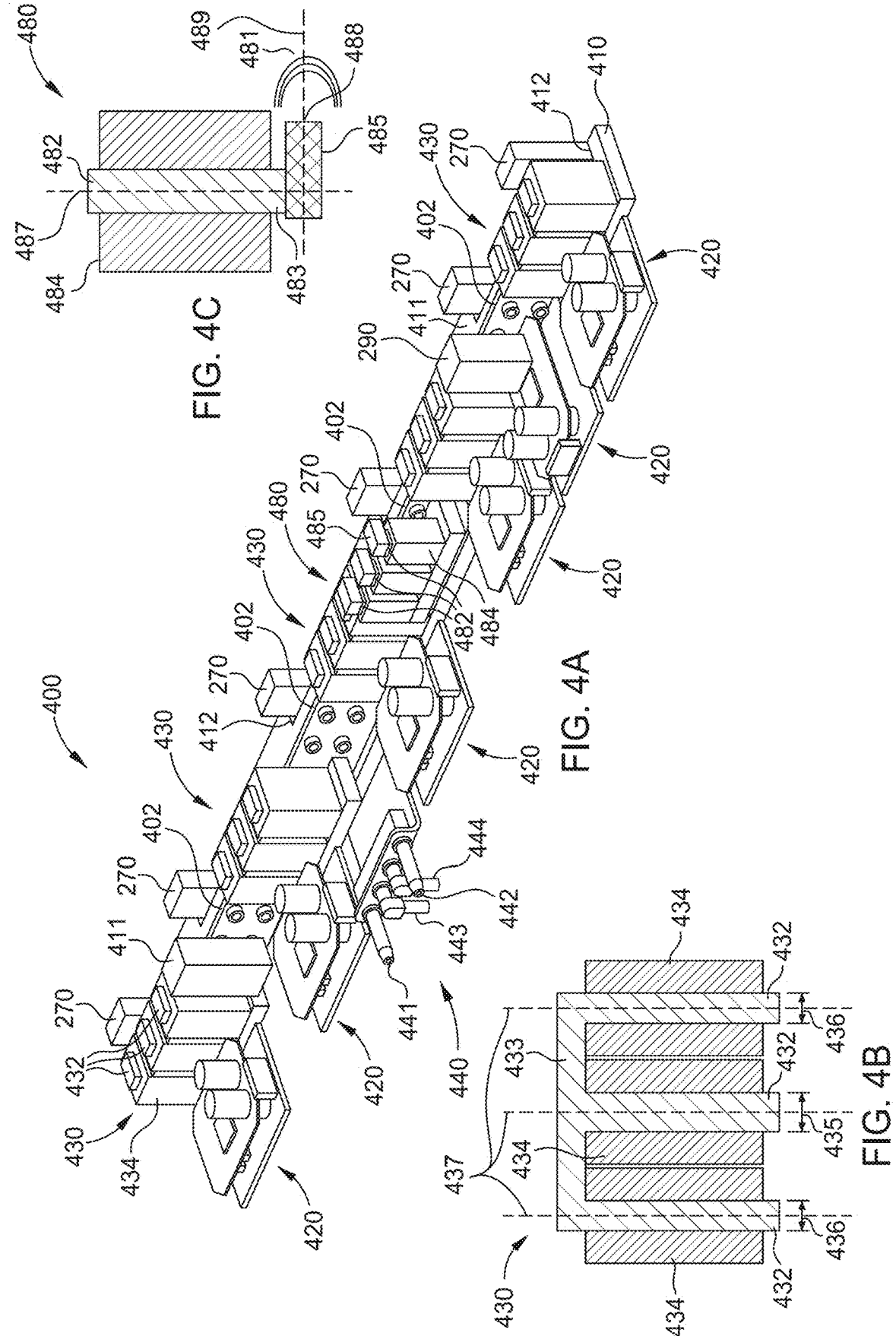
FIG. 4A illustrates a top isometric view of an example magnetic levitation actuator assembly, in accordance with embodiments of the present disclosure.
FIG. 4B is a schematic cross-sectional view of an exemplary embodiment of a linear stator of the magnetic levitation actuator assembly shown in FIG. 4A, in accordance with embodiments of the present disclosure.
FIG. 4C is a schematic cross-sectional view of an exemplary embodiment of a side actuator of the magnetic levitation actuator assembly shown in FIG. 4A, in accordance with embodiments of the present disclosure.

FIG. 4A is a perspective view of the bottom of an exemplary embodiment of a magnetic levitation actuator assembly 400. A magnetic levitation assembly of a process station may include two or more of the magnetic levitation actuator assemblies 400. The magnetic levitation actuator assembly 400 may be incorporated in the place of the magnetic levitation actuator assembly 120A in FIGS. 2A-2E and may be incorporated into stations of the substrate processing system 100. The magnetic levitation actuator assembly 400 includes a member 410, one or more printed circuit boards (PCB) 420, a plurality of linear stators 430, a connection assembly 440, a side actuator 480, a plurality of top sensors 270, and at least one side sensor 290.

The member 410 is an elongated frame, such as a bracket, that supports the other components of the magnetic levitation actuator assembly 400. The member 410 may have a plurality of recesses 412 on one side configured to receive a corresponding top sensor 270. The PCBs 420, stators 430, connection assembly 440, and side actuator 480 are connected to the member 410 on the other side of the member 410 from the top sensors 270. The top sensors 270, side sensor 290, stators 430, and side sensor 480 extend past the bottom side 411 of the member 410. In some embodiments, one or more mounting brackets, such as mounting bracket 402, may be used to attach the PCBs 420, the stators 430, connection assembly 440, side actuator 480, and side sensor 290 to the member 410. In some embodiments, the member 410 includes a cooling channel (see cooling channel 415 in FIG. 5C) that allows a cooling fluid to circulate through the member 410 to thermally regulate the magnetic levitation actuator assembly 400. In other words, the member 410 may be a heat sink that allows heat generated by the PCBs 420, stators 430, and side actuator 480 to be dissipated by the cooling fluid. One or more fans may flow air or another gas across the magnetic levitation actuator assembly 400 to dissipate heat in addition to circulating the cooling fluid through the cooling channels. In some embodiments, the member 410 does not include a cooling channel. For example, cooling may be necessary if the magnetic levitation actuation assembly 400 is incorporated in a process station configured to perform a high temperature process on a substrate, such as a process that exceeds 300° C.

The magnetic levitation actuator assembly 400 includes one or more PCBs 420 to control one or more components, such as the stators 430, top sensors 270, side sensor 290, and side actuator 480. Each PCB 420 may include one or more circuits. In some embodiments, each stator 430 may be connected to and controlled by a separate PCB 420 as shown in FIG. 4A. In some embodiments, the side actuator 480 may be connected to a dedicated PCB 420 or may be controlled by a PCB 420 that is also controlling a stator 430 and one or more sensors, such as one or more top sensors 270 and side sensor 290. Each PCB 420 may be connected to the controller 150. Thus, the PCB 420 may receive information from the top sensors 270 and side sensor 290 and then communicate this information to the controller 150. Similarly, the controller 150 may send an instruction to a PCB 420 that is then used to control a component connected to the PCB 420.

As shown in FIG. 4A, the stators 430 are aligned in a linear array (e.g., row) that is parallel to a linear array of top sensors 270. Five stators 430 are shown in FIG. 4A spaced along the member 410 in the linear array. In some embodiments, the linear array includes more than or less than five stators 430. FIG. 4A shows six top sensors 270 arranged in the linear array, with each stator 430 being at least partially disposed between two adjacent top sensors 270. In some embodiments, the array of top sensors 270 includes more than or less than six top sensors 270. Additionally, two side sensors 290 are shown with the single side actuator 480 disposed between the side sensors 290. In some embodiments, the magnetic levitation actuator assembly 400 may include less than or more than two side sensors 290. In some embodiments, the side sensors 290 are positioned along the frame member 410 to sense a portion of the side 311 of the carrier 300 near the ends of the carrier 300.

FIG. 4B illustrates a schematic cross-sectional view of an exemplary embodiment of stator 430. The stators 430 are linear stators similar to linear stators 230 and are configured to interact with the features 250 of the carrier 300 to levitate and convey the carrier 300. The stators 430 may be incorporated in the place of the stators 230. The stators 430 includes three stator poles 432 with a wire 434 (e.g., winding) wound around each stator pole 432. In other words, the stator 430 includes three teeth (ends of the stator poles 432) that interact with the features 250 on the carrier, such as carrier 130 or carrier 300 when a current is supplied to the wire 434. Each stator pole 432 may extend from a back-member 433 that extends above the top of the three windings 434. As shown, each stator pole 432 has a longitudinal axis 437 and extends from the back member 433 in the direction of the longitudinal axis 437. In some embodiments, the back-member 433 is omitted.

Each stator pole 432 and back-member 433 may be made from electrical steel, such as silicon steel, such being fabricated from sheets of electrical steel. The linear stator 430 may also be coated in a lacquer to prevent relative motion between the wire 434 and associated stator poles 432. Electricity supplied to the wire 434 generates an electromagnetic field. The stator pole 432 directs at least a portion of the magnetic field downward through the tooth (e.g., end) of the stator pole 432 towards the features 250 of the carrier, such as carrier 130 or carrier 300.

In some embodiments, the stator 430 has three stator poles 432 of the same thickness. In some embodiments, the stator 430 may have more than three stators poles 432 of the same thickness.

In other embodiments, such as shown in FIG. 4B, the stator 430 may have stator poles 432 with differing thicknesses. For example, FIG. 4B shows the middle stator pole 432 having thickness 435 that exceeds the thickness 436 of the outer stator poles 432 (e.g., stator poles 432 at each end of the stator 430). In some embodiments, the middle stator pole 432 has a thickness 435 that is greater than 20% of the thickness 436. For example, the thickness 435 may be between 20% and 30%, such as being 20% or 30%, greater than the thickness 436. Without being bound by theory, it is believed that including a middle stator pole 432 that is thicker than the two adjacent outer stator poles 432 more equally distributes the magnetic flux emanating from the teeth (e.g., ends) of the three stator poles 432. Additionally, without being bound by theory, it is believed that a thicker middle stator pole 432 allows for the magnetic saturation to occur at the same time along the same length of the stator poles 432. Additionally, without being bound by theory, it is believed that magnetic saturation of the three stator poles 432 with a thicker middle stator pole 432 occurs later as compared to a stator where all three stator poles 432 have the same thickness. Furthermore, it is believed that a thicker middle stator pole 432 will improve the margin of performance of the stator 430 by between 10% to 15% as compared to a stator with three stator poles of the same thickness. In some embodiments, the stator 430 may have a plurality of middle stators poles 432 that are thicker than the two outer stator poles 432. For example, each middle stator pole 432 may have a thickness 435. As an example, the stator 430 may have five stator poles 432 with three middle stator poles 432 having a thickness 435 and the two outer stator poles 432 having the thickness 436.

The connector assembly 440 is configured to connect the magnetic levitation actuator assembly 400 to other systems of the substrate processing system 100, such as a cooling system, the controller 150, and a power supply. For example, the connection assembly 440 may include an inlet 441 and an outlet 442 connectable to a cooling system to allow a cooling fluid to circulate through the channel 415 within the member 410 to cool the magnetic levitation actuator assembly 400. The connector assembly 440 may have an electrical connection 443 that connects the magnetic levitation actuator assembly 400, such as the PCBs 420, to the power supply. For example, the stators 430 receive electrical power used to generate a magnetic field around each pole 432 from the power supply through the electrical connection 443. The controller 150 may be connected to the PCBs 420 through a communication connection 444 of the connector assembly 440.

The side actuator 480 may be incorporated in place of side actuator 280. The side actuator 480 is used to adjust the lateral position of the carrier 300. In some embodiments, the side actuator 480 is used to adjust the lateral position of the carrier 300 based on the center of the object 140 relative to the carrier 300 to align the center of the object 140 with a center of the substrate support. The center of the object 140 may be obtained by one or more LCF sensors 271. The side actuator 480 is positioned on the member 410 such that the side actuator 480 can interact with a side of the carrier 300. In some embodiments, the side actuator 480 is located on the member 410 such that the side actuator 480 is across from a substrate support of a process station, such as the substrate support 590 in FIG. 5A. In other words, the side actuator 480 may be positioned across from the center of a substrate support to adjust the position of the carrier 300 to center the object 140 above the substrate support.

In some embodiments, the magnetic levitation actuator assembly 400 may include multiple side sensors 290, such as the two side sensors 290 shown in FIG. 4A located at different locations along the member 410. The side sensors 290 detect the lateral position of the carrier 300. The controller 150 may determine the yaw of the carrier 300 by analyzing the difference in distance of the carrier 300 from each of the side sensors 290. The controller 150 may instruct the side actuator 480 to adjust the yaw and/or lateral position of the carrier 300 based on the measurements from the side sensors 290.

FIG. 4C illustrates a cross-sectional view of the side actuator 480. The side actuator 480 is a magnetic stator with at least one stator pole 482 with a wire 484 vertically wound around the stator pole 482. A head 485 is attached to the bottom tooth 483 of the stator pole 482. In some embodiments, the head 485 may be bonded to the stator pole 482, such as being bonded with a high-strength adhesive. Each stator pole 482 and each head 485 may be made from electrical steel, such as silicon steel, such being fabricated from sheets of electrical steel. The side actuator 480 may also be coated in a lacquer to prevent relative motion between the wire 484 and stator pole 482. Electricity supplied to the wire 484 generates an electromagnetic field. The stator pole 482 directs at least a portion of the magnetic field downward through the bottom tooth 483. The head 485 changes the direction of the magnetic field directed through the bottom tooth 483 such that the magnetic field is directed at an angle relative to the longitudinal axis 487 of the stator pole 482, such as in a horizontal (e.g., perpendicular) direction. Thus, the head 485 directs a magnetic field 481 towards the side 311 of the carrier 300 such that the side actuator 480 can move the carrier 300 laterally.

The head 485 and stator pole 482 may be in an L-shape as shown in FIG. 4C. The head 485 is oriented horizontally with respect to the stator pole 482, such that the longitudinal axis 489 of the head 485 is perpendicular to the longitudinal axis 487 of the stator pole 482. The head 485 directs the magnetic field 481 in a generally horizontal direction. An end 488 (e.g., end surface, end face) of head 485 faces the side 311 of the carrier 300 and may be parallel to the side 311 of the carrier 300. The head 485 and stator pole 486 may be in any suitable shape, such as being a non-straight shape. For example, the head 485 and stator pole may be in a J-shape.

Figure 5C:
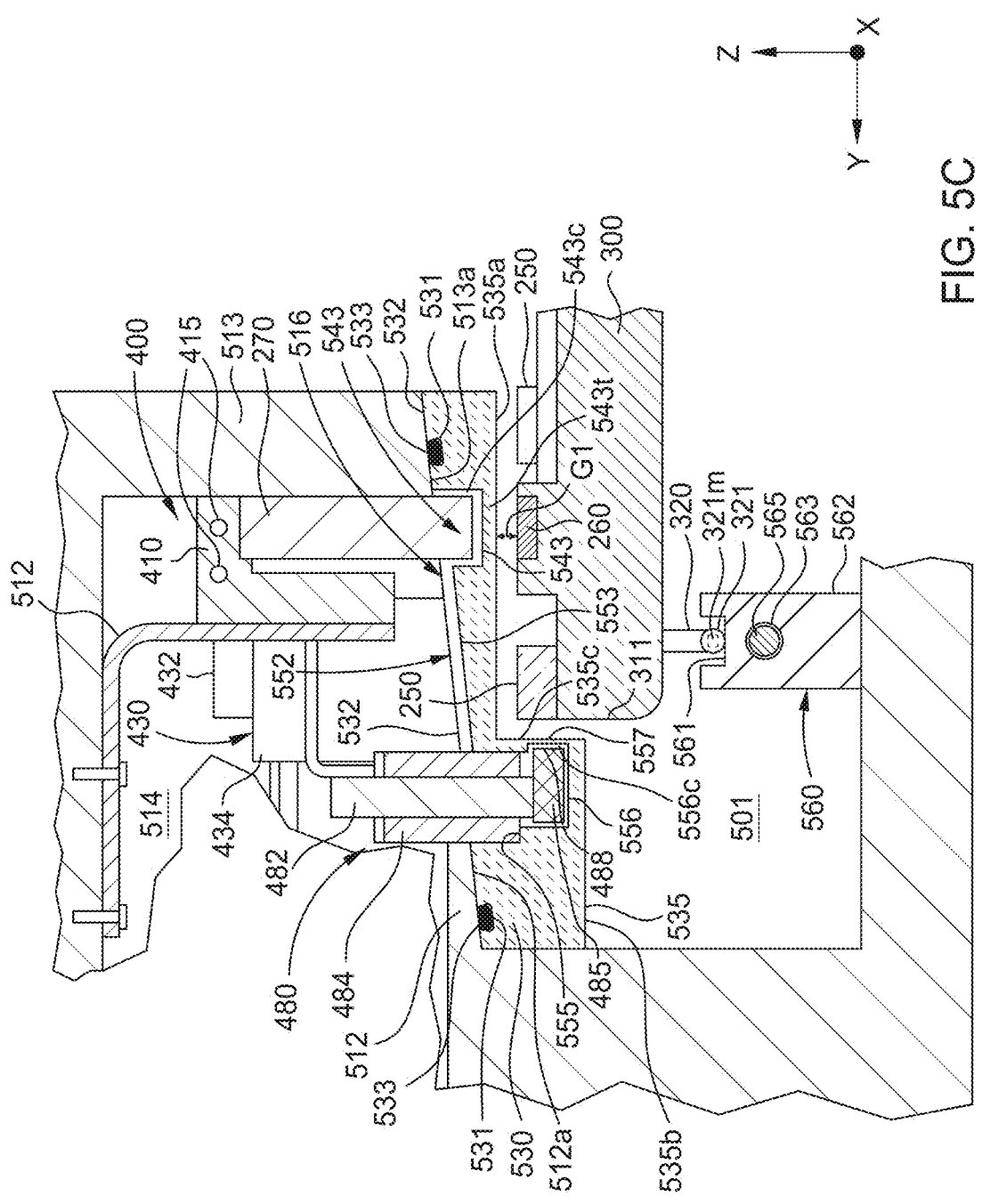
FIG. 5C is an enhanced partial cross-sectional view of the cross-section of the exemplary process station shown in FIG. 5A, in accordance with embodiments of the present disclosure.
Figure 5D:
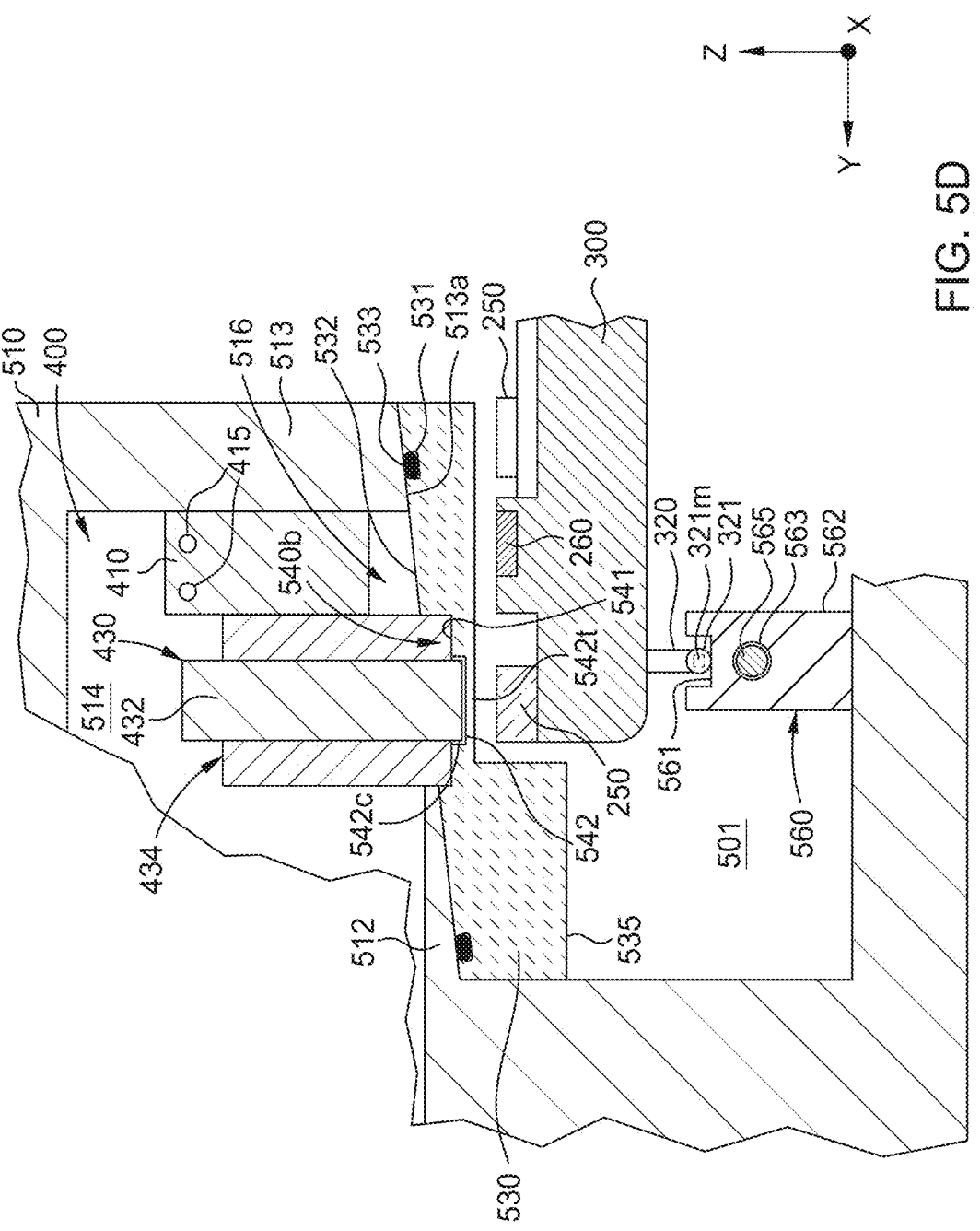
FIG. 5D is a partial cross-sectional view of the exemplary process station shown in FIG. 5A, in accordance with embodiments of the present disclosure.

In some embodiments, the head 485 may not be orientated perpendicular to the stator pole 482 as shown in FIG. 4C. Instead, the head 485 may be orientated at an angle between 0 degrees and 90 degrees relative to the longitudinal axis 487 of the stator pole 432. For example, the head 485 may be attached to the bottom tooth 483 such that the longitudinal axis 489 is disposed at an angle between 0 degrees and 90 degrees relative to the longitudinal axis 487 of the stator pole 432. The head 485 is angled to direct the magnetic field that is emanating from the head 485 at a desired angle relative to the longitudinal axis 487 of the stator pole 482 to interact with a portion of the carrier 300 to laterally move the carrier 300. Thus, the end 488 of the head 485 may be disposed at an angle with respect to the side 311 of the carrier 300 instead of being parallel to the side 311. Thus, and as shown in FIGS. 5C and 5D, the end 488 of the heads 485 face the side 311 of the carrier 300 while the ends of the stators poles 432 of the linear stator 430 faces the top side, such as the feature 250, of the carrier 300.

The side actuator 480 in FIG. 4A is shown with three stator poles 482 each with their own head 485. A separate wire 484 is vertically wound around each of the three stator poles 482. In some embodiments, the side actuator 480 includes more than or less than three stator poles 482 each with their own head 485. For example, the side actuator 480 may have only one stator pole 482 and one head 485. The controller 150 may selectively allow a current to flow through each wire 484 to generate a magnetic field around the associated head 485. The side actuator 480 may be operated to independently generate a magnetic field around each head 485. A different current may be supplied to each wire 484 to generate a different electromagnetic field around the associated head 485. Thus, the controller 150 selectively supplies power to one or more of the wires 484 to generate one or more magnetic fields around the heads 485 to adjust the position of the carrier 300.

Referring back to FIG. 4A, the side actuator 480 may be disposed between two of the stators 430. The side actuator 480 may also be across from a top sensor 270. In some embodiments, and as shown in FIG. 4A, the side actuator 480 is arranged on the frame member 410 such that the longitudinal axis 487 of the stator poles 482 of the side actuator 480 are parallel to the longitudinal axis 437 (see FIG. 4B) of the stator poles 432 of the stator 430. In other words, the head 485 may also be disposed at an angle relative to the longitudinal axis 437 of the stator poles 432 in the stator 430.

The ends of the stator poles 432 (e.g., teeth), the top sensors 270, side sensor 290, and the heads 485 of the side actuator 480 may each be at least partially disposed in a corresponding recess in a magnetically permeable membrane of the process station, such as the membrane 206 or membrane 530 shown in FIG. 5B. In some embodiments, each stator pole 432, top sensor 270, side sensor 290, and heads 485 are disposed in separate recesses. In some embodiments, some of the stator pole 432, top sensor 270, side sensor 290, and/or heads 485 may be disposed in the same recess, such as a recess that is configured to receive both a stator pole 432 and a top sensor 270. The membrane separates the magnetic levitation actuator assembly 400 from another region within the process station, such as separating the first region 207 from the second region 208 of process station 205, such as cavity 514 from the transport region 501 of process station 500 shown in FIG. 5A. The membrane has a wall thickness at the recesses that allow the stators 430, top sensors 270, side sensor 290, and side actuator 480 to interact with a portion of the carrier 300 through the membrane.

In some embodiments, the magnetic levitation actuator assembly 400 includes one or more shield elements, such as shield elements 220 shown in FIG. 2C-2E, to protect the top sensors 270 and side sensors 290 from stray fields generated by the linear stator 430 and side actuator 480. For example, a shield element, which may be attached to or integral with the member 410, may be disposed between linear stator 430 and an adjacent top sensor 270. Similarly, a shield element, which may be attached to or integral with the member 410, may be disposed between the side actuator 480 and the side sensor 290. Similarly, a shield element, which may be attached to or integral with the member 410, may also be disposed between a linear stator 430 and a side sensor 290.

FIG. 5A illustrates a cross-sectional view of an exemplary process station 500. The process station 500 may be used in the place of process stations 112, 113, 116, and 117 of the substrate processing system 100. An X-Y-Z coordinate system is included in FIG. 5A to illustrate the axial direction of travel (i.e., X-direction) of components of the process station 500 and the carrier 300 being conveyed within a transport region 501 of the process station 500.

The process station 500 includes a housing 510, a magnetic levitation assembly 520, membranes 530, landing rail assemblies 560, a source assembly 570, a process kit assembly 580, and a support assembly 590. The source assembly 570 and process kit assembly 580 are part of a process chamber of the process station 500 used to process a substrate 140 once the substrate 140 has been transferred to the substrate support 590 from the carrier 300 and the substrate support 590 has been raised into engagement with the process kit assembly 580 to place the substrate into a processing region 502. The controller 150 is in communication with the process station 500 and controls the one or more components of the process station 500.

The transport region 501 is an interior chamber formed within the housing 510 and extends to an opening on both ends of the station 500 that can be selectively blocked by a slit valve. The carrier 300 is conveyed within the transport region 501 to one or more positions by the magnetic levitation assembly 520. The transport region 501 is partially defined by one or more inner surfaces of the walls of the housing 510 and the membranes 530. The transport region 501 and the process region 502 each form part of the second region 208. In some embodiments, the landing rail assemblies 560 are disposed within the transport region 501. The transport region 501 may be in communication with a vacuum pump 505 to evacuate the transport region 501. For example, the vacuum pump 505 may reduce the pressure within the transport region 501 to a sub-atmospheric pressure on the order of about 10-3 Torr. The vacuum pump 505 may be a turbopump, cryopump, roughing pump or other useful device that is able to maintain a desired pressure within the transport region 501.

A process opening 511 is formed in an upper interior wall of the housing 510. The process opening 511 passes between the opposing magnetic levitation actuator assemblies 400 to allow a substrate support member support 592 of the support assembly 590 to be raised into engagement with the process kit assembly 580. The process opening 511, the source assembly 570, and the process kit assembly 580 are disposed above the support assembly 590. The source assembly 570, the process kit assembly 580, and the support assembly 590 are used together to enable a desired process to be performed within the process region 502 of the process station 500. In various embodiments of the disclosure provided herein, the process region 502 within each of the process stations 500 is configured to be separately isolatable from the transport region 501. The process region 502 is isolated to substantially prevent electromagnetic energy, vapors, gases and/or other undesirable contaminants from adversely affecting the process performed on the object 140 in the process region 502, and/or prevent the vapors, gases and/or other undesirable contaminants from entering the transport region 501 during processing within the process region 502. When isolated from the transport region 501, during substrate processing performed within the process station 500, the process region 502 is generally enclosed by one or more processing surfaces of the source assembly 570, a sealing assembly 585 of the process kit assembly 580 and mating surfaces of a support plate 594 of the support assembly 590.

The magnetic levitation assembly 520 includes two magnetic levitation actuator assemblies 400. Each magnetic levitation actuator assembly 400 is disposed in a corresponding cavity 514 (e.g., first region 207), each cavity 514 being formed in walls positioned on opposing sides of the housing 510. In some embodiments, each magnetic levitation actuator assembly 400 may be mounted in place within the cavity 514 by one or more mounting bracket 515 attached to the member 410 and the housing 510. Each magnetic levitation actuator assembly 400 is oriented in the cavity 514 so that the linear stators 430 are aligned and spaced apart in the X-direction such that the linear array of stators 430 will be above the corresponding array 251 of features 250 of the carrier 300. In other words, the transportation direction of the magnetic levitation assembly 520 as arranged in FIG. 5A is the X-direction. The carrier 300 is conveyed in the positive and negative transportation direction within the transport region 501 by the stators 430 of the magnetic levitation actuator assemblies 400. In some embodiments, the magnetic levitation actuator assembly 520 includes the membranes 530.

FIG. 5A shows a cross-section of the station through the side actuator 480 of the magnetic levitation actuator assembly 400 disposed in the cavity 514 located in the left of the process station 500. The magnetic levitation actuator assembly 400 in the cavity 514 located on the right side of the process station 500 is a mirror image of the magnetic levitation actuator assembly 400 in the cavity 514 on the left hand side of the process station 500. In some embodiments, both magnetic levitation actuator assemblies 400 may have the same components, such as both magnetic levitation actuator assemblies 400 including a side actuator 480 and side sensor 290. In other embodiments, the magnetic levitation actuator assembly 400 have one or more different components. For example, only one of the magnetic levitation actuator assemblies 400 may have a side actuator 480.

Each cavity 514 is partially defined by one or more surfaces of the housing 510 and the membrane 530. The membrane 530 is attached to the housing 510 and is sealingly engaged with one or more interface surfaces of the interior of the housing 510. In some embodiments, the membrane 530 covers an opening 516 (e.g., gap) formed in the housing 510 to enclose and separate the cavity 514 from the transport region. FIG. 5A shows the membrane 530 covering the opening 516. In some embodiments, the opening 516 is partially defined by a first inner wall 512 and a second inner wall 513, the first inner wall 512 and second inner wall 513 being portions of the housing 510. Thus, the first inner wall 512 and the second inner wall 513 thus me be part of the same housing wall. An outer side of the second inner wall 513 may define one end of the cavity 514 while the inner side of the second inner wall 513 may at least partially define the process opening 511.

Each magnetic levitation actuator assembly 400 and corresponding membrane 530 may be part of a magnetic levitation kit assembly that can be installed in the housing 510. Each magnetic levitation actuator assembly 400 is inserted into the cavity 514 after the corresponding membrane 530 is attached to the walls of the housing 510. The magnetic levitation actuator assembly 400 is positioned over the corresponding membrane 530. A cover (not shown), such as a plate, may be used to enclose the cavity 514 after the magnetic levitation actuator assembly 400 is installed in the cavity 514.

The membrane 530 includes a plurality of recesses, as shown in FIG. 5B, to accommodate the ends of the stator poles 432 (e.g., teeth), the top sensors 270, side sensor 290, and side actuator 480. The wall of the membrane 530 defining each recess is shaped and has a thickness that allows the stators 430, top sensors 270, side sensor 290, or side actuator 480 disposed in the recess to interact with a portion of the carrier 300 on the other side of the membrane 530.

A top perspective view of the membrane 530 is shown in FIG. 5B. The membrane 530 is a body that includes an upper surface 532 and a bottom surface 535, the bottom surface 535 being on the other side of the membrane 530 from the upper surface 532. The membrane 530 includes a groove 531 about a periphery of an upper surface 532 that accommodates a sealing element, such as the continuous sealing element 533 shown in FIG. 5A. In some embodiments, and as shown in FIGS. 5A and 5B, the upper surface 532 is disposed at an angle. The upper surface 532 partially defines the cavity 514. The sealing element 533 may be a continuous member that seals against the one or more interface surfaces of the walls of the housing 510, such as sealing against the first and second inner walls 512, 513. The sealing element 533 isolates the cavity 514 from the transport region 501. The membrane 530 may have a plurality of fastener openings 534 (e.g., threaded holes) disposed around the periphery of the groove 531 to receive one or more fasteners that are used to attach the membrane 530 to the housing 510.

Figure 5E:
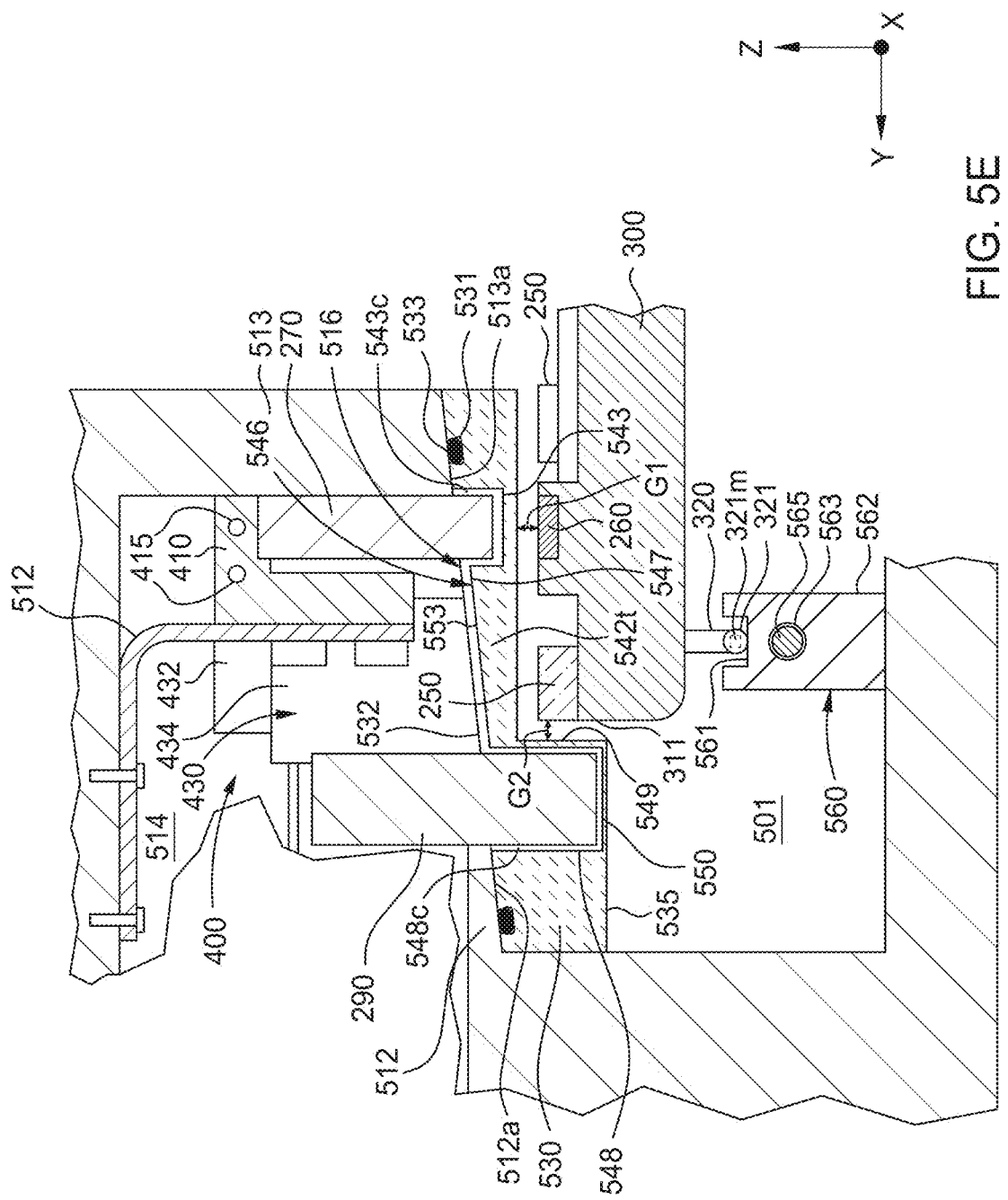
FIG. 5E is a partial cross-sectional view of the exemplary process station shown in FIG. 5A, in accordance with embodiments of the present disclosure.

The bottom surface 535 at least partially defines the transport region 501. The bottom surface 535 may be a stepped surface, with a first portion 535a being separated by a second portion 535b by a third portion 535c. The first portion 535a and second portion 535b may be flat surfaces disposed at different elevations separated by the third portion 535c. The third portion 535c may also be a flat surface that extends vertically between the first and second portions 535a,b. The third portion 535c of the bottom surface 535 may be sized and oriented such that the third portion 535c faces a portion of the side 311 of the carrier 300. The linear array of linear stators 430 and top sensors 270 may be disposed directly above the first portion 535a as shown in FIGS. 5C-5E while the side actuator 480 and side sensors 290 are disposed directly above the second portion 535b as shown in FIGS. 5C and 5E. FIG. 5C shows the end 488 of the head 485 of the side actuator 480 facing toward the third portion 535c.

The membrane 530 includes two first recesses 540a formed in the upper surface 532 on opposite ends of the membrane 530. The two first recesses 540a receive the stator 430 and top sensor 270 located on opposite ends of the magnetic levitation actuator assembly 400. The first recesses 540a includes a stator interface surface 541 inset from the upper surface 532. A lower surface of the stator 430, such as the lower surface of the winding 434, is engaged with the stator interface surface 541 when the magnetic levitation actuator assembly 400 is placed in the cavity 514. The stator interface surface 541 resists the magnetic attraction force applied by the stator 430 due to the selection of materials used to form the membrane 530 to allow the stator 430 to maintain a stable position relative to the membrane 530. The stator interface surface 541 surrounds a pole portion 542 of the first recess 540a. The pole portion 542 accommodates the stator poles 432 of the stator 430. The pole portion 542, however, has a depth such that the stator poles 432 are not in contact with the membrane 530. A clearance 542c is therefore present between the stator poles 432 and the surface of the pole portion 542. This clearance 542c is shown in FIG. 5D. The first recess 540a also includes a top sensor portion 543 that receives a portion of the top sensor 270. A portion of the interface surface 541 is disposed between the pole portion 542 and the top sensor portion 543. In some embodiments, the top sensor portion 543 is sized such that a clearance 543c is present between the surface of the top sensor portion 543 and the top sensor 270 such that the end of the top sensor 270 does not contact the membrane 530.

The membrane 530 also includes three second recesses 540b. The second recesses 540b are similar to the first recesses 540a except that the second recesses 540b do not include the top sensor portion 543. The second recesses 540b receive and support the three middle stators 430 disposed between the two stators 430 located on the opposite ends of the member 410.

The membrane 530 also includes two third recesses 546 (FIG. 5B). Each third recess 546 is disposed between a first recesses 540a and an adjacent second recess 540b. Each third recess 546 includes first surface 547 inset from the upper surface 532 that separates a top sensor portion 543 from a side sensor portion 548. The side sensor portion 548 (FIG. 5B) is configured to receive a corresponding side sensor 290. In some embodiments, the side sensor portion 548 is sized such that a clearance 548c is present between the surface of the side sensor portion 548 and the side sensor 290, such as that the end of the side sensor 290 and the opposing lower surface of the side sensor portion 548 do not touch.

The membrane 530 also includes a fourth recess 552 configured to receive the side actuator 480 and a top sensor 270. The fourth recess 552 includes a top sensor portion 543 and a side actuator portion 554. The side actuator portion 554 is located and shaped to position the heads 485 of the side actuator 480 horizontally across from the carrier 300. A surface 553 may be inset from the upper surface 532 that separates the top sensor portion 543 (FIG. 5B) from the side actuator portion 554. The side actuator portion 554 may include a plurality of side actuator interface surfaces 555 that are separated by one or more head recesses 556. A lower surface of the side actuator 480, such as the lower surface of the windings 484, is engaged with the one or more side stator interface surfaces 555 when the magnetic levitation actuator assembly 400 is placed in the cavity 514. Each head 485 of the side actuator 480 is disposed in a corresponding head recess 556. The fourth recess 552 shown in FIG. 5B illustrates three head recesses 556 separated by side actuator interface surfaces 555 to accommodate the three heads 485 of the side actuator 480.

The membrane 530 may also have a fifth recess 558 which is shown as a free-standing top portion 543 that is disposed between two adjacent second recesses 540b as shown in FIG. 5B. The fifth recess 558 is configured to receive one of the top sensors 270.

The top sensor portions 543 of the first recesses 540a, third recesses 546, fourth recess 552, and fifth recess are arranged in a linear array that corresponds to the linear array of top sensors 270 of the magnetic levitation actuator assembly 400. Similarly, the stator pole portions 542 of the first recesses 540a and second recesses 540b are aligned in a linear array that corresponds to the linear array of stators 430. Furthermore, the side sensor portion 548 of the third recesses 546 are arranged in a linear array that corresponds with the linear array of side sensors 290.

In some embodiments, the one or more fastener openings 534 may located around the periphery of the groove 531 or may be disposed within the inside edge of the groove 531. In other embodiments, the fasteners are omitted and the membrane 530 is attached to the housing 510 by some other method that also eliminates the need for the fastener openings 534, the groove 531, and the seal member 533. For example, the membrane 530 may be laser welded, explosion welded, diffusion bonded, or brazed to the housing 510 to hermetically seal the interior of the cavity 514 from the transport region 501. The membrane 530 of the process station 500 may be formed from a non-ferromagnetic material that has a low magnetic permeability. For example, the membrane 530 may be formed from non-magnetic stainless steel, such as stainless steel T304, 304, 316, or a titanium alloy. In some embodiments, the membrane 530 is formed from a ceramic material, such e.g., alumina, quartz, zirconia, etc. For example, the membrane 530 may be ceramic formed by sintering and subsequent machining.

FIG. 5C illustrates a partial cross-sectional view of the process station 500 showing a close-up view of the cross-sectional view shown in FIG. 5A. One top sensor 270 is shown positioned across from the side actuator 480, which are both disposed within the fourth recess 552. As shown, the edge surface (e.g., lower surface of the winding 484) of the side actuator 480 is engaged with the side actuator interface surface 555. The head 485 is shown in the head recess 556. The end 488 of the head 485 is positioned to face the side 311 of the carrier 300 which is on the other side of the membrane 530 within the transport region 501. The head 485 is positioned below the end (e.g., tooth) of the stator poles 482 of the linear stator 430 (see FIG. 5D). A clearance 556c is present between the surface of the head recess 556 and the head 485 such that the head 485 does not touch the membrane 530. An end wall 557 of the membrane 530 separates the head recess 556 from the transport region 501. The magnetic field emanating from the head 485 extends through the membrane 530 into the transport region 501, such as passing through the end wall 557. The inner surface of the end wall 557 partially defines the side actuator portion 554 and the outer surface of the end wall 557 is part of the third portion 535c of the bottom surface 535. The end wall 557 at the head recess 556 has a thickness, shown in the X-direction, selected such that the end 488 of the head 485 is positioned close to the side 311 of the carrier 300 while also being thick enough such that the end wall 557 does not rupture or bow due to the pressure differential between the transport region 501 and the cavity 514 during processing. In some embodiments where the membrane 530 is made from a non-ferromagnetic material, the thickness of the end wall 557 is also selected to prevent rupturing or bowing due to the magnetic field emanating from the head 485. For example, the end wall 557 of the membrane 530 may have a thickness of less than 1 mm, such as 0.9 mm, such as 0.8 mm, such as 0.7 mm, such as 0.6 mm, such as 0.5 mm, such as 0.4 mm, such as 0.3 mm, such as 0.2 mm, such as 0.1 mm, such as 0.09 mm, such as 0.08 mm, such as 0.07 mm, such as 0.06 mm, such as 0.05 mm, such as 0.04 mm, such as 0.03 mm, such as 0.02 mm, such as 0.01 mm. In some embodiments, the end wall 557 may have a thickness less than the thickness of the wall between the bottom of the head recess 556 and the bottom surface 535 of the membrane 530 as shown in FIG. 5C.

As shown in FIG. 5C, the top sensor 270 is positioned in the top sensor portion 543 of the fourth recess 552 and above the featureless element 260 of the carrier 300. The clearance 553c is be present between the top sensor 270 and the top sensor portion 543 such that the top sensor 270 and membrane 530 do not touch. The membrane 530 has a wall between the surface of the sensor portion 543 and the bottom surface 535 of the membrane 530 with a thickness 543t in the Z-direction. The dimension of the thickness 543t is selected such that the top sensor 290 is positioned close to the featureless element 260 of the carrier 300 while also being thick enough such that the wall does not rupture or bow due to the pressure differential between the transport region 501 and the cavity 514. For example, the membrane 530 may have a thickness 543t of less than 1 mm, such as 0.9 mm, such as 0.8 mm, such as 0.7 mm, such as 0.6 mm, such as 0.5 mm, such as 0.4 mm, such as 0.3 mm, such as 0.2 mm, such as 0.1 mm, such as 0.09 mm, such as 0.08 mm, such as 0.07 mm, such as 0.06 mm, such as 0.05 mm, such as 0.04 mm, such as 0.03 mm, such as 0.02 mm, such as 0.01 mm.

FIG. 5C also shows a gap G1 between the featureless element 260 and the first portion 535a of the bottom surface 535 of the membrane 530. The gap G1 is further shown beneath the top sensor 270 that is disposed in the top sensor portion 543. The top sensor 270 has one or more magnets that generates an electric field that passes through the membrane 530. The one or more magnetic field detection elements measure the magnetic flux density of the magnetic field, and the measured magnetic flux density is used to determine the size of the gap G1, and thus the vertical position of the carrier 300 within the transport region 501.

FIG. 5C also shows the membrane 530 in sealing engagement with a housing interface surface of the housing 510 that surrounds the opening 516. The upper surface 532 of the membrane 530 has a slope that corresponds with a slope of a first interface surface 512a of the first inner wall 512 and a slope of a second interface surface 513a of the second inner wall 513. The first and second interface surfaces 512a, 513a may each be portion of the housing interface surface that surrounds the periphery of the opening 516. The first interface surface 512a and second interface surface 513a are aligned along the same plane. The seal member 533 is shown disposed in the groove 531 and is engaged with the first and second interface surfaces 512a, 513a. In some embodiments, the first inner wall 512 may be a shoulder that protrudes from a side wall of the housing 510 as shown in FIG. 5C.

FIG. 5D is a partial cross-sectional view of the process station 500 showing one of the stators 430 positioned at a second recess 540b. As shown, the edge surface, or lower surface of the winding 434 of the stator 430 is engaged with the stator interface surface 541. The stator pole 432 is disposed in the pole portion 542 of the second recess 540b with the clearance 542c present between the stator pole 432 and the surface of the pole portion 542. The membrane 530 has a wall between the surface of the pole portion 542 and the bottom surface 535 of the membrane 530 that has a thickness 542t in the Z-direction. The thickness 542t is thinner than the other varying thicknesses of the membrane 530 shown in the cross-sectional view of FIG. 5D. The dimension of the thickness 542*t* is selected such that the end of the stator pole 432 is positioned close to the features 250 of the carrier 300 while also being thick enough such that the wall does not rupture or bow due to the pressure differential between the transport region 501 and the cavity 514 or rupture or bow due to the attraction of the magnetic field with the material of the membrane 530. For example, the thickness 542*t* of the wall between the surface of the pole portion 542 and the bottom surface 535 of the membrane 530 may be less than 1 mm, such as 0.9 mm, such as 0.8 mm, such as 0.7 mm, such as 0.6 mm, such as 0.5 mm, such as 0.4 mm, such as 0.3 mm, such as 0.2 mm, such as 0.1 mm, such as 0.09 mm, such as 0.08 mm, such as 0.07 mm, such as 0.06 mm, such as 0.05 mm, such as 0.04 mm, such as 0.03 mm, such as 0.02 mm, such as 0.01 mm.

FIG. 5E illustrates a partial cross-sectional view of the process station 500 showing one top sensor 270 located across from a side sensor 290 within a third recess 546. As shown, the top sensor 270 is positioned in the top sensor portion 543. The top sensor 270 is also positioned above the featureless element 260 of the carrier 300. The side sensor 290 is positioned within the side sensor portion 548. As shown, the side sensor portion 548 has a depth that is greater than the depth of the top sensor portion 543. A portion of the side sensor 290 is positioned across from a side 311 of the carrier 300. The side sensor 290 senses the side 311 of the carrier 300 through a side wall 549 of the side sensor portion 548. The side sensor 290 may determine the distance of a gap G2 between the outer surface of the side wall 549 and the side 311 of the carrier 300. The side sensor 290 may have one or more magnets that generate a magnetic field that extends through the side wall 549 into the transport region 501. The side sensor 290 may use one or more magnetic field detection elements to detect changes in the magnetic flux density of the magnets of the side sensor 290 to determine the size of the gap G2. The side wall 549 has a thickness in the Y-direction extending from the inner surface of the side wall 549 to the outer surface of the side wall 549. The outer surface of the side wall 549 forms part of the bottom surface 535 of the membrane 530. The thickness of the side wall 549 is selected to be thin enough to allow the side sensor 290 detect the side 311 of the carrier 300 while being thick enough such that side wall 549 does not rupture or bow due to the pressure differential between the transport region 501 and the cavity 514. For example, the side wall 549 may have a thickness less than 1 mm, such as 0.9 mm, such as 0.8 mm, such as 0.7 mm, such as 0.6 mm, such as 0.5 mm, such as 0.4 mm, such as 0.3 mm, such as 0.2 mm, such as 0.1 mm. The membrane 530 also has a wall 550 extending from the end surface of the side sensor portion 548 to the bottom surface 535. The thickness of the wall 550 may be thicker than the thickness of the side wall 549. The side sensor portion 548 may be sized such that the clearance 548*c* is present between the side sensor 290 and the surface of the side sensor portion 548.

In some embodiments, the membrane 530 has individual recesses for each component. For example, the membrane 530 has a separate recess for the top sensor 270 and stator 430 rather than a first recess 540*a* that has a pole portion 542 and sensor portion 543.

A landing rail assembly 560 is disposed underneath each membrane 530 and magnetic levitation actuator assembly 400 as shown in FIG. 5E. The landing rail assembly 560 is also shown in FIGS. 5A, 5C, and 5D. The landing rail assembly includes a landing rail 561 configured to receive feet 321 of the carrier 300. In some embodiments, the landing rail 561 may is a groove formed in the upper surface of the body 562, the groove extending at least the length of the above magnetic levitation actuator assembly 400, such as extending in the X-direction as shown in FIG. 5A.

The body 562 partially or fully disposed within the transport region 501. The body 562 may be attached to the inner wall of the housing 510 underneath the membrane 530. In some embodiments, the body 562 is formed integrally with the housing 510. The body 562 may include an interior opening 563 that runs the length or part of the length of the body 562 underneath the landing rail 561.

A position sensor 565 in communication with the controller 150 may be disposed in the interior opening 563. The position sensor 565 may be a linear encoder type of position sensor configured to detect a magnet 321*m* disposed in one or more feet 321 in an array of legs 320. Thus, the position sensor 565 may be used to determine the position of the carrier 300 in the transport direction (e.g., X-direction) as the carrier 300 is conveyed within the transport region 501. The controller 150 may use the position detected by the position sensor 565 to operate one or more stators 430 of the magnetic levitation actuator assembly 400 to move the carrier 300. The interior opening 563 may be at a different pressure than the transport region 501 and may be hermetically sealed from the transport region 501. In some embodiments, the interior opening 563 may be at atmospheric pressure or exposed to the atmosphere while the transport region 501 is at a vacuum pressure and isolated from the atmosphere.

In some embodiments, the position sensor 565 is a magneto restrictive sensor that includes a waveguide and strain pulse converter. An electric pulse is periodically applied to the waveguide which generates a magnetic field. At least one foot 321 includes a magnet 321*m*, such as the magnet 321*m* being embedded in foot 321. The magnetic field of the magnet 321*m* interacts with the magnetic field generated by the waveguide, which causes a torsional strain on the waveguide that propagates a torsional strain pulse through the length of the waveguide to the strain pulse converter at a known velocity. The strain pulse converter uses the time difference between the pulse applied to the waveguide and the received torsional strain pulse to determine the position of the magnet 321*m* along the waveguide. The position of the magnet 321*m* is correlated to a position of the carrier 300 within the transport region 501 because the position of the magnet 321*m* relative to the carrier 300 is known.

In some embodiments, only one of the landing rail assemblies 560 running in the X-direction has a position sensor 565. In some embodiments, both the landing rail assemblies 560 running in the X-direction have a position sensor 565. For example, the yaw of the carrier 300 may be determined based on a positioned obtained from a position sensor 565 in each of the landing rail assemblies 560. The carrier 300 may activate one or more stators 430 and/or side actuators 480 in one or both of the magnetic levitation actuator assemblies 400 to adjust the yaw of the carrier 300 based on the positional information obtained from the position sensors 565.

In some embodiments, the landing rail 561 may be a component that is separate from the body 562 rather than being a groove formed in the upper surface of the body 562. For example, the landing rail 561 may be a rail element disposed on or above the upper surface of the body 562.

In some embodiments, the process station 500 also includes additional landing rail assemblies 560 positioned to receive an array of legs 320 running in the Y-direction. The controller 150 may use the position sensor 565 in the one or more landing rail assemblies 560 oriented in the Y-direction to determine a position of the carrier 300 in the Y-direction.

FIG. 5A illustrates the source assembly 570 adapted to perform a physical vapor deposition ("PVD") deposition process. The exemplary source assembly 570 includes a magnetron assembly 571, a target 572, process assembly walls 573 coupled to the housing 510, a lid 574 and a sputtering power supply 575. In this configuration, a processing surface 572A of the PVD target 572 generally defines at least a portion of the upper portion of the process region 502. The magnetron assembly 571 includes a magnetron region 579 in which the magnetron 571A is rotated by use of a magnetron rotation motor 576 during processing. The target 572 and magnetron assembly 571 are typically cooled by the delivery of a cooling fluid (e.g., deionized water) to the magnetron region 579 from a fluid recirculation device (not shown). The magnetron 571 includes a plurality of magnets 571B that are configured to generate magnetic fields that extend below the processing surface 572A of the target 572 to promote a sputtering process performed in the process region 502 during a PVD deposition process.

The support assembly 590 includes a substrate support member 592, such as a pedestal as shown in FIG. 5A, and an actuator assembly 596. The substrate support member 592 may include a shaft 593 connected to a support plate 594, and lift pins 598.

FIG. 5A shows the carrier 300 in a transfer position within the transport region 501. In other words, the carrier 300 is in a position above the substrate support 590 to facilitate the transfer of the object 140 to the substrate support 209. The carrier 300 may also be conveyed to a park position within the transport region to allow the substrate support 590 to be raised into the opening 511 to position the substrate 140 for processing.

The lift pins 598 may be extended and retracted in the Z-direction. For example, the lift pins 598 extend to lift the substrate 140 off the carrier 300 that is in the transfer position and then retract to place the substrate 140 into engagement with the upper surface of the support plate 594 once the carrier 300 has moved to the park position. A lift pin actuator 599 may supply a hydraulic or pneumatic fluid to extend or retract the lift pins 598. The lift pin actuator 599 may include a stepper or servo motor actuated lead screw assembly, linear motor assembly, pneumatic cylinder actuated assembly or other conventional mechanical linear actuation mechanism. In some embodiments, the lift pins are disposed in the support plate 594 as shown in FIG. 5A. In other embodiments, the lift pins 598 may be disposed outside of the support plate 594. For example, the lift pins 598 may be coupled to a plate surrounding the shaft 593 that is raised and lowered relative to the support plate 594 by an actuator. The lift pins 598 may be extended and retracted through a corresponding hole formed in the support member 592 by the movement of the plate relative to the support member 592.

The actuator assembly 596 is actuated to raise or lower the support member 592 in the Z-direction once the carrier 300 has moved from the transfer position, such as when carrier 300 is in the park position. The actuator assembly 596 is coupled to the shaft 593, which is supported by bearings (not shown) that are coupled to a lower wall of the housing 510 to guide the shaft 593 as it is translated by the actuator assembly 596. A seal, such as a bellows assembly (not shown), is used to form a seal between the outer diameter of the shaft 593 and a portion of the lower wall of the housing 510, such that a vacuum environment created within the transport region 501, by use of the vacuum pump 505, is maintained during normal operation. The actuator assembly 596 may be mounted to the housing 510. The actuator assembly 596 may include a stepper or servo motor actuated lead screw assembly, linear motor assembly, pneumatic cylinder actuated assembly or other conventional mechanical linear actuation mechanism.

During operation, the actuator assembly 596 is configured move the support member 592 between positions within the process station 500. The support member 592 is positionable in a lower position (e.g., FIG. 5A) which is vertically (Z-direction) below the carrier 300 such that the carrier 300 may move within the transport region 501 to one or more positions within the transport region 501 without contacting the support member 592. The carrier 300 may be moved within the transport region 501 to the transfer position above the support member 592. The support member 592 may be moved upwards to a support transfer position to place the surface of the support plate 594 below the carrier 300 (e.g., transfer plane) without contacting the carrier 300. The lift pins 598 are then extended to disengage the object 140 from the substrate support members 342 of carrier 300, thus transferring the object 140 to the lift pins 598. The carrier 300 is then moved to the park position after the object 140 is transferred to the lift pins 598 so that the carrier 300 does not obstruct upward movement of the support member 592 or lowering the object 140 into engagement with the support plate 594. The lift pins 598 are retracted to engage the object 140 with the support plate 594 after the carrier 300 is moved to the park position. The support member 592 may be moved upwards to a process position to dispose the object 140 in the process region 502 after the carrier 300 is moved to the park position.

The process kit assembly 580 may include a process region shield 582, an isolation ring 583, the sealing assembly 585 which may be positioned over and/or within the process opening 511 formed within the housing 510, a deposition ring (not shown), and a cover ring 586. In some embodiments, the support plate 594 contacts a portion of the process kit assembly 580, such as the sealing assembly 585, to form the process region 502. The process region 502 may be evacuated via a vacuum pump 507 coupled to a station wall 584 of the housing 510 via a first port within the station wall 584.

For example, the vacuum pump 507 may reduce the pressure within the process region 502 to a sub-atmospheric pressure on the order of about 10-3 Torr. The vacuum pump 507 may be a turbopump, cryopump, roughing pump or other useful device that is able to maintain a desired pressure within the process region 502. The station wall 584 is coupled to a gas source assembly 509, and is configured to deliver one or more process gases (e.g., Ar, $N_2$) to the process region 502 through a plenum during processing.

The process region shield 582 is positioned on a lower portion of the station wall 584. The process region shield 582 is typically used to collect deposition sputtered from the target 572 and to enclose a portion of the process region 502. The isolation ring 583, which is formed from a dielectric material, is configured to support the target 572 and be position on the station wall 584. The isolation ring 583 is used to electrically isolate the target 572, when it is biased by the sputtering power supply 575, from the grounded station wall 584.

During processing of a substrate 140, the substrate 140 is engaged with the support plate 594 which is positioned in the process position below the source assembly 570. When in the process position, a region of the support plate 594 forms a separable seal with a portion of the sealing assembly 585 so as to substantially fluidly isolate the process region 502 from the transport region 501. Thus, when in the process position, the support plate 594, the sealing assembly 585, the process region shield 582, the station wall 584, the isolation ring 583 and target 572 substantially enclose and define the process region 502.

The sealing assembly 585 may include an upper plate 585a, bellows 585b, and a lower plate 585c. The bellows 585b is positioned between the upper plate 585a and the lower plate 585c. In some embodiments, the seal formed between the portion of the support plate 594 and the upper plate 585a of the sealing assembly 585 is created at a sealing region that is formed by physical contact between a surface of the region of the support plate 594 and a surface of the upper plate 585a. In some embodiments, the flexible bellows assembly 585b of the sealing assembly 585 is configured to be extended in the vertical (Z) direction as the portion of the support plate 594 is placed in contact with the surface of the portion of the sealing assembly 585 by use of the actuator assembly 596 in the support assembly 590. The compliant nature of the flexible bellows 585b assembly allows any misalignment or planarity differences between the surface of the portion of the support plate 594 and the surface of the portion of the sealing assembly 585 to be taken up so that a reliable, repeatable and separable seal can be formed. The flexible bellows assembly 585b may be a stainless steel bellows assembly or Inconel bellows assembly, among others.

While process station 500 shown in FIG. 5A is shown as adapted to perform a PVD deposition process, the source assembly 570 can include different hardware to perform a different process. For example, the source assembly 570 may be adapted to perform chemical vapor deposition ("CVD"), plasma enhanced chemical vapor deposition ("PECVD"), atomic layer deposition ("ALD"), plasma enhanced atomic layer deposition ("PEALD"), etch, lithography, ion implantation, ashing, cleaning, thermal process (e.g., rapid thermal processing, anneal, cool down, thermal management control) degas, and/or other useful substrate processes.

In one example, the source assembly 570 of a process station that is adapted to perform a CVD deposition process, a PECVD deposition process or an etch process includes a gas distribution plate, or showerhead, that is configured to deliver a precursor gas or etching gas into the process region 502 and across a surface of a substrate. Generally, a showerhead, or gas distribution plate, includes a metal, quartz or ceramic plate that has a plurality of holes (e.g., greater than 100 holes) formed therein to restrict and thus allow an even distribution of a gas to flow from an upstream side of the showerhead to a downstream side of the showerhead, which is positioned adjacent to the process region 502 of a process station 500 during processing. The gas (e.g., precursor gas or etching gas) is delivered to the upstream side of the showerhead and through the showerhead by a precursor gas source (not shown) typically disposed outside of the process station 500. In this configuration of the source assembly 570, the one or more processing surfaces that define at least a portion of the process region 502 is the lower surface of the gas distribution plate, or showerhead (e.g., surfaces that contact the process region). In this configuration, the magnetron assembly 571 and target are not used, and the sputtering power supply 575 can be replaced with a RF power supply that is configured to bias the gas distribution plate.

In some embodiments, the processing station 500 may include an equipment assembly, such as equipment assembly 210, positioned within the housing 510 to be above the carrier 300 when the carrier 300 is in the park position. Thus, the substrate 140 on the carrier 300 may be sensed by one or more sensors or undergo a process, such as being cooled or heated, while the carrier 300 is in the park position.

Figures 6A, 6B:
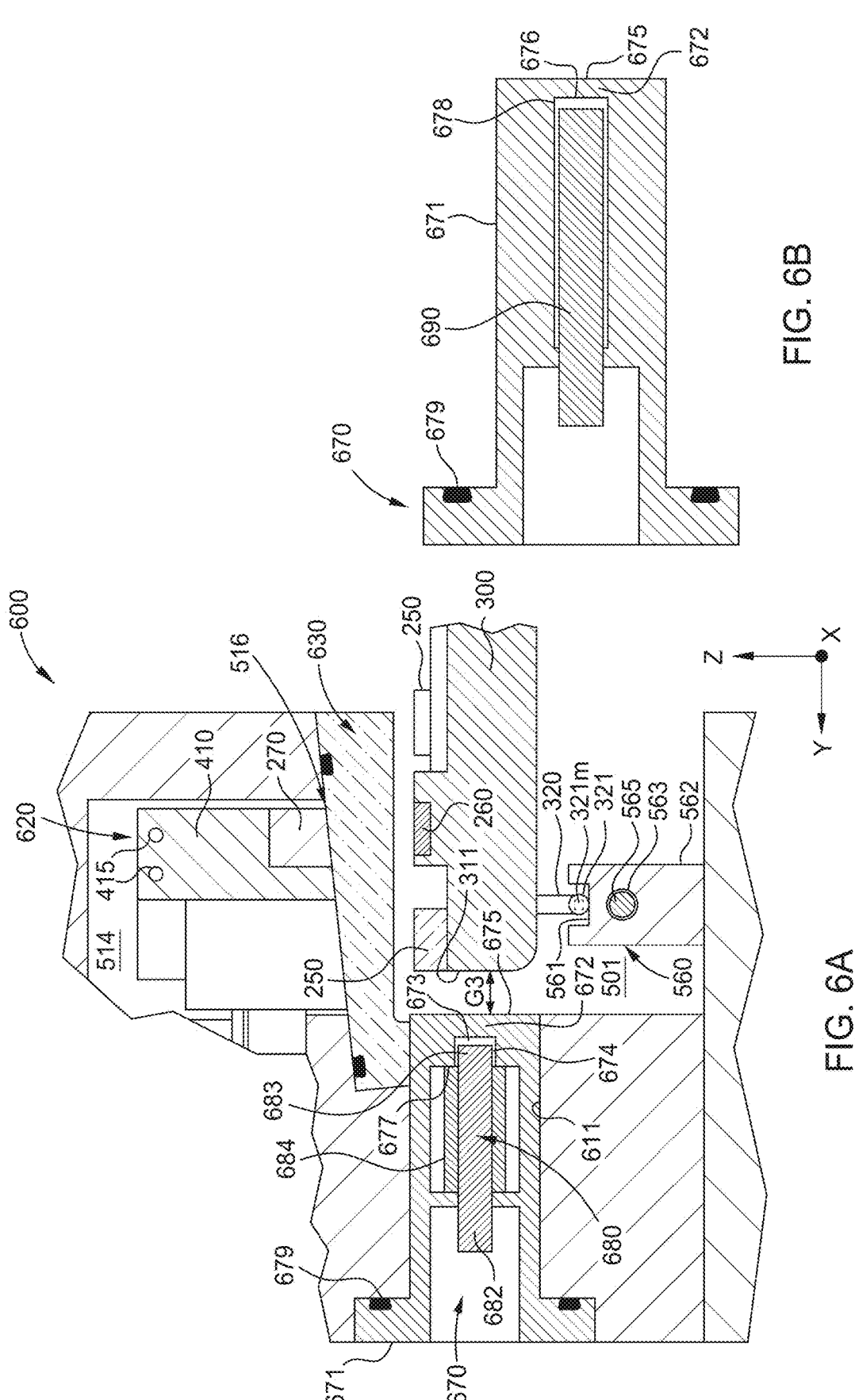
FIG. 6A illustrates a partial cross-sectional view of an exemplary process station, in accordance with embodiments of the present disclosure.
FIG. 6B illustrates a schematic cross-sectional view of a side actuator housing of the exemplary process station shown in FIG. 6A, in accordance with embodiments of the present disclosure.

FIG. 6A illustrates a partial cross-sectional view of a process station 600. The process station 600 has similar components as the process station 500 as indicated by the reference signs without reciting the description of these components of the process station 500 for brevity. While not shown, the process station 600 may include a source assembly 570, process kit assembly 580, and support assembly 590.

The process station 600 includes a magnetic levitation assembly that includes magnetic levitation actuator assemblies 620 that does not include a side actuator or side sensors. For example, the magnetic levitation actuator assembly 620 may be the magnetic levitation actuator 400 without side actuator 480 or side sensor 290. The process station 600 instead has a side actuator assembly 670 that is disposed beneath the magnetic levitation actuator assembly 620 beneath membrane 630. The side actuator assembly 670 includes a side assembly housing 671 with a side actuator 680 and one or more side sensors 690 disposed in the housing 671. The side assembly housing 671 may be disposed in a side opening 611 of the housing 510. The side assembly housing 671 may be secured to the housing 510 by one or more fasteners. One or more sealing elements 679 may be disposed between the side assembly housing 671 and housing 510 to seal the transport region 501 from the exterior of the station 600.

The side actuator 680 may be a linear stator, such as a stator similar to stator 430. The side actuator 680 may include one or more stator poles 682 with a wire 684 wound around each stator pole 682. The side actuator 680 is horizontally oriented such that end of each stator pole 682 faces the transport region 501, and thus the side 311 of the carrier 300, through the end wall 672 of the housing 671. The housing 671 may include a recess 673 at an end thereof to receive the tooth 683 (e.g., end) of each stator pole 682 that is closes to the end wall 672 of the housing. Current to the wire 684 generates a magnetic field that extends from the corresponding tooth 683 and into the transport region 501 through the housing 671. The recess 673 may be similar to the side actuator portion 554, in that there may be a plurality of interface surfaces 677 that are engageable with a corresponding wire 684 that separate each recess 673. A clearance 674 may be present between the tooth 683 and the recess 673 such that the tooth 683 does not contact the housing 671. The thickness of the end wall 672 between the end of the recess 673 and the outer surface 675 may be less than 1 mm, such as 0.9 mm, such as 0.8 mm, such as 0.7 mm, such as 0.6 mm, such as 0.5 mm, such as 0.4 mm, such as 0.3 mm, such as 0.2 mm, such as 0.1 mm, such as 0.09 mm, such as 0.08 mm, such as 0.07 mm, such as 0.06 mm, such as 0.05 mm, such as 0.04 mm, such as 0.03 mm, such as 0.02 mm, such as 0.01 mm. In some embodiments, each tooth 683 of the side actuator 680 may be disposed in a separate recess 673.

FIG. 6B is a partial cross-sectional view of the side actuator assembly 670 showing the side sensor 690 within the housing 671. The side sensor 690 may be a magnetic field detection sensor similar to side sensor 290 discussed above. The side sensor 690 generates a magnetic field that extends through the housing 671 into the transport region 501. The magnetic field detection elements use the magnetic field of the side sensor 690 to determine the distance of a gap G3 between the side 311 of the carrier 300 and the outer surface 675 of the end wall 672 that faces the transport region 501. This distance is used to determine the lateral position of the carrier 300 (e.g., position in the Y-direction). The end of the side sensor 690 closest to the end wall 672 is disposed in a recess 676. This end may include one or more magnetic sensor elements. A clearance 678 is present between the surface of the recess 676 and the end of the side sensor 690. The thickness of the end wall 672 between the end of the recess 676 and the outer surface 675 may be less than 1 mm, such as 0.9 mm, such as 0.8 mm, such as 0.7 mm, such as 0.6 mm, such as 0.5 mm, such as 0.4 mm, such as 0.3 mm, such as 0.2 mm, such as 0.1 mm, such as 0.09 mm, such as 0.08 mm, such as 0.07 mm, such as 0.06 mm, such as 0.05 mm, such as 0.04 mm, such as 0.03 mm, such as 0.02 mm, such as 0.01 mm.

In some embodiments, a side sensor 690 is disposed on each side of the side actuator 680 along the X-direction. In some embodiments, the side sensor 690 is disposed above or below the side actuator 680.

The side actuator assembly 670 may be positioned in a similar location as side actuator 480 in station 500. The controller 150 may use the side actuator 680 to interact with the side 311 of the carrier 300 to change the position of the carrier 300, such as the position of the carrier in the Y-direction as arranged in the process station 600, to center the object 140 above the support member 592. The controller 150 may instruct the side actuator 680 to adjust the position of the carrier 300 to center the substrate 140 above a support assembly based on the measurements from the side sensor 690.

The membrane 630 is similar to membrane 530 except that the fourth recess 552 include the top sensor portion 543 does not include a side actuator portion 554 since the magnetic levitation actuator assembly 620 does not have a side actuator, and nor does the third recesses 546 include side sensor portions 548.

Figure 7A:
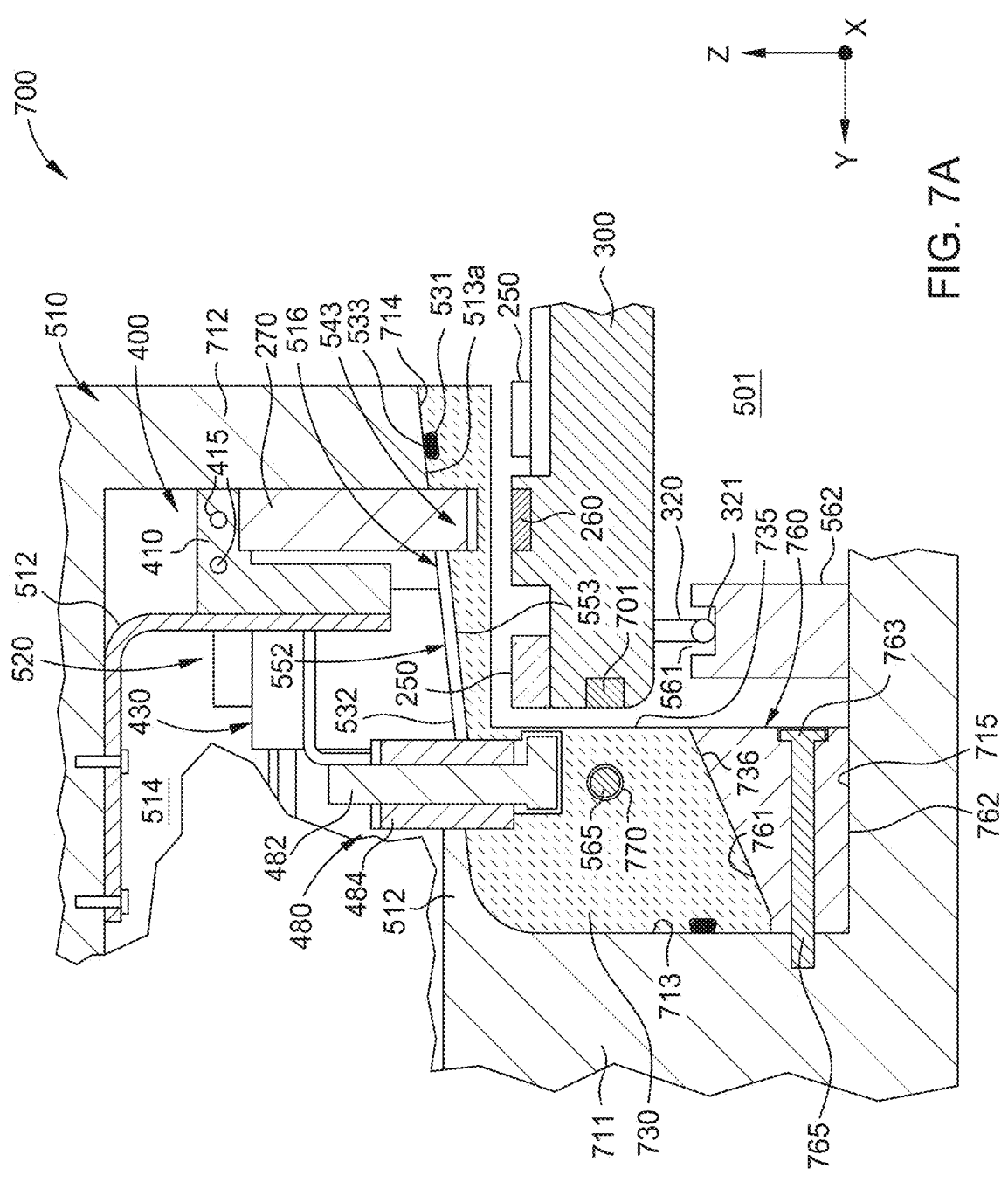
FIG. 7A illustrates a partial cross-sectional view of an exemplary process station, in accordance with embodiments of the present disclosure.

FIG. 7A illustrates a partial cross-sectional view of a process station 700. The process station 700 has similar components as the process station 500 as indicated by the reference labels without reciting the description of these components of the process station 500 for brevity. While not shown, the process station 700 may include a landing rail 561, a source assembly 570, process kit assembly 580, and support assembly 590.

The process station 700 includes a membrane 730 that is similar to the membrane 530 that separates the cavity 514 from the transport region 501 by covering the opening 516 formed in the housing 510. The process station 700 includes a magnetic levitation assembly 520 with at least two magnetic levitation actuator assemblies 400 (one shown) to contactless convey the carrier 300 within the transport region 501. Each magnetic levitation actuator assembly 400 is disposed in a cavity 514 of the process station 700.

Process station 700 also includes a position sensor 565 to sense a position of the carrier 300 in the transport direction (e.g., X-direction). The position sensor 565 is located behind the bottom surface 735 of the membrane 730 and thus is isolated from the transport region 501. The bottom surface 735 is disposed between the transport region 501 and the top sensor 270, stator 430, side sensor 290, side actuator 480, and position sensor 565. In other words, the position sensor 565 and the magnetic levitation actuator assembly 400 are separated from the transport region 501 by the same membrane 730.

The position sensor 565 is placed in an interior opening or recess that runs the length or part of the length of the membrane 730 such that the position sensor 565 is in proximity to a magnet 701 disposed on or embedded in the carrier 300. FIG. 7A shows the position sensor 565 located in an interior opening 770 formed within the membrane 730 that is located beneath the fourth recess 552 that the side actuator 480 is disposed within. A magnet 701 may be located on a lower shoulder surface of the carrier 300 beneath the magnetic levitation element 240. In some embodiments, the magnet 701 is embedded in the side 311 of the carrier 300 as shown in FIG. 7A. The position sensor 565 is able to determine the position of the carrier 300 along the transport direction based on the interaction with the magnet 701 similarly to determining the position of the carrier 300 by detecting the magnet 321*m* coupled to a foot 321.

The membrane 730 includes an upper surface 732. A continuous sealing element 733 is disposed in a groove 731 about a periphery upper surface 732 of the membrane 730. The upper surface 732 of the membrane 730, unlike membrane 530, does not engage against different housing interface surfaces aligned along the same plane. Instead, the upper surface 732 engages against interface surfaces of the housing 510 that are disposed at an angle to each other. As shown in FIG. 7A, the upper surface 732 engages against a vertical first interface surface 713 of the first wall 711 of the housing 510 and a second interface surface 714 of a second wall 712 of the housing 510 to isolate the cavity 514 from the transport region 501. The second interface surface 714 of the second wall 712 may be disposed at an angle that is complimentary of the upper surface 732 of the membrane 730. The first surface 713 and second surface 714 are portions of a housing interface surface surrounding the opening 516 covered by the membrane 730. The continuous sealing element 733 seals against the interface surfaces of the housing 510 extending along different planes, namely the first surface 713 and the second surface 714.

Figure 7B:
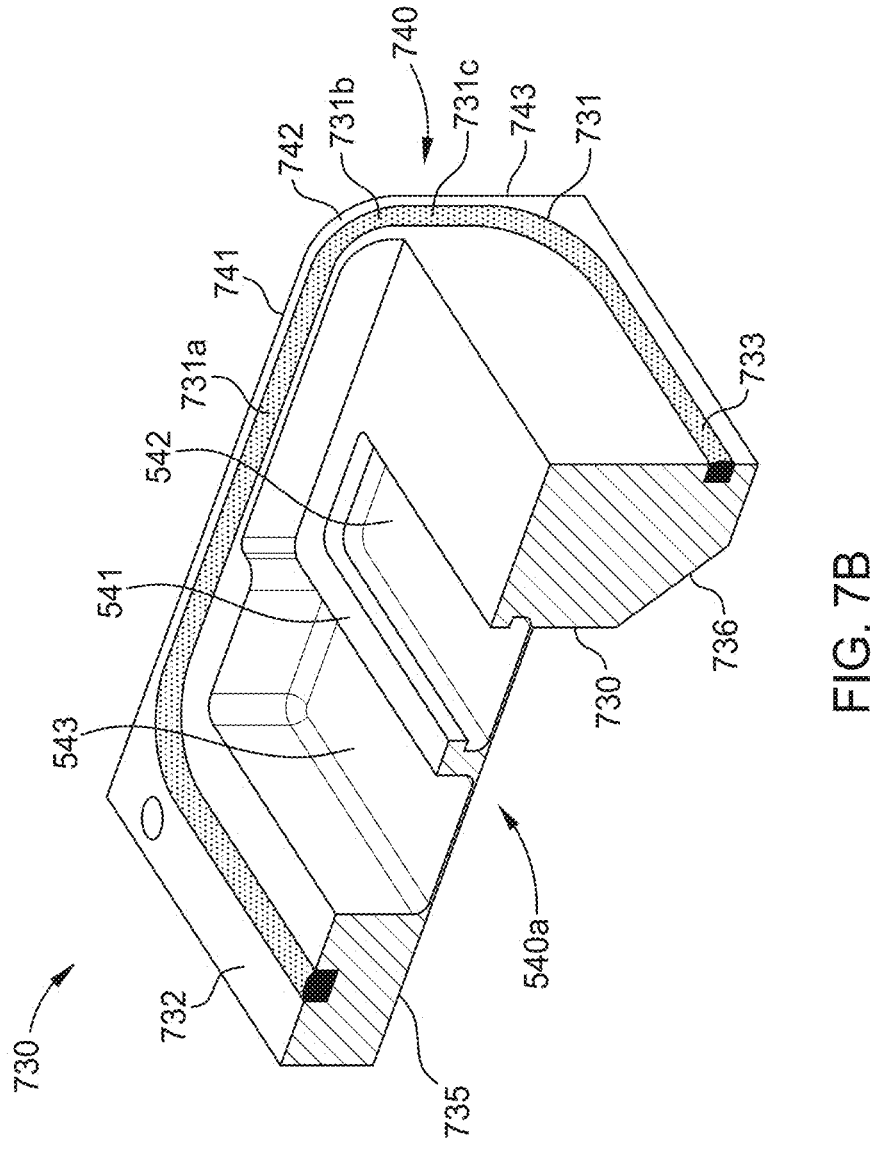
FIG. 7B illustrates a partial perspective view of one end of a membrane of the exemplary process station shown in FIG. 7A, in accordance with embodiments of the present disclosure.

FIG. 7B shows a partial perspective view of one end of the membrane 730 that is representative of the other end of the membrane 730. As shown, the membrane 730 is shaped such that the sealing element 733 can contact the surface of the housing 510 located at different planes as well as a portion of the housing 510 as the sealing element 733 transitions between the different planes. FIG. 7B also shows a portion of a first recess 540*a*. A shown, the first recess portion 540*a* includes an interface surface 541 to support a stator 430, a stator pole portion 542 to receive one or more teeth of the stator 430, and a top sensor portion 543 to receive the top sensor 270.

An end portion 740 of the upper surface 732 has a first edge portion 741, a second edge portion 742, and a third edge portion 743. The inner surface of the housing 510 is shaped to receive the end portion 740. The first edge portion 741 engages against a surface extending along a first plane of the housing 510, such as the second interface surface 714. The first edge portion 741 extends along a first plane away from the second edge portion 742. In some embodiments, the first edge portion 741 is a flat surface that is disposed at an angle. In some embodiments, the first edge portion 741 is a flat surface that extends horizontally (e.g., not at an angle). The third edge portion 743 engages against a surface extending along a second plane of the housing 510, such as the first surface 713. The third edge portion 743 extends downwardly along a second plane away from the second edge portion 742. In some embodiments, the third edge portion 743 is a downwardly extending flat surface that is disposed at an angle. In some embodiments, the third edge portion 743 is a flat vertical surface (e.g., not at an angle) as shown in FIG. 7B. The second edge portion 742 is rounded portion at the transition between the first edge portion 741 and third edge portion 743. The second edge portion 742 is engageable with a corresponding surface of the housing 510, such as a transition surface located between the first surface 713 and the second surface 714.

The groove 731 has a first portion 731*a* disposed on the first edge portion 741, a second portion 731*b* disposed on the second edge portion 742, and a third portion 731*c* disposed on the third edge portion 743. The continuous sealing element 733 is placed in the groove 731 and seals against the inner surfaces of the housing 510.

In some embodiments, one or more wedge member 760 may be used to apply a force to the membrane 730 to maintain the continuous sealing element 733 in tight sealing engagement with the first surface 713. The wedge member 760 may include a tapered upper surface 761 that wedges against a tapered portion 736 of the bottom surface 735 of the membrane 730. The wedge member 760 may also include a bottom surface 762 that abuts against an inner shoulder 715 of the housing 510. Each wedge member 760 may include one or more fastener openings 763 alignable with a fastener opening formed in the first wall 711. A fastener 765 is inserted each aligned fastener opening 763 in the wedge member 760 and fastener opening formed in the first wall 711. The fastener 765 may be a bolt as shown in FIG. 7A that is torqued to a desired level to maintain a desired force against the membrane 730.

The membrane 730 may be attached to the housing 510 by one or more fasteners. The one or more wedge members 760 are then engaged with the membrane 730 after the membrane 730 is attached to the housing 510.

In some embodiments, the wedge member 760 is a single wedge member that extends along the length, or a portion of the length, to engage a similarly sized tapered portion 736 of the membrane 730.

The membrane 730, the one or more wedge members 760, the position sensor 565, and magnetic levitation actuator assembly 400 may be part of a magnetic levitation kit assembly.

Figures 8, 9:
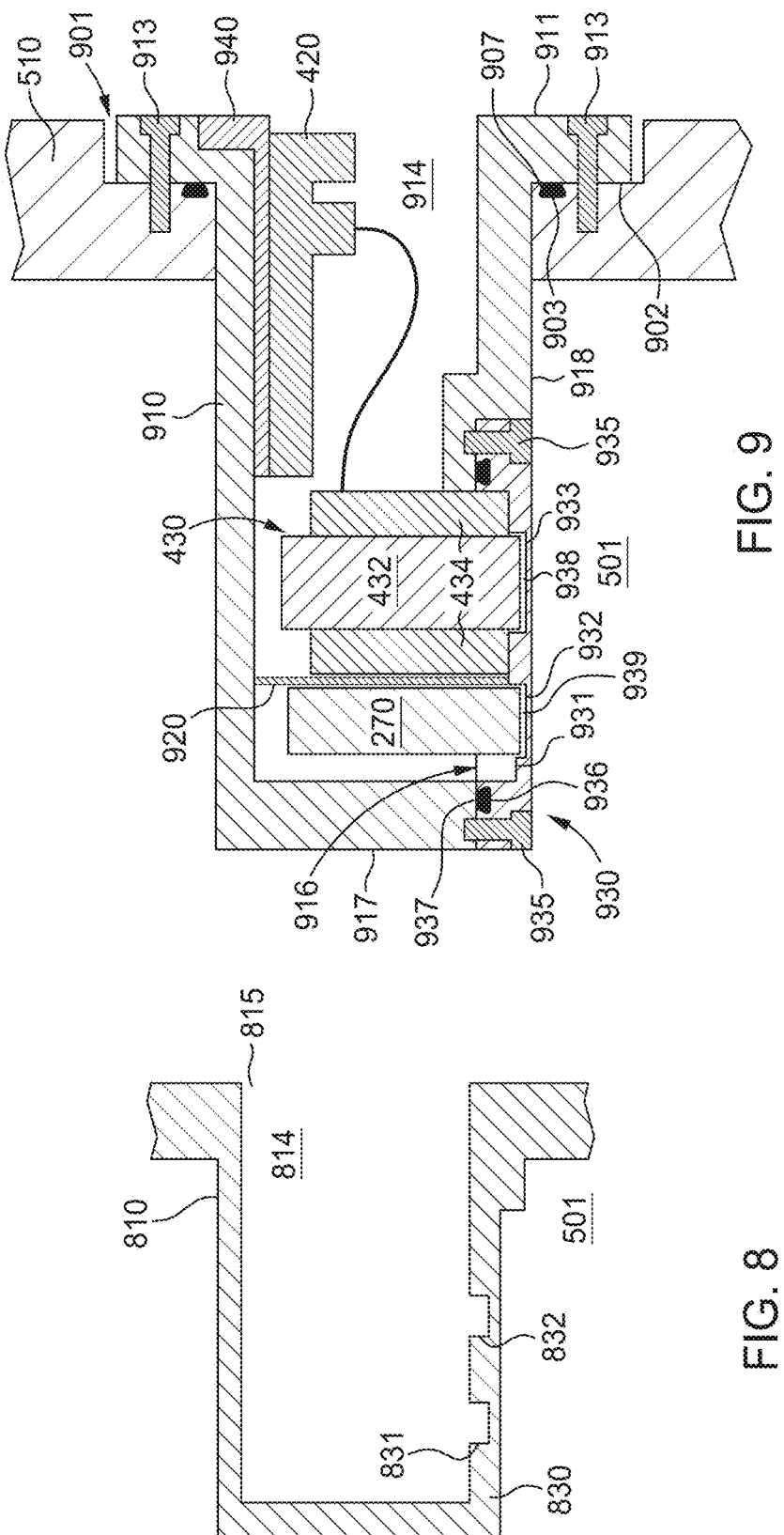
FIG. 8 illustrates a partial cross-sectional view of an exemplary process station, in accordance with embodiments of the present disclosure.
FIG. 9 illustrates a partial cross-sectional view of an exemplary process station, in accordance with embodiments of the present disclosure.

FIG. 8 illustrates a partial cross-sectional view of a process station to show a cavity 814 that a magnetic levitation actuator assembly, such as magnetic levitation actuator assembly 400, may be disposed in. The magnetic levitation actuator assembly may be installed in the cavity 814 through the open end 815. FIG. 8 shows that the cavity 814 is formed from a single machined block 810 that extends into the transport region 501 to position the magnetic levitation actuator assembly within the process station such that a carrier 300 can be contactlessly conveyed in the transportation direction. The single machined block 810 may be formed integral with the housing of the process station, such as housing 510 of the process station 500. In some embodiments, the single machined block 810 shown in FIG. 8 may be a component that is attachable to the side of process station, such as being inserted through an opening in a housing of the process station, such as the single machined block 910 shown in FIG. 9. The single machined block 810 may be formed from the same materials of the membrane 530.

The single machined block 810 has a lower wall 830. This lower wall 830 can act as the membrane. In other words, the membrane is integral with the machined block 810. The lower wall 830 may include one or more recesses for the components of the magnetic levitation actuator assembly, such as a top sensor 270, stator 430, side sensor 290, and/or side actuator 480. For example, the lower wall 830 is shown with a first recess 831 configured to receive the top sensor

270 and a second recess 832 for the poles 432 of the stators 430. In some embodiments, the lower wall 830 does not have recesses but instead has a thickness that allows the components of the magnetic levitation actuator assembly to magnetically interact with the carrier 130 or carrier 300 without rupturing due to a pressure differential formed across the lower wall 830.

FIG. 9 illustrates a partial cross-section of a process station to show a cavity 914 that a magnetic levitation actuator assembly, such as magnetic levitation actuator assembly 400, may be disposed in. The cavity 914 is formed by a single machined block 910 with a membrane 930 attached thereto. As shown, the single machined block 910 is inserted into a side opening 901 in the housing 510. The single machined block 910 may include a flange 911 configured to engage with a shoulder 902 of the housing 510. One or more fasteners 913 be used to attach the flange 911 to the shoulder 902. A sealing element 907 may be placed in a groove 903 formed in the shoulder 902 to isolate the transport region 501 from the exterior of the housing 510. In some embodiments, the groove 903 may be formed in the flange 911 and seals against the shoulder 902.

The membrane 930 may be a plate that is attached to the single machined block 910 to cover a bottom opening 916 between an end wall 917 and a lower side wall 918 of the single machined block 910. The membrane 930 may include one or more recess for the components of the magnetic levitation actuator assembly, such as a top sensor 270, stator 430, side sensor 290, and/or side actuator 480. For example, the membrane 930 is shown with a first recess 931 configured to receive the top sensor 270 and stators 430. First recess 931 includes a first portion 932 configured to receive the end of the top sensor 270 and a second portion 933 configured to receive the stator 430, such as having a stator interface surface to support the stator 430 and a pole portion configured to accommodate the end of the stator pole 432. FIG. 9 shows the top sensor 270 disposed in the first portion 932 and the stator 430 disposed in the second portion 933. In some embodiments, a clearance 938 is present between the stator pole 432 and the membrane 930 and another clearance 939 is present between the top sensor 270 and the membrane 930. In some embodiments, the membrane 930 does not have recesses but instead has a thickness that allows the components of the magnetic levitation actuator assembly to magnetically interact with the carrier 130 or carrier 300 without rupturing due to a pressure differential formed across the membrane 930.

The membrane 930 may be attached to the single machined block 910 by one or more fasteners 935. A groove 936 is formed around the periphery of the upper surface of the membrane 930. A sealing element 937 is disposed in the groove 936 to prevent communication between the cavity 914 and the transport region 501.

In some embodiments, the single machined block 910 may be sized such that the magnetic levitation actuator assembly may be inserted into the cavity through the open end 901. In some embodiments, the magnetic levitation actuator assembly is installed in the cavity 914 through the bottom opening 916.

FIG. 9 also shows a PCB 420 mounted to the single machined block 910 by a mounting bracket 940. The top sensor 270 and stator 430, and other components of the magnetic levitation actuator assembly 400, may be mounted on a frame member 410 (FIG. 4A). In some embodiments, magnetic levitation actuator assembly 400 does not include a frame member 410. The top sensor 270, stator 430, and other components of the magnetic levitation actuator assembly 400 are positioned within the cavity 914 by one or more brackets or by an engagement with an interface surface of the membrane 930.

FIG. 9 also illustrates a shield element 920, which is similar to the shield element 220, disposed between the linear stator 430 and the top sensor 270. The shield element 920 protects the top sensor from stray fields generated by the linear stators 430. The shield element 920 may be a plate. The shield element 920 may extend a portion of the length of the linear stator 430. As shown, the shield element 920 extends from the top surface of the single machined block 910 to the upper surface of the membrane 930.

Figures 10, 11:
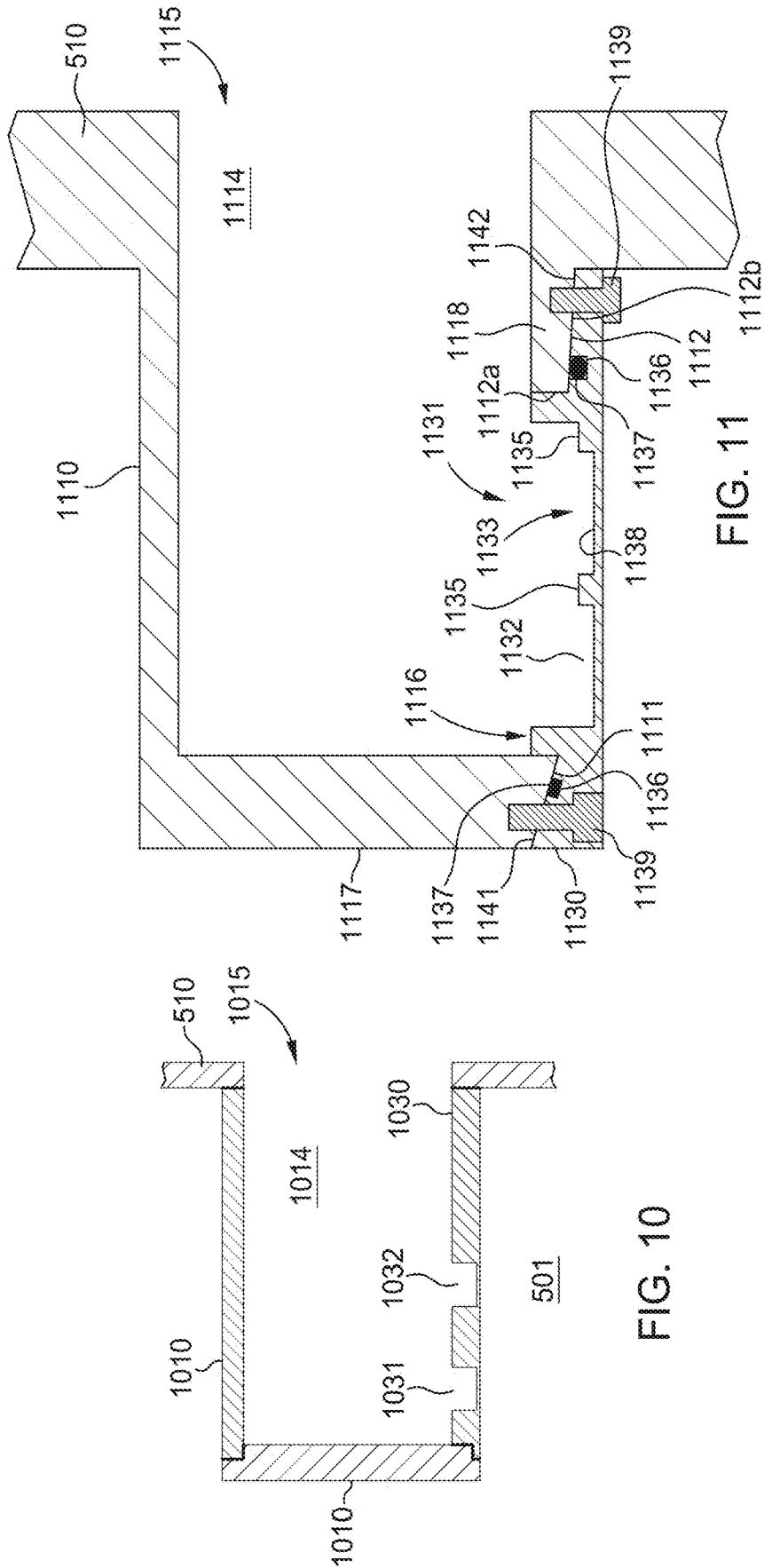
FIG. 10 illustrates a partial cross-sectional view of an exemplary process station, in accordance with embodiments of the present disclosure.
FIG. 11 illustrates a partial cross-sectional view of an exemplary process station, in accordance with embodiments of the present disclosure.

FIG. 10 illustrates a partial cross-section of a process station to show a cavity 1014 that a magnetic levitation actuator assembly, such as magnetic levitation actuator assembly 400, may be disposed in. The magnetic levitation actuator assembly may be installed in the cavity 1014 through the open end 1015. FIG. 10 shows a plurality of rigid members 1010, such as plates, and a membrane 1030 that are welded together and welded to the housing 510 to form the cavity 1014. Forming the cavity 1014 from a plurality of members 1010 and membrane 1030 welded to the housing 510 eliminates the need for one or more sealing elements to isolate the cavity 1014 from the transport region 501. The membrane 1030 is a lower pate that includes one or more recess for the components of the magnetic levitation actuator assembly, such as a top sensor 270, stator 430, side sensor 290, and/or side actuator 480. For example, the membrane 1030 may include a first recess 1031 configured to receive a top sensor 270 and a second recess 1032 adjacent to the first recess 1031 configured to receive the stator 430.

FIG. 11 illustrates a partial cross-section of a process station to show a cavity 1114 that a magnetic levitation actuator assembly, such as magnetic levitation actuator assembly 400, may be disposed in. The cavity 1114 is formed by a machined block 1110 with a membrane 1130 attached thereto. The magnetic levitation actuator assembly by be installed through the open end 1115 of the machined block 1110.

The membrane 1130 is a plate that is attached to the machined block 1110 to cover a bottom opening 1116 between an end wall 1117 and a lower side wall 1118 of the machined block 1110. The membrane 1130 includes one or more recesses for the components of the magnetic levitation actuator assembly to be inserted, such as a top sensor 270, stator 430, side sensor 290, and/or side actuator 480. For example, the membrane 1130 is shown with a first recess 1131 configured to receive the top sensor 270 and stators 430. First recess 1131 includes a first portion 1132 configured to receive the end of the top sensor 270 and a second portion 1133 configured to receive the stator 430, such as having a stator interface 1135 surface to support the stator 430 and a pole portion 1138 configured to accommodate the end of the stator pole 432. In some embodiments, a clearance is present between the stator pole 432 and the membrane 1130.

The membrane 1130 is engaged with a first surface 1111 of the end wall 1117 and a second surface 1112 of the lower side wall 1118. The first surface 1111 may be tapered, such as having a taper with an upward trajectory away from the interior of the cavity 1114 as shown in FIG. 11. The second surface 1112 may be a stepped shoulder, with a second surface 1112 having a vertical portion 1112a and a lower portion 1112b. The lower portion 1112b may include a tapered surface that tappers downwardly towards the housing 510 as shown in FIG. 11 from the vertical portion 1112a.

The membrane 1130 may have a first membrane surface 1141 with a shape that compliments that first surface 1111 and a second membrane surface 1142 with a shape that compliments the second surface 1112.

The membrane 1130 may be attached to the machined block 1110 by one or more fasteners 1139. A groove 1136 can be formed around the periphery of the membrane 1130. For example, a portion of the groove 1136 may be formed in both the first membrane surface 1141 and the second membrane surface 1142. A sealing element 1137 is disposed in the groove 1136 to prevent communication between the cavity 1114 and the transport region 501.

In some embodiments, the membrane 1130 may be a ceramic plate. In some embodiments, the membrane 1130 may be made of a material that is diffusion bonded to the machined block 1110, such that the groove 1136 and sealing element 1137 may be omitted. In other embodiments, the membrane 1130 may be made of a material that is explosion welded to the machined block 1110, such as being made of a non-magnetic stainless steel. Explosion welding the membrane 1130 to the machined block 1110 eliminates the need for the groove 1136 and sealing element 1137.

FIG. 12 illustrates a partial cross-section of a process station to show a cavity 1214 that a magnetic levitation actuator assembly, such as magnetic levitation actuator assembly 400, may be disposed in. The cavity 1214 is formed by a machined block 1210 with a first membrane 1230a and a second membrane 1230b attached thereto. The magnetic levitation actuator assembly by be installed through the open end 1215 of the machined block 1210. As shown, the machined block 1210 is formed integrally with the housing 510.

The machined block 1210 includes an end wall 1217 and a lower side wall 1218. A middle wall 1219 is disposed between the end wall 1217 and the lower side wall 1218. The middle wall 1219 may run the length of the machined block 1210, and an opening is present on both sides of the middle wall 1219 separating the middle wall 1219 from the end wall 1217 and the lower side wall 1218. The first membrane 1230a covers the opening between the end wall 1217 and the middle wall 1219. The second membrane 1230b covers the opening between the middle wall 1219 and the lower side wall 1218. Each membrane 1230a,b may be a thin metallic plate, such as a non-magnetic stainless steel plate, that is brazed or laser welded to the machined block 1210. Brazing or laser welding the membranes 1230a,b to the machined block eliminates the need for a sealing element. In some embodiments, each membrane 1230a,b is attached to the machined block 1210 by a plurality of fasteners, such as bolts, with one or more sealing elements disposed between each membrane 1230a,b and the machined block 1210.

The openings on either side of the middle wall 1219 may accommodate one or more components of a magnetic levitation actuator assembly, such as a top sensor 270, stator 430, side sensor 290, and/or side actuator 480. For example, a first recess 1231 configured to accommodate the top sensor 270 is defined by a portion of the end wall 1217, the first membrane 1230a, and the middle wall 1219. A second recess 1232 configured to accommodate the stator 430 is defined by a portion of the middle wall 1219, second membrane 1230b, and lower side wall 1218. The upper surfaces of the middle wall 1219 and lower side wall 1218 may serve as a stator interface surface to support the stator 430. The stator pole 432 may be disposed between opposing side walls of the middle wall 1219 and lower side wall 1218 and above the second membrane 1230b. A clearance 1240 may also be present between the end of the top sensor 270 and the first membrane 1230a. A clearance 1241 may be present between the second membrane 1230b and the end of the stator pole 432.

FIG. 12 also illustrates a shield element 1220, which is similar to the shield element 220, disposed between the linear stator 430 and the top sensor 270. The shield element 1220 protects the top sensor 270 from stray fields generated by the linear stator 430. The shield element 1220 may be a plate. The shield element 1220 may extend a portion of the length of the linear stator 430. As shown, the shield element 1220 extends from the top surface of the machined block 1210 to the upper surface of the first membrane 1230a. Thus, the shield element 1220 is shown extending into the first recess 1231.

FIG. 13 illustrates a partial cross-section of a process station that includes a cavity 1314 that a magnetic levitation actuator assembly, such as magnetic levitation actuator assembly 400, may be disposed in. The cavity 1314 is formed by a walls of the housing 510 with a membrane 1330 attached thereto. The membrane 1330 may be a plate that is attached to the wall of the housing 510 to cover a bottom opening 1316 between an end wall 1317 and a lower side wall 1318 of the housing 510. The membrane 1330 includes one or more recess for the components of the magnetic levitation actuator assembly, such as a top sensor 270, stator 430, side sensor 290, and/or side actuator 480. For example, the membrane 1330 is shown with a first recess 1331 configured to receive the top sensor 270. The membrane 1330 includes a second recess 1332 configured to receive the stator 430, such as having a stator interface surface to support the stator 430 and a pole portion configured to accommodate the end of the stator pole 432. In some embodiments, a clearance 1351 is present between the tooth of the stator pole 432 and the membrane 1330 and another clearance 1352 is present between the top sensor 270 and the membrane 1330. In some embodiments, the membrane 1330 does not have recesses but instead has a thickness that allows the components of the magnetic levitation actuator assembly to interact with the carrier 130 or carrier 300 without rupturing.

The membrane 1330 includes a first shoulder 1341 and a second shoulder 1342. The first shoulder 1341 is engaged with a first shoulder 1311 of the end wall 1317 and the second shoulder 1342 is engaged with a second shoulder 1312 of the lower side wall 1318. In some embodiments, the membrane 1330 is attached to the end wall 1317 and lower side wall 1318 by one or more fasteners. A groove 1336 is formed around the periphery of the membrane 1330. A sealing element 1337 is disposed in the groove 1336 to prevent fluid communication between the cavity 1314 and the transport region 501. The sealing element 1337 is in sealing engagement with the first shoulder 1311 and the second shoulder 1312.

In some embodiments, the cavity 1314 may be sized such that the magnetic levitation actuator assembly may be inserted into the cavity through the open end 1315. In some embodiments, the magnetic levitation actuator assembly is installed in the cavity 1314 through the bottom opening 1316.

Figures 14A, 14B:
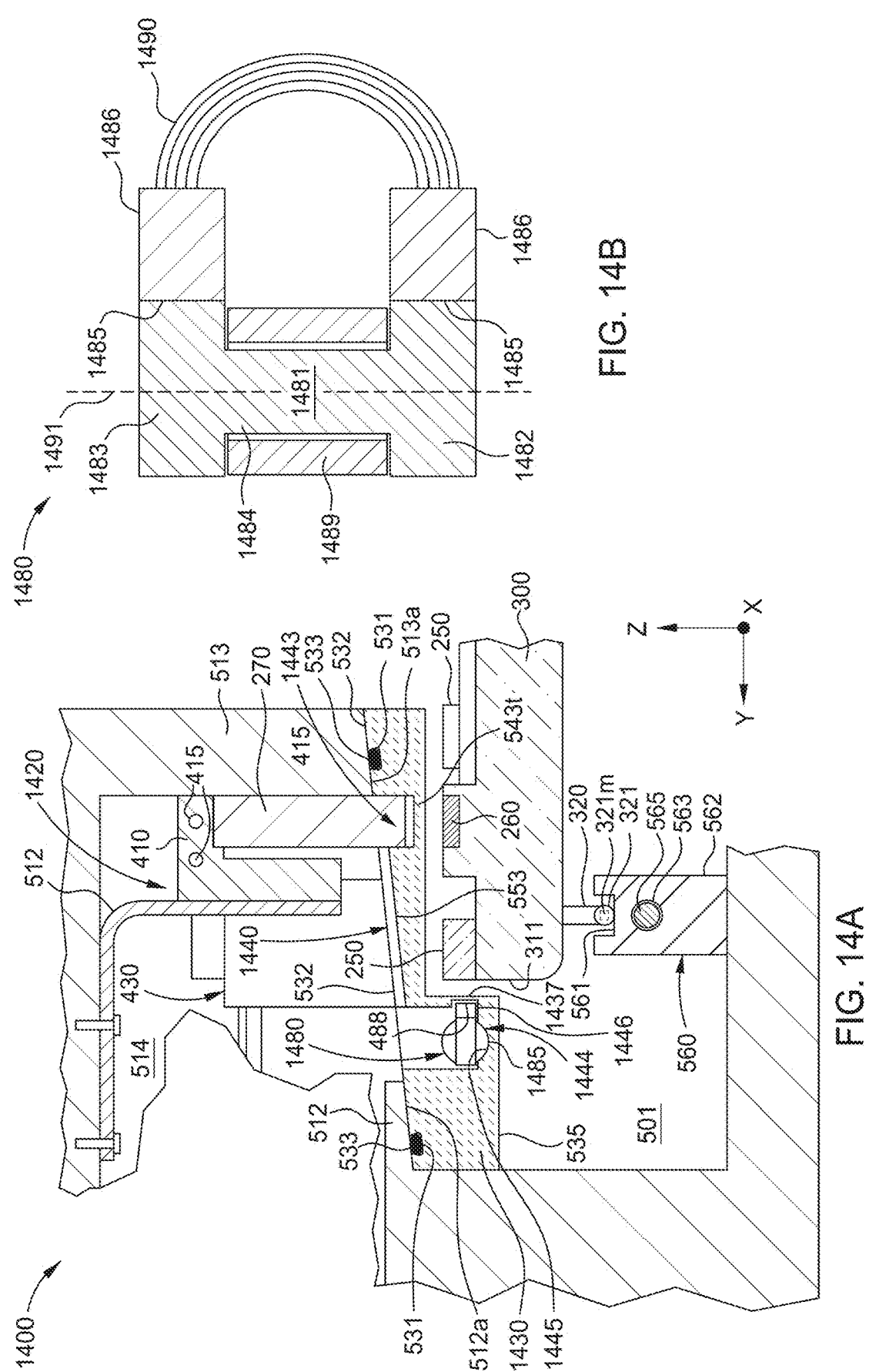
FIG. 14A illustrates a partial cross-sectional view of an exemplary process station, in accordance with embodiments of the present disclosure.
FIG. 14B illustrates a cross-sectional view of a side actuator of the exemplary process station shown in FIG. 14A, in accordance with embodiments of the present disclosure.

FIG. 14A illustrates a partial cross-sectional view of a process station 1400. The process station 1400 has similar components as the process station 500 as indicated by the reference signs without reciting the description of these components of the process station 500 for brevity. While not shown, the process station 1400 may include, a source assembly 570, process kit assembly 580, and support assembly 590.

The process station 1400 has two or more magnetic levitation actuator assemblies 1420 positioned within a corresponding cavity to contactlessly move the carrier within the transport region 501. The magnetic levitation actuator assembly 1420 is similar to magnetic levitation actuator assembly 400 shown in FIG. 4A, except that the side actuator 480 is replaced with side actuator 1480. FIG. 14A shows the magnetic levitation actuator assembly 1420 disposed in a cavity 514 on the left side of the process station 1400. The magnetic levitation actuator assembly 1420 on the right-hand side of the process station 1400 (not shown) may not include side actuator 1480. In other words, one magnetic levitation actuator assembly 1420 of a pair of magnetic levitation actuator assemblies 1420 located across from one another within the process station 1400 may have a side actuator 1480.

A side view of the side actuator 1480 is shown in FIG. 14A. A top cross-sectional view of the side actuator 1480 is shown in FIG. 14B. The side actuator 1480 includes a single stator pole 1481. The single stator pole 1481 includes a first end portion 1482, a second end portion 1483, and a middle portion 1484 extending between the first end portion 1482 and the second end portion 1483. A wire 1489 is horizontally wound around the middle portion 1484. The first end portion 1482 and second end portion 1483 each have a head interface surface 1485. A head 1486 is attached to the first end portion 1482 and the second end portion 1483 at the corresponding head interface surface 1485. As shown, head 1486 is positioned below the end (e.g., tooth) of the stator poles 482 of the linear stator 430. The heads 1486 may be bonded to the corresponding head interface surface 1485. In some embodiments, and as shown in FIG. 14B, the heads 1486 extend past the outer edge of the wire 1489 wound around the middle portion 1484. The single stator pole 1481 and each head 1486 may be made from electrical steel, such as silicon steel, such being fabricated from sheets of electrical steel. The side actuator 1480 may also be coated in a lacquer to prevent relative motion between the wire 1489 and the single stator pole 1481.

As shown in FIG. 14A, the side actuator 1480 is located across from a top sensor 270. The side actuator 1480 and top sensor 270 are shown disposed in a recess 1440 of membrane 1430 separating the cavity 514 from the transport region 501. The membrane 1430 is similar to membrane 530 and is shaped to receive the side actuator 1480. The recess 1440 is similar to the fourth recess 552, in that the recess 1440 includes a top sensor portion 1443 and a side actuator portion 1444. The top sensor portion 1443 may be the same as top sensor portion 543 of fourth recess 552.

The side actuator portion 1444 includes one or more side actuator interface surfaces 1445 and at least one head recess 1446. The side actuator interface surfaces 1445 are shaped to receive the side actuator 1480. The wire 1489 may be engaged with the one or more side actuator interface surfaces. The side actuator 1480 is orientated in the side actuator portion 1444 such that the heads 1486 face the transport region 501 to interact with side 311 of the carrier 300. Each head 1486 may disposed in the same head recess 1446 or each head 1486 may be disposed in a separate head recess 1446.

An end wall 1437 of the membrane 1430 separates the head recess 1446 from the transport region 501. The end wall 1437 has a thickness, shown in the X-direction, selected such that the end of the head 1486 is positioned close to the side 311 of the carrier 300 while also being thick enough such that the end wall 1437 does not rupture or bow due to the pressure differential between the transport region 501 and the cavity 514. In some embodiments where the membrane 1430 is made from a non-ferromagnetic material, the thickness of the end wall 1437 is also selected to prevent rupturing or bowing due to the magnetic field emanating from the head 1486. For example, the end wall 1437 of the membrane 1430 may have a thickness of less than 1 mm, such as 0.9 mm, such as 0.8 mm, such as 0.7 mm, such as 0.6 mm, such as 0.5 mm, such as 0.4 mm, such as 0.3 mm, such as 0.2 mm, such as 0.1 mm, such as 0.09 mm, such as 0.08 mm, such as 0.07 mm, such as 0.06 mm, such as 0.05 mm, such as 0.04 mm, such as 0.03 mm, such as 0.02 mm, such as 0.01 mm.

An electric current is supplied to the wire 1489 to generate an electromagnetic field. The two heads 1486 direct the magnetic field towards the side 311 of the carrier 300 through the end wall 1437 of the membrane 1430. In other words, the heads 1486 direct a portion 1490 of the magnetic field away from the single stator pole 1481. FIG. 14B shows the portion of the magnetic field, shown as portion 1490, generated by the side actuator 1480 that is emanating from the heads 1486 in a direction away from a longitudinal axis 1491 of the single stator pole 1481. In some embodiments, the side actuator 1480 may be orientated at an angle within the side actuator portion 1444, such as between 0 and 90 degrees, to direct the magnetic field at a desired angle or desired portion of the carrier 300. For example, the side actuator 1480 may be orientated at 0 degrees as shown in FIG. 14A such that the end face of the heads 1486 are parallel to the side 311 of the carrier 300. Thus, the end face of the heads 1486 may face the side 311 of the carrier 300 while the ends of the stators poles 432 of the linear stator 430 faces the top side, such as the feature 250, of the carrier 300.

The side actuator 1480 is used to change the lateral position of the carrier, such as moving the carrier in the Y-direction. The side actuator 1480 may be actuated based on information received from one or more LCF sensors, such as LCF sensors 271, disposed in the process station 1400 to change the lateral position of the carrier 300 to center the object 140 that is disposed on the carrier 300 above a substrate support disposed in the process station 1400.

In some embodiments, a process station may include a single membrane disposed between the carrier, such as carrier 130 and 300, and multiple magnetic levitation actuator assemblies, such as magnetic levitation actuator assemblies 120A, 400, 620.

In some embodiments, the magnetic levitation actuator assembly may be supported entirely by the membrane. In some embodiments, the magnetic levitation actuator assembly may be attached to the membrane. In some embodiments, the magnetic levitation actuator assembly is disposed on a membrane when the membrane is attached to the housing of the process station.

In some embodiments, any of the aforementioned membranes (e.g., the membranes 206, 530, 630, 730, 830, 930, 1030, 1130, 1230a, 1230b, 1330, and 1430) may be formed from a transparent material and one or more sensors (e.g., sensors 270, 290, 565, and sensors of the equipment assembly 210) may be optical sensors (e.g., camera, laser sensor) that detect the carrier, such as carrier 130, 300, through the transparent membrane. For example, the membrane may be formed from a glass material. For example, the membrane may be formed from a quartz, such as transparent quartz.

As one example, the membrane 530 of processing station 500 may be formed from a transparent material, and the sensors 270 may be optical sensors configured to determine the size of the gap G1 shown in FIG. 5C. For example, the optical sensor 270 may use the featureless element 260 to measure the size of the gap G1. Similarly, the side sensor 290 may be an optical sensor configured to detect the size of the gap G2 shown in FIG. 5E.

As another example, the membrane 730 of station 700 may be transparent. The station 700 may include a plurality of position sensors 565, each being an optical sensor, to determine the position of the carrier 300 along the Y-direction within the transport region 501.

As another example, the membrane 206 may be made of a transparent material and the one or more sensors of the equipment assembly 210 may be disposed in the first region 207 and sense the carrier 130 or object 140 through the transparent membrane 206.

In some embodiments, the carrier, such as carrier 130 or 300, may experience electrostatic buildup. The electrostatic buildup may be discharged by engaging the carrier with a grounded element within the station. In some embodiments, the landing rails 561 may be the grounded and the carrier may be lowered to contact the landing rails 561 to discharge the electrostatic buildup. In some embodiments, any of the aforementioned membranes (e.g., the membranes 206, 530, 630, 730, 830, 930, 1030, 1130, 1230a, 1230b, 1330, and 1430) may be grounded and the carrier may be engaged with the membrane to discharge the electrostatic buildup.

In one embodiment, a magnetic levitation assembly for a processing station comprises a membrane, a plurality of stators, and a plurality of sensors. The membrane includes a body comprising a non-ferromagnetic material, wherein the body has a first surface and a second surface. The membrane further includes an array of first recesses formed in the first surface, each first recess comprises a pole portion. The membrane further includes an array of second recesses formed in the first surface, wherein the array of second recesses is positioned adjacent to the array of first recesses. The plurality of stators comprising one or more stator poles, wherein the one or more stator poles of each stator of the plurality of stators are disposed within a corresponding pole portion of the first recesses. The plurality of sensors are at least partially disposed in the second recesses.

In one or more embodiments of the magnetic levitation assembly, the array of linear stators is a linear array, the array of top sensors is a linear array, and the array of top sensors is parallel to the array of linear stators.

In one or more embodiments of the magnetic levitation assembly, the non-ferromagnetic material is a ceramic material.

In one or more embodiments of the magnetic levitation assembly, each first sensor further comprises an interface surface surrounding the pole portion.

In one or more embodiments of the magnetic levitation assembly, one of the first recesses and one of the second recesses are portions of a single recess.

In one or more embodiments of the magnetic levitation assembly, a thickness of a wall of the body between the second surface and a surface of the pole portion is less than or equal to 1 mm thick.

In one or more embodiments of the magnetic levitation assembly, a thickness of the body between the second surface and a surface of each second recess is less than or equal to 1 mm.

In one or more embodiments of the magnetic levitation assembly, a clearance is present between a surface of the pole portion and the one or more stator poles.

In one or more embodiments of the magnetic levitation assembly, the magnetic levitation assembly further includes a side actuator including a stator pole and a head attached to the stator pole. The membrane includes a third recess that comprises a head recess and interface surfaces, wherein the side actuator is engaged with the interface surfaces and the head is disposed in the head recess.

In one or more embodiments of the magnetic levitation assembly, the magnetic levitation assembly further comprises one or more wedge members engageable with a tapered surface formed on the second surface of the membrane.

In one embodiments, a magnetic levitation assembly for a processing station comprises a membrane, a frame member, a first top sensor, and a first stator. The membrane includes a body including a first surface and a second surface. The membrane further includes a first recess formed in the first surface, the first recess including a first top sensor portion and a first interface surface surrounding a first pole portion. The first top sensor being attached to the frame member, the first top sensor being disposed in the first top sensor portion. The first stator includes one or more first stator poles. The first stator being engaged with the first interface surface and the one or more first stator poles are disposed in the first pole portion. A clearance is present between a surface of the first pole portion and the one or more first stator poles.

In one or more embodiments of the magnetic levitation assembly, the magnetic levitation assembly further comprises a second stator including one or more second stator poles, the second stator attached to the frame member. The membrane further comprises a second recess formed in the first surface, the second recess including a second interface surface surrounding a second pole portion. The second stator are engaged with the second interface surface and the one or more second stator poles are disposed in the second pole portion. A clearance is present between a surface of the second pole portion and the one or more second stator poles.

In one or more embodiments of the magnetic levitation assembly, the magnetic levitation assembly further comprises a second top sensor and a first side sensor. The membrane further comprises a second recess formed in the first surface, the second recess including a second top sensor portion and a first side sensor portion, the first side sensor portion being deeper than the second top sensor portion, and wherein the second top sensor is disposed in the second top sensor portion and the first side sensor is disposed in the first side sensor portion.

In one or more embodiments of the magnetic levitation assembly, the magnetic levitation assembly further comprises a second top sensor and a side actuator including a stator pole and a head attached to the stator pole. The membrane including a second recess formed in the first surface. The second recess includes a second top sensor portion, a plurality of side actuator interface surfaces, and a head recess. The side actuator is engaged with the plurality of side actuator interface surfaces and the head is disposable in the head recess.

In one or more embodiments of the magnetic levitation assembly, a thickness of the membrane between a surface of the head recess and the second surface is less than or equal to 1 mm.

In one embodiment, a magnetic levitation assembly comprises a member, a linear array of stators, a linear array of top sensors, and one or more printed circuit boards. The member includes a first side and a second side. The linear array of linear stators is coupled to the second side of the member. The linear array of top sensors is coupled to the first side of the member, wherein the top sensors comprises magnetic field detection sensors. At least one top sensor in the linear array of top sensors is disposed between adjacent linear stators in the linear array of linear stators. The one or more printed circuit boards are coupled to the second side of the member in communication with the linear stators and the top sensors.

In one or more embodiments of the magnetic levitation assembly, the member includes a cooling channel that provides a path for a cooling fluid to circulate through the member.

In one or more embodiments of the magnetic levitation assembly, the magnetic levitation assembly further comprises one or more shield elements disposed between the linear array of linear stators and the linear array of top sensors.

In one or more embodiments of the magnetic levitation assembly, each linear stator includes a middle stator pole disposed between adjacent outer stator poles, wherein the middle stator pole has a thickness that exceeds the thickness of each outer stator pole.

In one or more embodiments of the magnetic levitation assembly, the magnetic levitation assembly further comprises a side actuator coupled to the second side of the member and disposed between two adjacent linear stators of the linear array of linear stators, wherein the side actuator comprise a stator pole and a first head and a second head protruding from the stator pole.

In one or more embodiments of the magnetic levitation assembly, the magnetic levitation assembly further comprises a first side sensor and a second side sensor coupled to the second side of the member, and the side actuator being disposed between the first side sensor and the second side sensor.

In one embodiment, a magnetic levitation actuator assembly comprises a first linear stator and a side actuator. The first linear stator includes a plurality of first stator poles and a plurality of first wires, wherein each first wire is wrapped around one first stator pole of the plurality of first stator poles. Each first stator pole includes a first longitudinal axis. A current through each first wire generates a first magnetic field that extends in a first direction. The side actuator comprises a second stator pole, a second wire, and a first head. The second stator pole includes a first end and a second end, wherein the second stator pole includes a second longitudinal axis. The second wire is wound around the second stator pole. The first head is configured to direct a second magnetic field generated by a current through the second wire in a second direction. The first head is attached to the second end of the second stator pole, and wherein a third longitudinal axis of the first head is disposed at an angle relative to the second longitudinal axis.

In one or more embodiments of the magnetic levitation actuator assembly, the magnetic levitation actuator assembly further comprises a second linear stator, wherein the side actuator is disposed between the first linear stator and the second linear stator.

In one or more embodiments of the magnetic levitation actuator assembly, the first head is disposed below an end of each first stator.

In one or more embodiments of the magnetic levitation actuator assembly, the first head and the second stator pole are arranged in an "L" shape.

In one or more embodiments of the magnetic levitation actuator assembly, the angle is 90 degrees.

In one or more embodiments of the magnetic levitation actuator assembly, the side actuator further comprises a third stator pole, a third wire, and a second head. The third stator pole includes a first end and a second end, wherein the third stator pole includes a fourth longitudinal axis. The third wire is wound around the third stator pole. The second head is configured to direct a third magnetic field generated by a current through the third wire in the second direction. The second head is attached to the second end of the third stator pole. A fifth longitudinal axis of the second head is disposed at an angle relative to the fourth longitudinal axis of the third stator pole.

In one embodiment, a magnetic levitation actuator assembly comprises a plurality of first linear stators and a side actuator. The plurality of first linear stators are configured to convey a carrier in a first direction. The side actuator is coupled to the plurality of first linear stators, the side actuator configured to convey the carrier in a second direction. The side actuator comprises a first stator pole including a first end portion, a second end portion, and a middle portion extending between the first end portion and the second end portion, the first end portion including a first head interface surface and the second end portion including a second head interface surface, wherein the first stator pole includes a longitudinal axis extending through the first end portion and the second end portion. The side actuator further comprises a wire wound around the middle portion, a first head attached to the first head interface surface, and a second head attached to the second head interface surface. A portion of the magnetic field generated by a current through the wire is directed in the second direction by the first head and the second head.

In one or more embodiments of the magnetic levitation actuator assembly, the first stator pole, the first head, and the second head are each formed from electrical steel.

In one or more embodiments of the magnetic levitation actuator assembly, the plurality of first linear stators and the side actuator are coupled to a frame member.

In one or more embodiments of the magnetic levitation actuator assembly, the first head and second head extend past the wire wound around the middle portion.

In one embodiment, a method of operating a process station comprises conveying a carrier in a transportation direction to a first position in a transport region of a process station using a plurality of linear stators separated from the transport region by a membrane. The method further comprises determining a location of a center of an object disposed on the carrier using one or more location center finder sensors. The method further comprises determining a lateral position of the carrier using one or more side position sensors. The method further comprises adjusting the lateral position of the carrier in the transport region to align the center of the object with a center of a substrate support of the process station using a side actuator of the process station.

In one or more embodiments of the method of operating the process station, the method further comprises conveying the carrier in the transportation direction from the first position to a second position with the plurality of linear stators to place the center of the object above the center of the substrate support after adjusting the lateral position of the carrier.

In one or more embodiments of the method of operating the process station, the adjusting of the lateral position to align the center of the object with the center of the substrate support includes placing the center of the object above the center of the substrate support.

In one or more embodiments of the method of operating the process station, the side actuator and the one or more position sensors are disposed in a housing located underneath the membrane, wherein the side actuator is separated from the transport region by the housing.

In one or more embodiments of the method of operating the process station, the side actuator is a linear stator including a plurality of stator poles, a separate wire is wound around each of the plurality of stator poles, and wherein the side actuator is horizontally oriented in the housing such that an end of each stator pole faces the transport region to interact with a side carrier through the housing.

In one or more embodiments of the method of operating the process station, the side actuator and one or more side sensors are separated from the transport region by the membrane.

In one or more embodiments of the method of operating the process station, the side actuator comprises a plurality of stator poles, a plurality of wires, and a plurality of heads. The plurality of stator poles include a first end and a second end, wherein each stator pole includes a longitudinal axis. Each wire is wound around a corresponding stator pole. Each head is attached to the second end of each stator pole such that a longitudinal axis of the head is disposed at an angle relative to the longitudinal axis of the stator pole, wherein each head is configured to direct a magnetic field generated by a current through the corresponding wire through the membrane toward the carrier to change the lateral position of the carrier.

In one or more embodiments of the method of operating the process station, the side actuator comprises a stator pole, a wire, a first head, and a second head. The stator pole includes a first end portion, a second end portion, and a middle portion extending between the first end portion and the second end portion, the first end portion including a first head interface surface and the second end portion including a second head interface surface, and wherein the stator pole includes a longitudinal axis extending through the first end portion and the second end portion. The wire being wound around the middle portion. The first head being attached to the first head interface surface. The second head being attached to the second head interface surface. A magnetic field generated by a current through the wire is directed toward the side of the carrier through the membrane to change the lateral position of the carrier.

In one or more embodiments of the method of operating the process station, the object is a substrate.

In one or more embodiments of the method of operating the process station, the side actuator is positioned across from the center of the substrate support.

In one embodiment, a process station comprises a housing, a first membrane, a first cavity, and a magnetic levitation actuator assembly. The housing comprises a first wall that comprises a first opening, wherein the first wall at least partially defines a transport region. The first membrane covers the first opening, wherein the membrane comprises a first surface and a second surface, wherein the second surface at least partially defines the transport region. The first cavity being formed in the housing and isolated from the transport region by the first membrane, wherein the first cavity is at least partially defined by a portion of the first wall and the first surface of the first membrane. The magnetic levitation actuator assembly is disposed in the first cavity and over the first surface of the first membrane, wherein the magnetic levitation actuator is configured to generate a first magnetic field that extends through the first membrane and within the transport region.

In one or more embodiments of the process station, the first membrane includes a recess including an interface surface and a pole portion. The first magnetic levitation actuator assembly comprises a stator pole and a wire vertically wound around the stator pole, the wire is engaged with the interface surface and a first end of the stator pole is disposed in the pole portion, and a clearance is present between a surface of the pole portion and the first end.

In one or more embodiments of the process station, the first membrane is formed from a ceramic material or a non-magnetic metal.

In one or more embodiments of the process station, the first membrane is formed from a non-magnetic metal and is engaged with the first wall by explosion welding.

In one or more embodiments of the process station, the first membrane includes a seal groove around a periphery of the first surface of the first membrane, wherein a seal disposed in the seal groove is engaged with a housing interface surface of the housing around the opening.

In one or more embodiments of the process station, a first portion of the housing interface surface is disposed at an angle relative to a second portion of the housing surface.

In one or more embodiments of the process station, the process station further comprises further one or more wedge members are engaged with a tapered surface of the second surface of the first membrane to secure the engagement of the first membrane with the first housing interface surface.

In one or more embodiments of the process station, the first magnetic levitation actuator assembly includes a plurality of linear stators, wherein each linear stator includes at least one middle stator pole disposed between outer stator poles, wherein the at least one middle stator pole has a thickness that exceeds the thickness of each outer stator pole.

In one or more embodiments of the process station, the first magnetic levitation actuator assembly includes a first linear array of linear stators and second linear array of top sensors coupled to a member, wherein the first linear array of stators is parallel to the second linear array of top sensors, wherein each top sensor is configured to generate a second magnetic field that extends through the first membrane and within the transport.

In one or more embodiments of the process station, the first membrane includes a first row of first recesses and a second row of second recesses, wherein each stator is partially disposed in a corresponding first recess and each top sensor is partially disposed in a corresponding second recess.

In one or more embodiments of the process station, the first magnetic levitation actuator assembly further comprises a side actuator and at least one side sensor. The side actuator is configured to generate a third magnetic field that extends through the first membrane and within the transport region. The at least one side sensor configured to generate a fourth magnetic field that extends through the first membrane and within the transport region.

In one or more embodiments of the process station, a magnetic shield member is disposed between one or more linear stators and one or more top sensors.

In one or more embodiments of the process station, the process station further comprises a position sensor disposed in an interior opening of the first membrane, the interior opening being disposed between the first surface and the second surface of the first membrane.

In one or more embodiments of the process station, the process station further comprises a side actuator assembly disposed in an opening in the housing and further disposed beneath the first membrane. The side actuator assembly includes a side actuator assembly housing, a side actuator, and at least one side position sensor. The side actuator assembly housing including an end wall with an outer surface that faces the transport region. The side actuator is disposed in the side actuator assembly housing, the side actuator configured to generate a second magnetic field that extends through the side actuator assembly housing and into the transport region. The at least one side position sensor is disposed in the side actuator assembly, the at least one side position sensor configured to generate a third magnetic field that extends through the side actuator assembly housing and into the transport region.

In one or more embodiments of the process station, the process station further comprises a substrate support at least partially disposed in the transport region, the substrate support moveable from a first position to a second position. The process station further comprises a source assembly disposed over the substrate support, the source assembly configured to process a substrate disposed on the substrate support when the substrate support is in the second position, and wherein the process may be at least one of chemical vapor deposition, plasma enhanced chemical vapor deposition, atomic layer deposition, plasma enhanced atomic layer deposition, etch, lithography, ion implantation, ashing, cleaning, thermal process, or a degas. The process station further comprises an equipment assembly disposed in the housing, wherein a carrier with the substrate disposed thereon is below the equipment assembly when in a park position.

In one or more embodiments of the process station, the equipment assembly includes at least one of a heat source configured to adjust the temperature of the substrate, a shower head configured to deliver a gas to the substrate, or one or more sensors.

In one or more embodiments of the process station, the housing further comprising a second wall that comprises a second opening. The process station further comprises a second membrane, a second cavity, and a second magnetic levitation actuator assembly. The second membrane covers the second opening, the second membrane including a first surface and a second surface, wherein the second surface of the second membrane at least partially defines the transport region. The second cavity formed in the housing and isolated the transport region by the second membrane, wherein the first cavity is at least partially defined by the first surface of the second membrane. The second magnetic levitation actuator assembly is disposed in the second cavity and over the first surface of the second membrane, wherein the magnetic levitation actuator is configured to generate a second magnetic field that extends through the second membrane and within the transport region, and wherein the second magnetic levitation actuator assembly is oriented parallel to the first magnetic levitation actuator assembly.

In one embodiment, a process station comprises a housing, a membrane, and a magnetic levitation actuator assembly. The housing comprising one or more walls that define a transport region. The membrane is attached to a wall of the one or more walls of the housing, the membrane including a first surface and a second surface, wherein the first surface of the membrane and a portion of the wall of the one or more walls of the housing define a cavity, and the second surface at least partially defines the transport region. The magnetic levitation actuator assembly disposed in the cavity and over the first surface of the membrane. The magnetic levitation actuator assembly comprises a plurality of stators and a plurality of sensors. Each stator of the plurality of stators is configured to generate a first magnetic field that extends through the membrane and into the transport region. Each sensor comprises a magnetic field detection sensor that is configured to detect a position of a magnetically permeable material disposed in the transport region relative to the sensor.

In one or more embodiments of the process station, the process station further comprising a shield element disposed between each stator stators and adjacent top sensors.

In one or more embodiments of the process station, the housing includes a single machined block that partially defines the cavity, and the membrane is attached to the single machined block.

In one embodiment, a process station comprises a housing, a membrane, and a magnetic levitation actuation assembly. The housing includes a transport region, an opening, a first interface surface, and a second interface surface, wherein the opening is between the first interface surface and the second interface surface. The membrane covering the opening to enclose a cavity formed in the housing from the transport region, the membrane including a first surface and a second surface, the first surface partially defines the cavity and includes a first recess, and the transport region is partially defined by a second surface of the membrane. The magnetic levitation actuation assembly including a first linear stator and a first top sensor at least partially disposed in the first recess.

In one or more embodiments of the process station, the first recess further comprises a top sensor portion, a stator interface surface, and a pole portion. A portion of the top sensor is disposed in the top sensor portion and a first clearance is present between the top sensor and a surface of the top sensor portion. The stator interface surface is configured to engage with the first linear stator. The pole portion is configured to receive a plurality of teeth of the first linear stator, the pole portion is surrounded by the stator interface surface, and wherein a second clearance is present between a surface of the pole portion and the teeth of the first linear stator.

In one or more embodiments of the process station, the first surface of the membrane further comprises a second recess. In one or more embodiments of the process station, the magnetic levitation actuator assembly includes a side actuator and a second top sensor, wherein the second top sensor and the side actuator are disposed in the second recess.

While the foregoing is directed to embodiments of the present disclosure, other and further embodiments of the disclosure may be devised without departing from the basic scope thereof, and the scope thereof is determined by the claims that follow.

What is claimed is:

1. A process station, comprising:
a housing comprising a first wall that comprises a first opening, wherein the first wall at least partially defines a transport region;
a first membrane covering the first opening, wherein the first membrane comprises a first surface and a second surface, wherein the second surface at least partially defines the transport region, and the first membrane is positioned over a portion of the transport region;
a first cavity formed in the housing and isolated from the transport region by the first membrane, wherein the first cavity is at least partially defined by a portion of the first wall and the first surface of the first membrane; and
a magnetic levitation actuator assembly disposed in the first cavity and over the first surface of the first membrane, wherein the magnetic levitation actuator is configured to generate a first magnetic field that extends through the first membrane and within the transport region.

2. The process station of claim 1, wherein:
the first membrane includes a recess including an interface surface and a pole portion;
the first magnetic levitation actuator assembly comprises a stator pole and a wire vertically wound around the stator pole, the wire is engaged with the interface surface and a first end of the stator pole is disposed in the pole portion, and a clearance is present between a surface of the pole portion and the first end.

3. The process station of claim 1, wherein the first membrane is formed from a ceramic material or a non-magnetic metal.

4. The process station of claim 1, wherein the first membrane includes a seal groove around a periphery of the first surface of the first membrane, wherein a seal disposed in the seal groove is engaged with the a housing interface surface of the housing around the opening.

5. The process station of claim 4, wherein a first portion of the housing interface surface is disposed at an angle relative to a second portion of the housing surface, the process station further comprising one or more wedge members are engaged with a tapered surface of the second surface of the first membrane to secure the engagement of the first membrane with the first housing interface surface.

6. The process station of claim 1, wherein the first magnetic levitation actuator assembly includes a plurality of linear stators, wherein each linear stator includes at least one middle stator pole disposed between outer stator poles, wherein the at least one middle stator pole has a thickness that exceeds the thickness of each outer stator pole.

7. The process station of claim 1, wherein the first magnetic levitation actuator assembly includes a first linear array of linear stators and second linear array of top sensors coupled to a member, wherein the first linear array of stators is parallel to the second linear array of top sensors, wherein each top sensor is configured to generate a second magnetic field that extends through the first membrane and within the transport.

8. The process station of claim 7, wherein the first membrane includes a first row of first recesses and a second row of second recesses, wherein each stator is partially disposed in a corresponding first recess and each top sensor is partially disposed in a corresponding second recess.

9. The process station of claim 7, wherein the first magnetic levitation actuator assembly further comprises:
a side actuator configured to generate a third magnetic field that extends through the first membrane and within the transport region; and
at least one side sensor configured to generate a fourth magnetic field that extends through the first membrane and within the transport region.

10. The process station of claim 7, wherein a magnetic shield member is disposed between one or more linear stators and one or more top sensors.

11. The process station of claim 1, further comprising:
a side actuator assembly disposed in an opening in the housing and further disposed beneath the first membrane, the side actuator assembly including:
a side actuator assembly housing including an end wall with an outer surface that faces the transport region;
a side actuator disposed in the side actuator assembly housing, the side actuator configured to generate a second magnetic field that extends through the side actuator assembly housing and into the transport region; and at least one side position sensor disposed in the side actuator assembly, the at least one side position sensor configured to generate a third magnetic field that extends through the side actuator assembly housing and into the transport region.

12. The process station of claim 1, wherein the magnetic levitation actuator assembly further comprises a first top sensor at least partially disposed in the first cavity.

13. A process station comprising:

a housing comprising a first wall that comprises a first opening, wherein the first wall at least partially defines a transport region;

a first membrane covering the first opening, wherein the first membrane comprises a first surface and a second surface, wherein the second surface at least partially defines the transport region;

a first cavity formed in the housing and isolated from the transport region by the first membrane, wherein the first cavity is at least partially defined by a portion of the first wall and the first surface of the first membrane;

a magnetic levitation actuator assembly disposed in the first cavity and over the first surface of the first membrane, wherein the magnetic levitation actuator is configured to generate a first magnetic field that extends through the first membrane and within the transport region;

a substrate support at least partially disposed in the transport region, the substrate support moveable from a first position to a second position;

a source assembly disposed over the substrate support, the source assembly configured to process a substrate disposed on the substrate support when the substrate support is in the second position, and wherein the process may be at least one of chemical vapor deposition, plasma enhanced chemical vapor deposition, atomic layer deposition, plasma enhanced atomic layer deposition, etch, lithography, ion implantation, ashing, cleaning, thermal process, or a degas; and an equipment assembly disposed in the housing, wherein a carrier with the substrate disposed thereon is below the equipment assembly when in a park position.

14. The process station of claim 13, wherein the equipment assembly includes at least one of a heat source configured to adjust the temperature of the substrate, a shower head configured to deliver a gas to the substrate, or one or more sensors.

15. A process station comprising:

a housing comprising a first wall that comprises a first opening, wherein the first wall at least partially defines a transport region, the housing further comprising a second wall that comprises a second opening;

a first membrane covering the first opening, wherein the first membrane comprises a first surface and a second surface, wherein the second surface at least partially defines the transport region;

a second membrane covering the second opening, the second membrane including a first surface and a second surface, wherein the second surface of the second membrane at least partially defines the transport region;

a first cavity formed in the housing and isolated from the transport region by the first membrane, wherein the first cavity is at least partially defined by a portion of the first wall and the first surface of the first membrane;

a second cavity formed in the housing and isolated the transport region by the second membrane, wherein the first cavity is at least partially defined by the first surface of the second membrane;

a magnetic levitation actuator assembly disposed in the first cavity and over the first surface of the first membrane, wherein the magnetic levitation actuator is configured to generate a first magnetic field that extends through the first membrane and within the transport region; and a second magnetic levitation actuator assembly disposed in the second cavity and over the first surface of the second membrane, wherein the magnetic levitation actuator is configured to generate a second magnetic field that extends through the second membrane and within the transport region, and wherein the second magnetic levitation actuator assembly is oriented parallel to the first magnetic levitation actuator assembly.

16. A process station, comprising:

a housing comprising one or more walls that define a transport region;

a membrane attached to a wall of the one or more walls of the housing, the membrane including a first surface and a second surface, wherein the first surface of the membrane and a portion of the wall of the one or more walls of the housing define a cavity, and the second surface at least partially defines the transport region; and a magnetic levitation actuator assembly disposed in the cavity and over the first surface of the membrane, and the magnetic levitation actuator assembly comprises:

a plurality of stators, wherein each stator of the plurality of stators is configured to generate a first magnetic field that extends through the membrane and into the transport region; and a plurality of sensors, wherein each sensor comprises a magnetic field detection sensor that is configured to detect a position of a magnetically permeable material disposed in the transport region relative to the sensor.

17. The process station of claim 16, further comprising a shield element disposed between each stator stators and adjacent top sensors.

18. The process station of claim 16, wherein the housing includes a single machined block that partially defines the cavity, and the membrane is attached to the single machined block.

19. A process station, further comprising:

a housing including a transport region, an opening, a first interface surface, and a second interface surface, wherein the opening is between the first interface surface and the second interface surface;

a membrane covering the opening to enclose a cavity formed in the housing from the transport region, the membrane including a first surface and a second surface, the first surface partially defines the cavity and includes a first recess, and the transport region is partially defined by a second surface of the membrane; and a magnetic levitation actuation assembly including a first linear stator and a first top sensor at least partially disposed in the first recess.

20. The process station of claim 19, the first recess further comprises:

a top sensor portion, wherein a portion of the top sensor is disposed in the top sensor portion and a first clearance is present between the top sensor and a surface of the top sensor portion;

a stator interface surface configured to engage with the first linear stator; and a pole portion configured to receive a plurality of teeth of the first linear stator, the pole portion is surrounded by the stator interface surface, and wherein a second clearance is present between a surface of the pole portion and the teeth of the first linear stator.

21. The process station of claim 19, further comprising:

the first surface of the membrane further comprises a second recess; and the magnetic levitation actuator assembly includes a side actuator and a second top sensor, wherein the second top sensor and the side actuator are disposed in the second recess.

* * * * *